US008598032B2

(12) United States Patent
Chen et al.

(10) Patent No.: US 8,598,032 B2
(45) Date of Patent: Dec. 3, 2013

(54) REDUCED NUMBER OF MASKS FOR IC DEVICE WITH STACKED CONTACT LEVELS

(75) Inventors: Shih-Hung Chen, Jhudong Township, Hsinchu County (TW); Hang-Ting Lue, Hsinchu (TW)

(73) Assignee: Macronix International Co., Ltd, Hsinchu (TW)

( * ) Notice: Subject to any disclaimer, the term of this patent is extended or adjusted under 35 U.S.C. 154(b) by 257 days.

(21) Appl. No.: 13/049,303

(22) Filed: Mar. 16, 2011

(65) Prior Publication Data

US 2012/0184097 A1    Jul. 19, 2012

Related U.S. Application Data

(60) Provisional application No. 61/434,086, filed on Jan. 19, 2011.

(51) Int. Cl.
*H01L 23/538* (2006.01)
*H01L 21/308* (2006.01)

(52) U.S. Cl.
USPC .................................. 438/618; 257/E23.169

(58) Field of Classification Search
USPC .................................. 438/618; 257/E23.169
See application file for complete search history.

(56) References Cited

U.S. PATENT DOCUMENTS

| 6,034,882 | A | 3/2000 | Johnson et al. |
| 6,906,940 | B1 | 6/2005 | Lue |
| 7,081,377 | B2 | 7/2006 | Cleeves |
| 7,129,538 | B2 * | 10/2006 | Lee et al. ....................... 257/321 |
| 7,177,169 | B2 | 2/2007 | Scheuerlein |
| 7,301,818 | B2 | 11/2007 | Lu et al. |
| 7,382,647 | B1 | 6/2008 | Gopalakrishnan |
| 2005/0280061 | A1 | 12/2005 | Lee |
| 2008/0101109 | A1 | 5/2008 | Haring-Bolivar et al. |
| 2009/0097321 | A1 | 4/2009 | Kim et al. |
| 2009/0184360 | A1 | 7/2009 | Jin et al. |
| 2010/0270593 | A1 | 10/2010 | Lung et al. |
| 2011/0084397 | A1 | 4/2011 | Lung |

FOREIGN PATENT DOCUMENTS

| EP | 1936681 A1 | 6/2008 |
| EP | 2048709 A2 | 4/2009 |

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

(Continued)

*Primary Examiner* — Matthew W Such
*Assistant Examiner* — Monica D Harrison
(74) *Attorney, Agent, or Firm* — James F. Hann; Haynes Beffel & Wolfeld LLP

(57) ABSTRACT

A three-dimensional stacked IC device has a stack of contact levels at an interconnect region. According to some examples of the present invention, it only requires a set of N etch masks to create up to and including $2^N$ levels of interconnect contact regions at the stack of contact levels. According to some examples, $2^{x-1}$ contact levels are etched for each mask sequence number x, x being a sequence number for the masks so that for one mask x=1, for another mask x=2, and so forth through x=N. Methods create the interconnect contact regions aligned with landing areas at the contact levels.

17 Claims, 58 Drawing Sheets

(56) References Cited

OTHER PUBLICATIONS

Hsu et al., "Study of Sub-30nm Thin Film Transistor (TFT) Charge-Trapping (CT) Devices for 3D NAND Flash Application", IEDM 2009 IEEE International, Dec. 7-9, 2009, p. 1-4.

Hubert et al., "A Stacked SONOS technology, up to 4 levels and 6nm crystalline nanowires, with gate-all-around or independent gates (F Flash), suitable for full 3D integration", IEEE IEDM, Dec. 7-9, 2009, 2 pages.

Jang et al., "Vertical Cell Array using TCAT(Terabit Cell Array Transistor) Technology for Ultra High Density NAND Flash Memory", 2009 Symposium on VLSI Technology Digest of Technical Papers, p. 192-193.

Johnson et al., "512-Mb PROM With a Three-Dimensional Array of Diode/Anti-fuse Memory Cells" IEEE J. of Solid-State Circuits, vol. 38, No. 11, Nov. 2003.

Jung et al., "Three Dimensionally Stacked NAND Flash Memory Technology Using Stacking Single Crystal Si Layers on ILD and TANOS Structure for Beyond 30nm Node", IEEE Int'l Electron Devices Meeting, Dec. 11-13, 2006.

Katsumata et al., "Pipe-shaped BiCS Flash Memory with 16 Stacked Layers and Multi-Level-Cell Operation for Ultra High Density Storage Devices", 2009 Sypmposium on VLSI technology Digest of Technical Papers, p. 136-137.

Kim et al., "Multi-Layered Vertical Gate NAND Flash Overcoming Stacking Limit for Terabit Density Storage", 2009 Symposium on VLSI Technology Digest of Technical Papers, p. 188-189.

Kim, Jiyoung et al., "Novel 3-D Structure for Ultra High Density Flash Memory with VRAT (Vertical-Recess-Array-Transistor) and PIPE (Planarized Integration on the same PlanE)," Jun. 17-19, 2008, 2 pages.

Lai, et al., "A Multi-Layer Stackable Thin-Film Transistor (TFT) NAND-Type Flash Memory", IEEE Int'l Electron Devices Meeting, Dec. 11-13, 2006.

Lai et al., "Highly Reliable MA BE-SONOS (Metal Al2O3 Bandgap Engineered SONOS) Using a SiO2 Buffer Layer", VLSI Technology, Systems and Applications, International Symposium on Apr. 21-23, 2008, p. 58-59.

Lue et al., "A Novel Buried-Channel FinFET BE-SONOS NAND Flash with Improved Memory Window and Cycling Endurance", 2009 Symposium on VLSI Technology Digest of Technical Papers, p. 224-225.

Paul et al., "Impact of a Process Variation on Nanowire and Nanotube Device Performance", IEEE Transactions on Electron Devices, vol. 54, No. 9, Sep. 2007, p. 2369-2376.

Tanaka, H., et al., "Bit Cost Scalable Technology with Punch and Plug Process for Ultra High Density Flash Memory," 2007 IEEE Symposium on VLSI Technology, Jun. 12-14, 2007, pp. 14-15.

\* cited by examiner

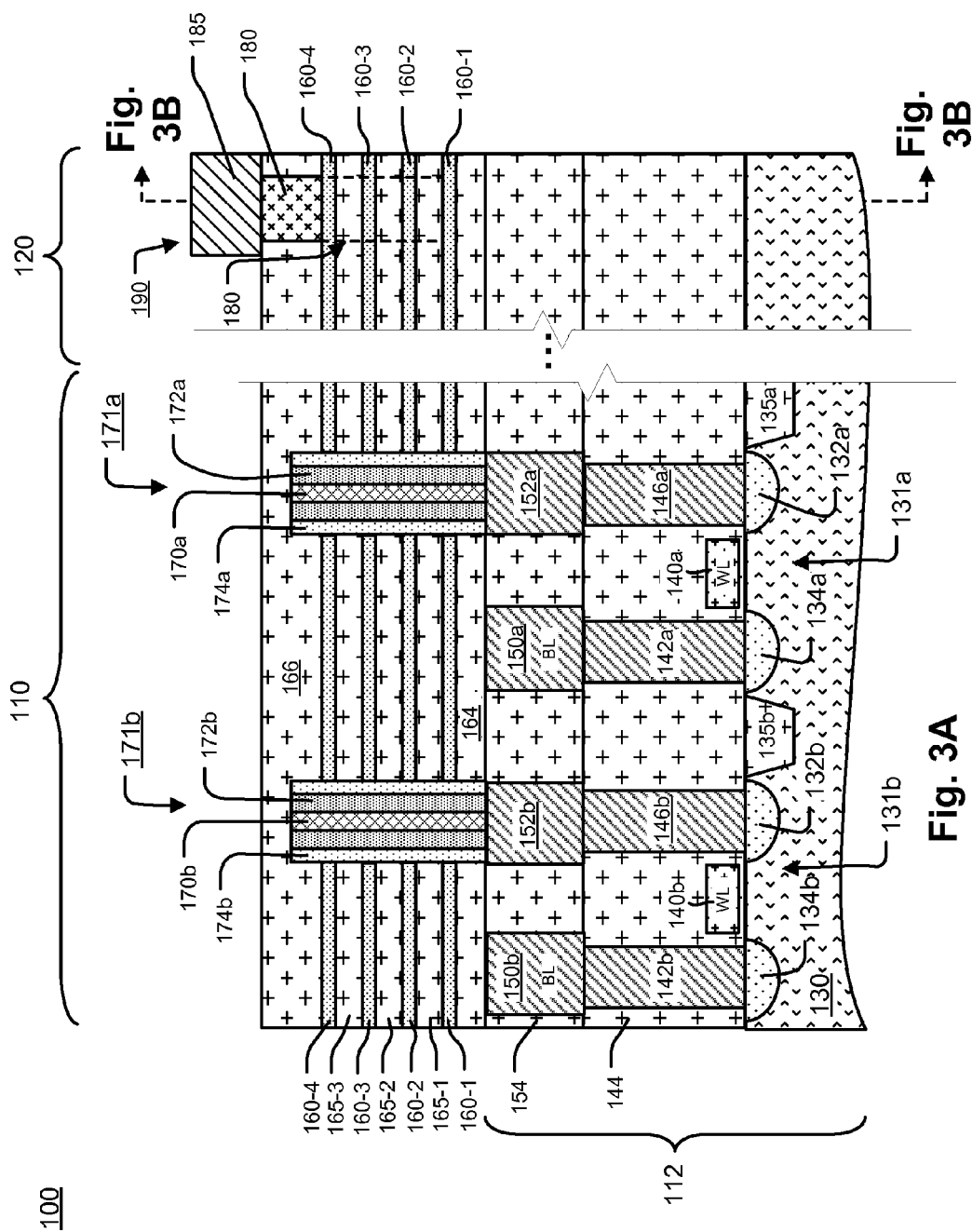

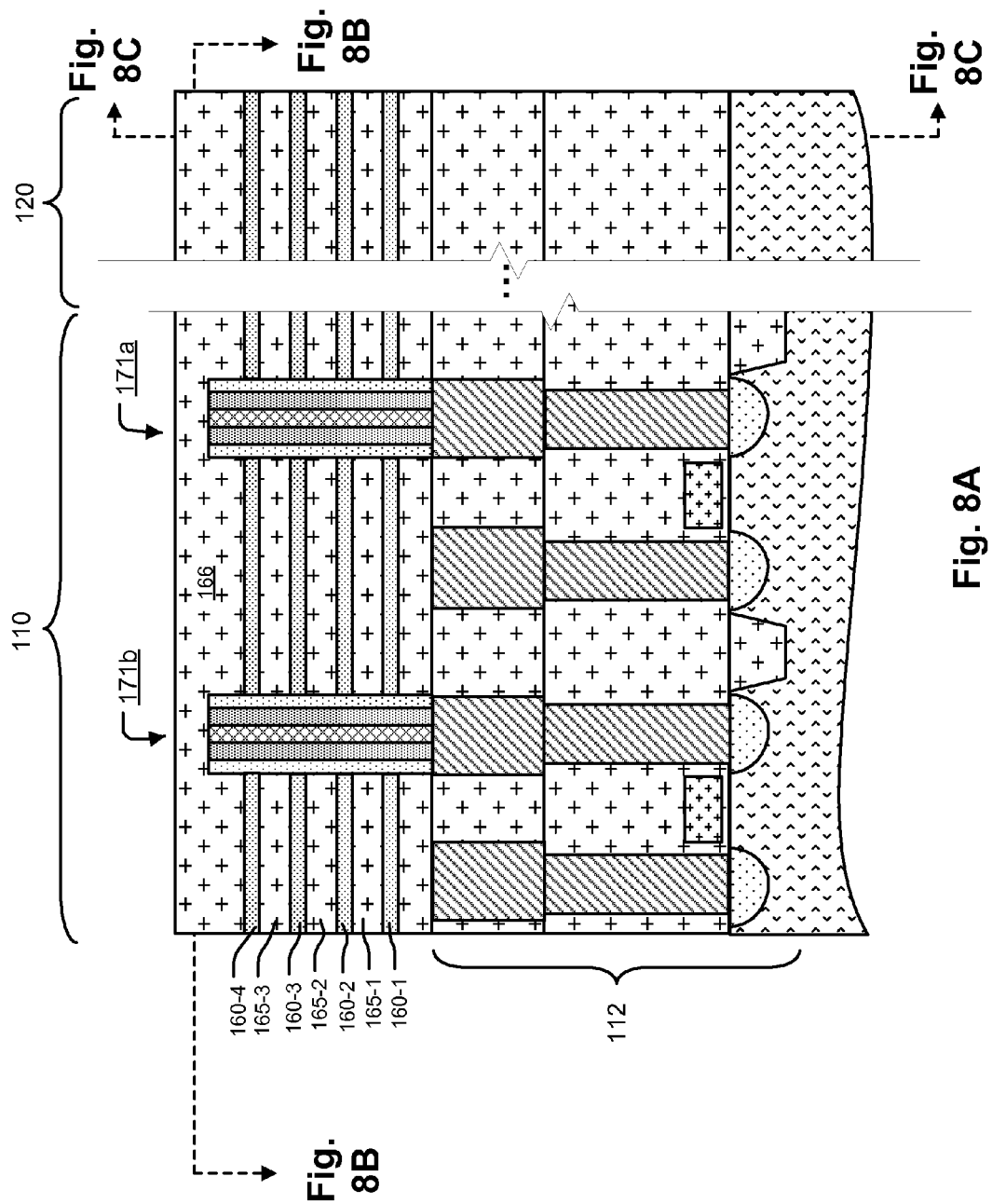

REDUCED NUMBER OF MASKS FOR IC DEVICE WITH STACKED CONTACT LEVELS

REFERENCE TO RELATED APPLICATIONS

This application claims the benefit of U.S. provisional patent application No. 61/434,086 filed 19 Jan. 2011.

This application is related to the following: U.S. provisional patent application No. 61/434,423 filed 19 Jan. 2011; U.S. patent application Ser. No. 12/579,192 filed 14 Oct. 2009, now U.S. Pat. No. 8,154,128.

BACKGROUND OF THE INVENTION

1. Field of the Invention

The present invention relates generally to high density integrated circuit devices, and more particularly to interconnect structures for multi-level three-dimensional stacked devices.

2. Description of Related Art

In the manufacturing of high density memory devices, the amount of data per unit area on an integrated circuit can be a critical factor. Thus, as the critical dimensions of the memory devices approach lithographic technology limits, techniques for stacking multiple levels of memory cells have been proposed in order to achieve greater storage density and lower costs per bit.

For example, thin film transistor techniques are applied to charge trapping memory in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells," IEEE J. of Solid-State Circuits, Vol. 38, No. 11, Nov. 2003. See, also U.S. Pat. No. 7,081,377 to Cleeves entitled "Three-Dimensional Memory."

Another structure that provides vertical NAND cells in a charge trapping memory technology is described in "Novel 3-D Structure for Ultra-High Density Flash Memory with VRAT and PIPE," by Kim et al., 2008 Symposium on VLSI Technology Digest of Technical Papers;" 17-19 Jun. 2008; pages 122-123.

In three-dimensional stacked memory devices, conductive interconnects used to couple the lower levels of memory cells to decoding circuitry and the like pass through the upper levels. The cost to implement the interconnections increases with the number of lithographic steps needed. One approach to reduce the number of lithographic steps is described in Tanaka et al., "Bit Cost Scalable Technology with Punch and Plug Process for Ultra High Density Flash Memory," 2007 Symposium on VLSI Technology Digest of Technical Papers; 12-14 Jun. 2007; pages 14-15.

However, one of the drawbacks with conventional 3-D stacked memory devices is that a separate mask is typically used for each contact level. Therefore, if there are, for example, 20 contact levels, 20 different masks are commonly required, each contact level requiring the creation of a mask for that level and an etching step for that level.

SUMMARY OF THE INVENTION

According to some examples of the present invention, it only requires N masks to provide access to a landing area at $2^N$ contact levels. According to some examples, $2^{x-1}$ contact levels are etched for each mask sequence number x.

A first example of a method, for use with a three-dimensional stacked IC device having a stack of contact levels at an interconnect region, is used to create interconnect contact regions aligned with and exposing landing areas at the contact levels. A set of N etch masks is used to create up to and including $2^N$ levels of interconnect contact regions at the stack of contact levels. Each mask comprises mask and etch regions. N is an integer equal to at least 2. x is a sequence number for the masks so that for one mask x=1, for another mask x=2, and so forth through x=N. At least a portion of any upper layer overlying the stack of contact levels at the interconnect region is removed. The interconnect region is etched N times using said masks in a chosen order. Doing so creates contact openings extending from a surface layer to each contact level. The contact openings are aligned with and provide access to landing areas at each of the $2^N$ contact levels. $2^{x-1}$ contact levels are etched during the etching step for each mask of sequence number x. Electrical conductors can then be formed through the contact openings to contact the landing areas at the contact levels. Some examples include the following steps: a fill material is applied over the openings to define a via pattern surface; vias are opened through the fill material to expose the landing areas in each contact level; and a conductive material is deposited within the vias. In some examples, the accessing step is carried out with N equal to at least 4. In some examples, the removing step is carried out using an additional mask exposing the interconnect region while in other examples, the removing step is carried out using a blanket etching step at the interconnect region. In some examples, sidewall material acts as one of the N etch masks.

Another example of a method provides electrical connections to landing areas at a stack of contact levels of an interconnect region for a three-dimensional stacked IC device. The IC device is of a type comprising an interconnect region, the interconnect region including an upper layer with a stack of at least first, second, third and fourth contact levels beneath the upper layer. At least first and second openings are formed in the upper layer, each opening exposing a surface portion of a first contact level, the first and second openings partially bounded by upper layer sidewalls. A sidewall material is deposited on the sidewalls of each of the first and second openings and on a first part of each of the surface portions while leaving a second part of the surface portions without sidewall material thereon. The first and second openings are extended through the second parts of the surface portions to expose a surface of the second contact level for each of the first and second openings. At least some of the sidewall material at each opening is removed to expose at least some of the first part of the surface portion at each opening, thereby forming interconnect contact regions at the second openings. The interconnect contact regions at the second opening are aligned with landing areas at the first and second contact levels. The first opening is further extended from (1) the exposed first part of the surface portion, through the first and second contact levels to expose a surface of a third contact level, and (2) an exposed surface of the second contact level through the second and third contact levels to expose a surface of the fourth contact level. Doing so forms interconnect contact regions at the first opening aligned with landing areas at the third and fourth contact levels. Electrical conductors are formed to the landing areas at the first, second, third and fourth contact levels. In some examples, the electrical conductors forming step comprises: applying a fill material over the openings to define a via pattern surface; opening vias through the fill material to expose the landing areas in each contact level; and depositing a conductive material within the vias.

An example of a set of masks is used to create interconnect contact regions aligned with landing areas at a stack of contact levels of an interconnect region for a three-dimensional stacked IC device, the stack of contact levels covered by an upper layer. Each mask of a set of N etch masks comprises mask and etch regions, the etch regions used to create interconnect contact regions alignable with landing areas at up to and including $2^{N-1}$ contact levels of an interconnect region for a three-dimensional stacked IC device. N is an integer equal to at least 3. x is the sequence number for the masks so that for one mask x=1, for another mask x=2, and so forth through x=N. In some examples, sidewall material acts as one of the N etch masks. In some examples, the etch masks comprise a dummy mask region on at least one of said etch masks. In some examples, the etch masks comprise dummy mask regions at corresponding locations on at least some of said etch masks. In some examples, the etch masks comprise at least one dummy mask region at corresponding locations on each of said etch masks. In some examples, N is greater than or equal to 4.

Another example of a set of masks is used to create interconnect contact regions aligned with landing areas at a stack of contact levels of an interconnect region for a three-dimensional stacked IC device. Each mask of a set of N masks comprises mask and etch regions, the etch regions used to create interconnect contact regions alignable with landing areas at up to and including $2^N$ contact levels of an interconnect region for a three-dimensional stacked IC device. N is an integer equal to at least 2. x is the sequence number for the masks so that for one mask x=1, for another mask x=2, and so forth through x=N.

Other aspects and advantages of the present invention can be seen on review of the drawings, the detailed description, and the claims which follow.

BRIEF DESCRIPTION OF THE DRAWINGS

FIGS. 1-16 and the associated description are taken from U.S. patent application Ser. No. 12/579,192 filed 14 Oct. 2009 and entitled 3D Integrated Circuit Layer Interconnect having the same assignee as this application, the disclosure of which is incorporated by reference.

FIG. 1 illustrates a cross-sectional view of a device including a three-dimensional structure having an interconnect structure 190 with a small footprint where conductors 180 extend to various levels 160-1 to 160-4 in the device.

FIGS. 3A and 3B illustrate respective orthogonal views of a portion of a three-dimensional stacked integrated circuit device including a 3D interconnect structure with a small footprint.

FIG. 4 illustrates a top view layout of an embodiment of the device which includes interconnect structures in the periphery on two sides of a memory array.

FIG. 5 illustrates a top view layout of an embodiment of the device which includes interconnect structures in the periphery on four sides of a memory array.

FIG. 6 is a schematic diagram of a portion of the memory device including an interconnect structure as described herein.

FIG. 7 is a simplified block diagram of an integrated circuit device including a 3D memory array having an interconnect structure as described herein.

FIGS. 8A-8C to 15 illustrate steps in a fabrication sequence for manufacturing an interconnect structure as described herein.

FIG. 16 illustrates a plan view of an opening in a mask having a width varying in the longitudinal direction in a step-like manner, to accommodate varying widths of landing areas on the levels.

The present invention is described primarily with reference to FIGS. 17-47.

Figure 17:
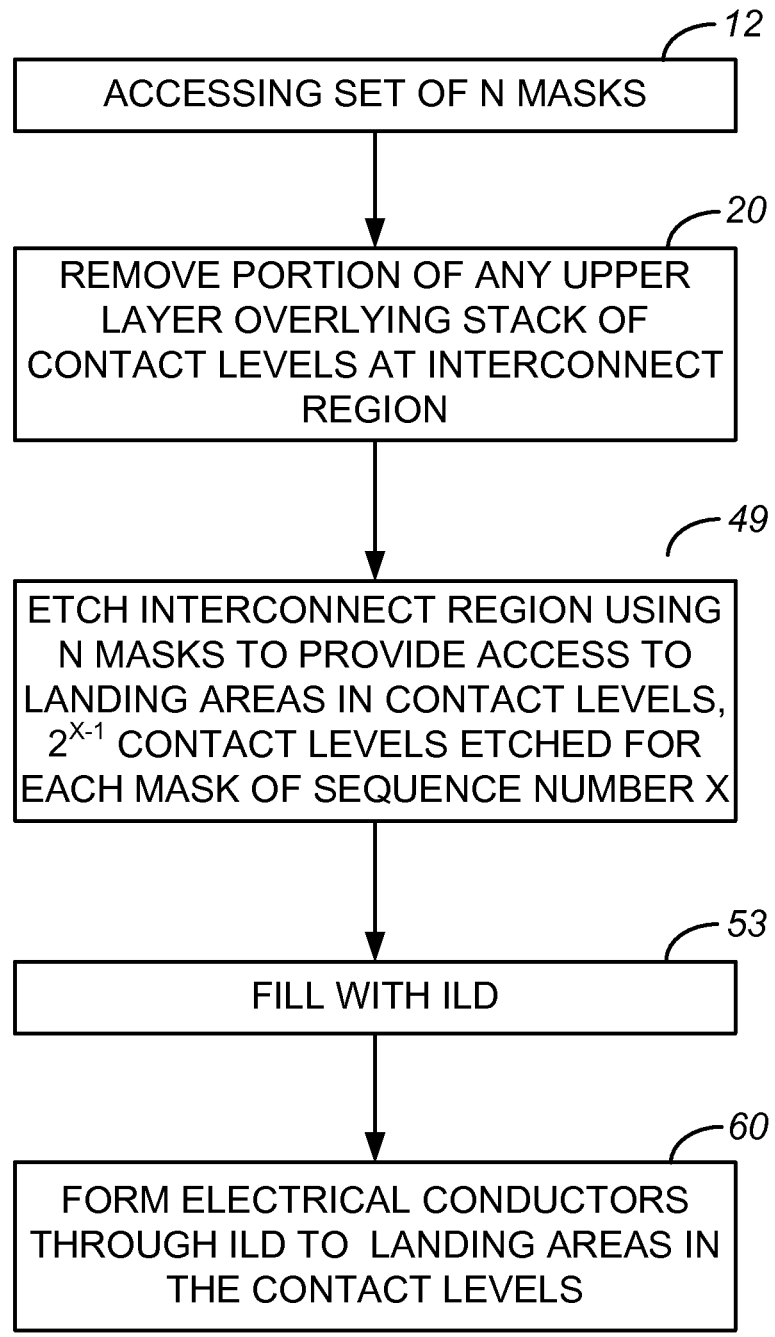

FIG. 17 is a simplified flowchart for a method for creating interconnect contact regions according to the present invention.

FIGS. 18-27 illustrate a first example of a method for creating interconnect contact regions at a number of contact levels at an interconnect region of a three-dimensional stacked IC device.

Figure 18:
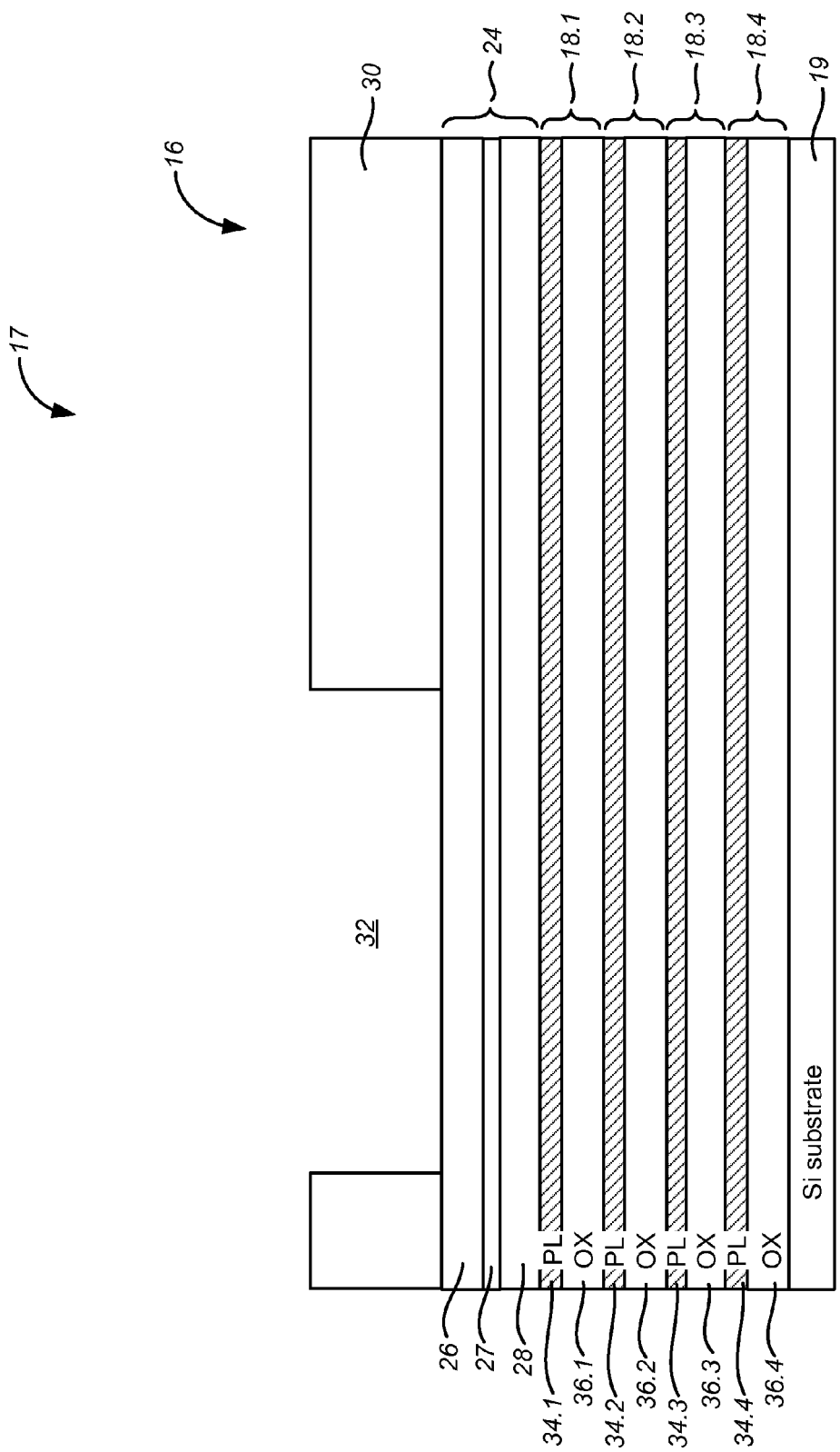

FIG. 18 is a simplified cross-sectional view of a stack of contact levels with an additional mask formed above an upper layer.

Figure 19:
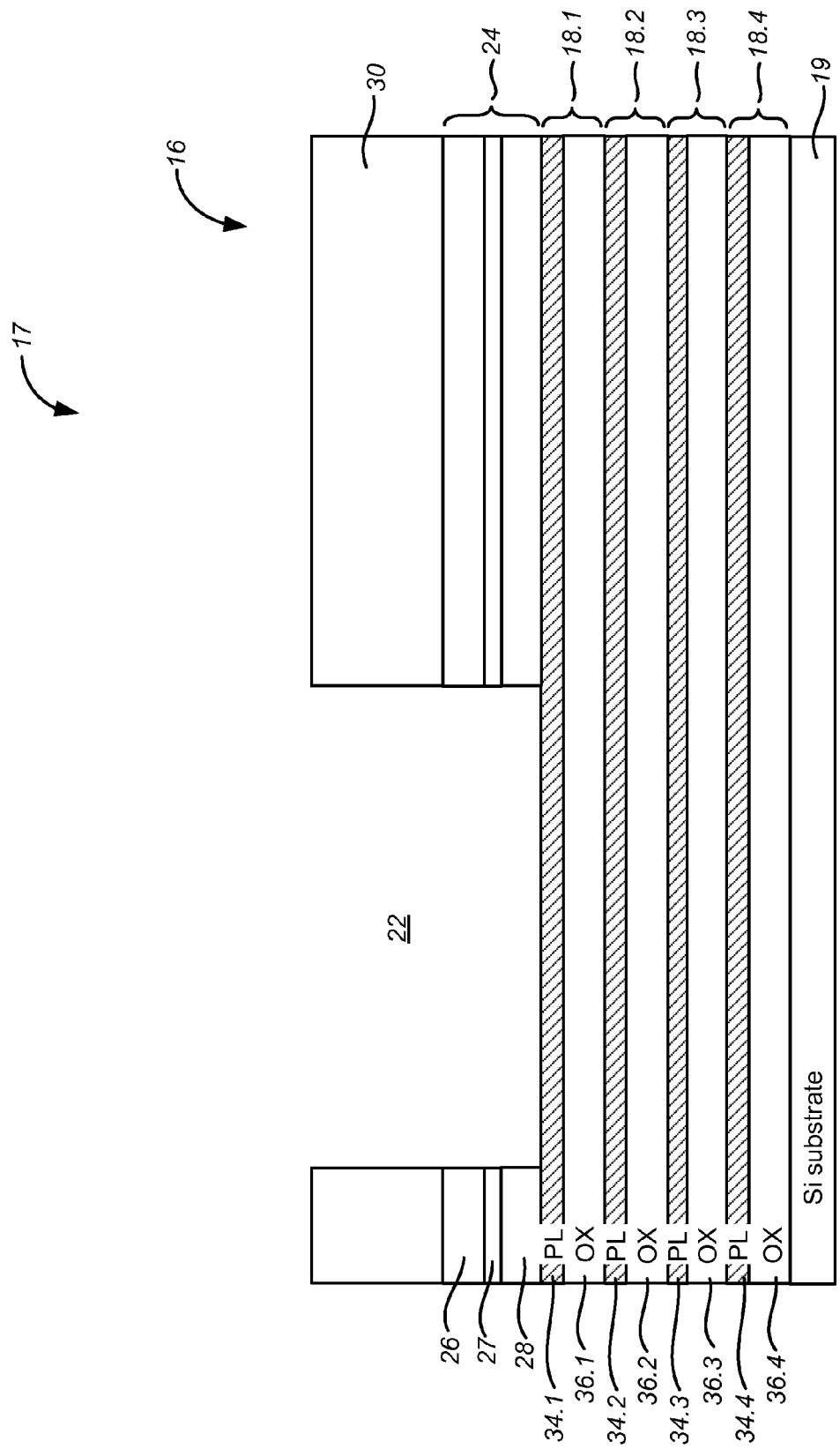

FIG. 19 shows the result of etching through an open region in the additional mask of FIG. 18 through the upper layer.

Figure 20:
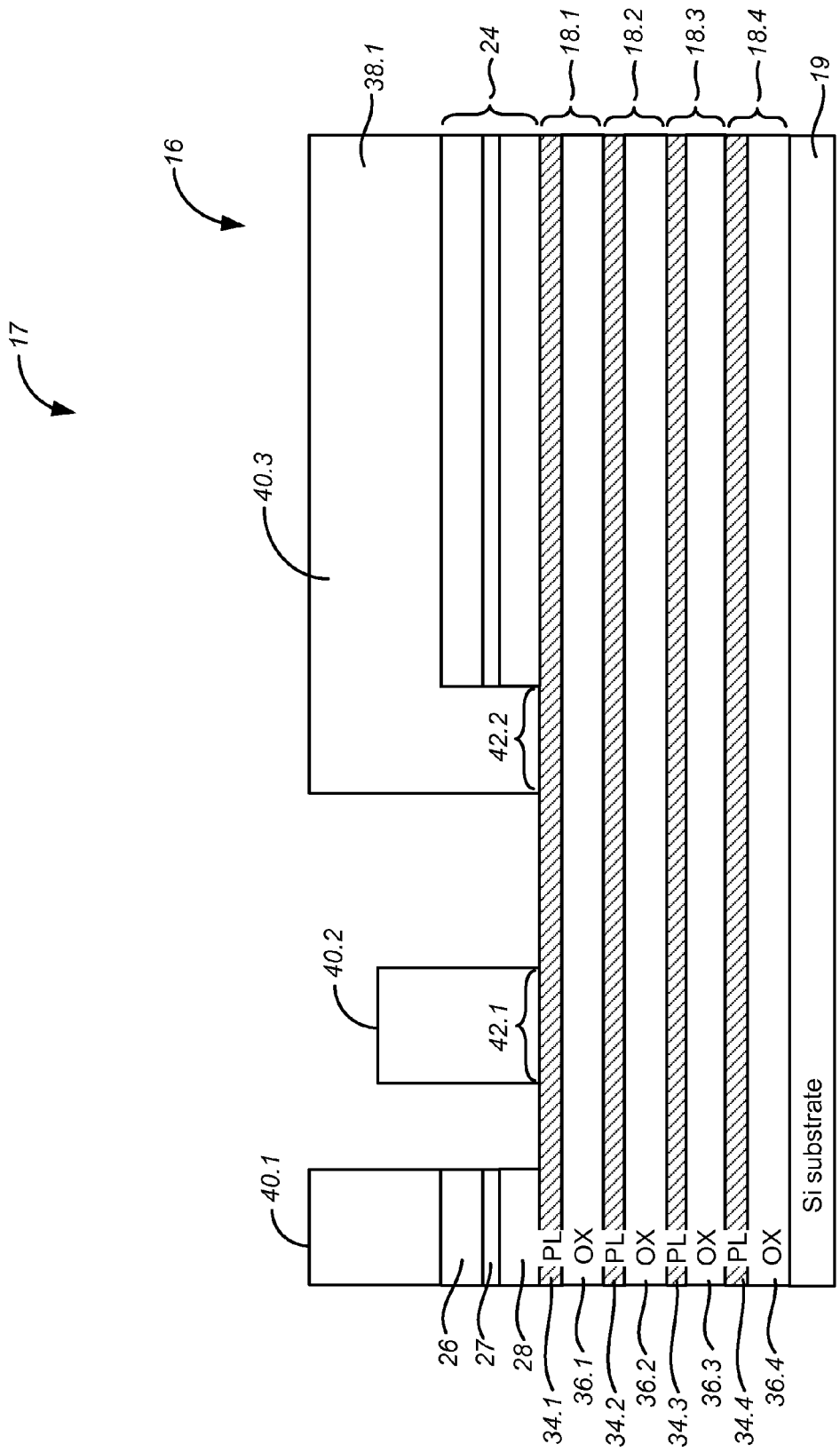

FIG. 20 shows a first mask applied to the stack of contact levels of FIG. 19.

Figure 21:
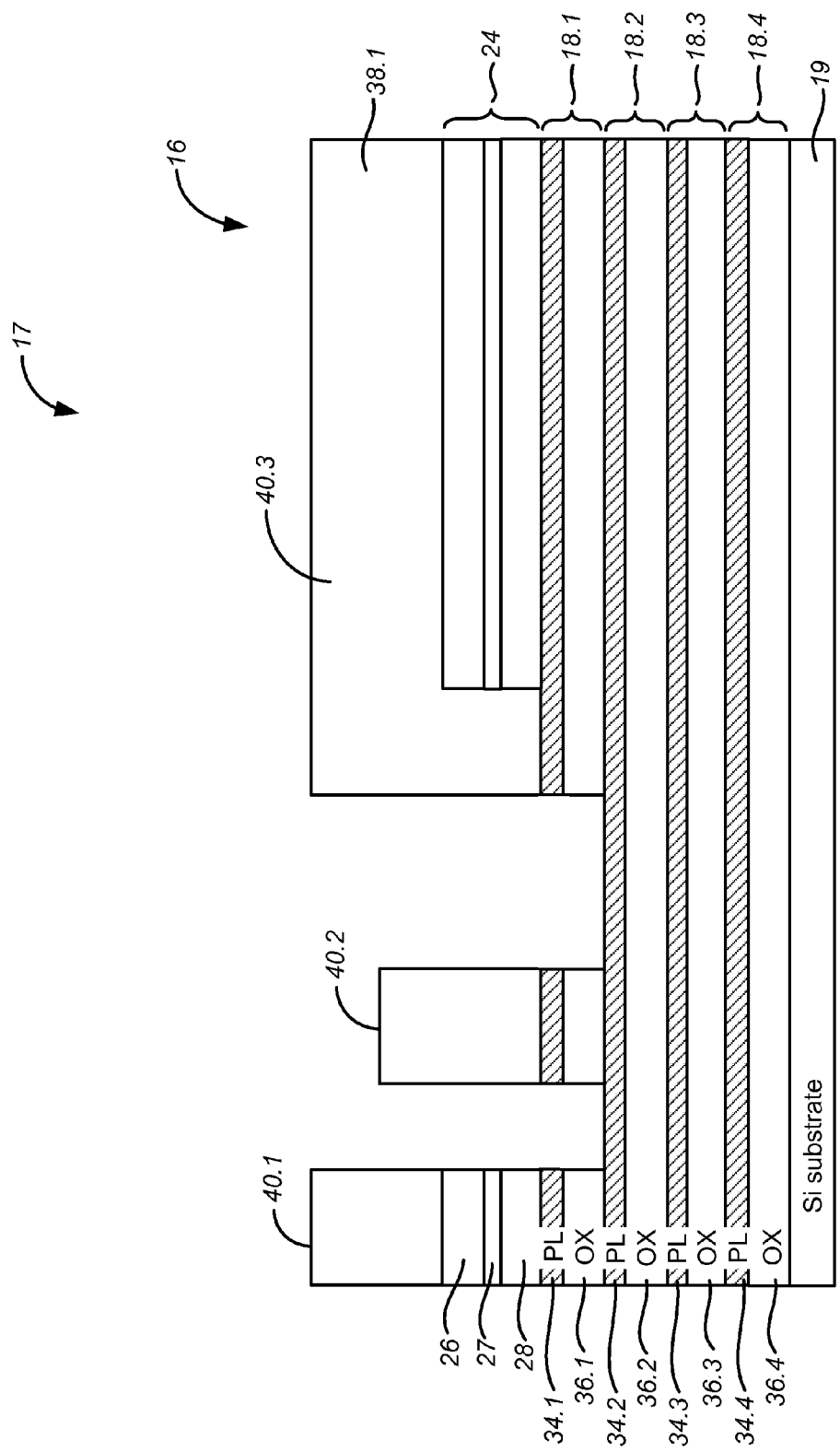

FIG. 21 shows the result of etching a single contact level using the first mask.

Figure 22:
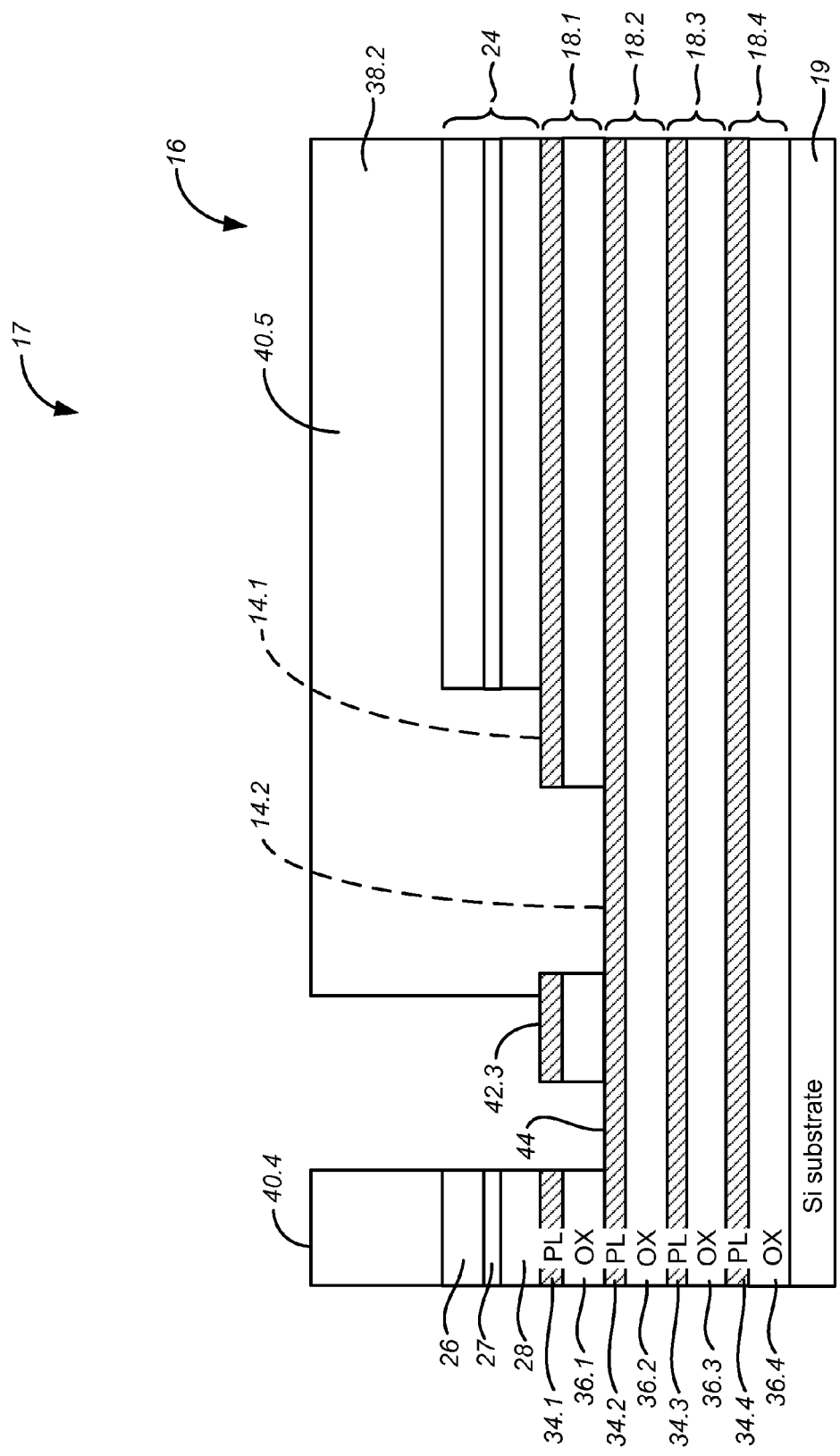

FIG. 22 shows a second mask applied to the stack of contact levels of FIG. 21.

Figure 23:
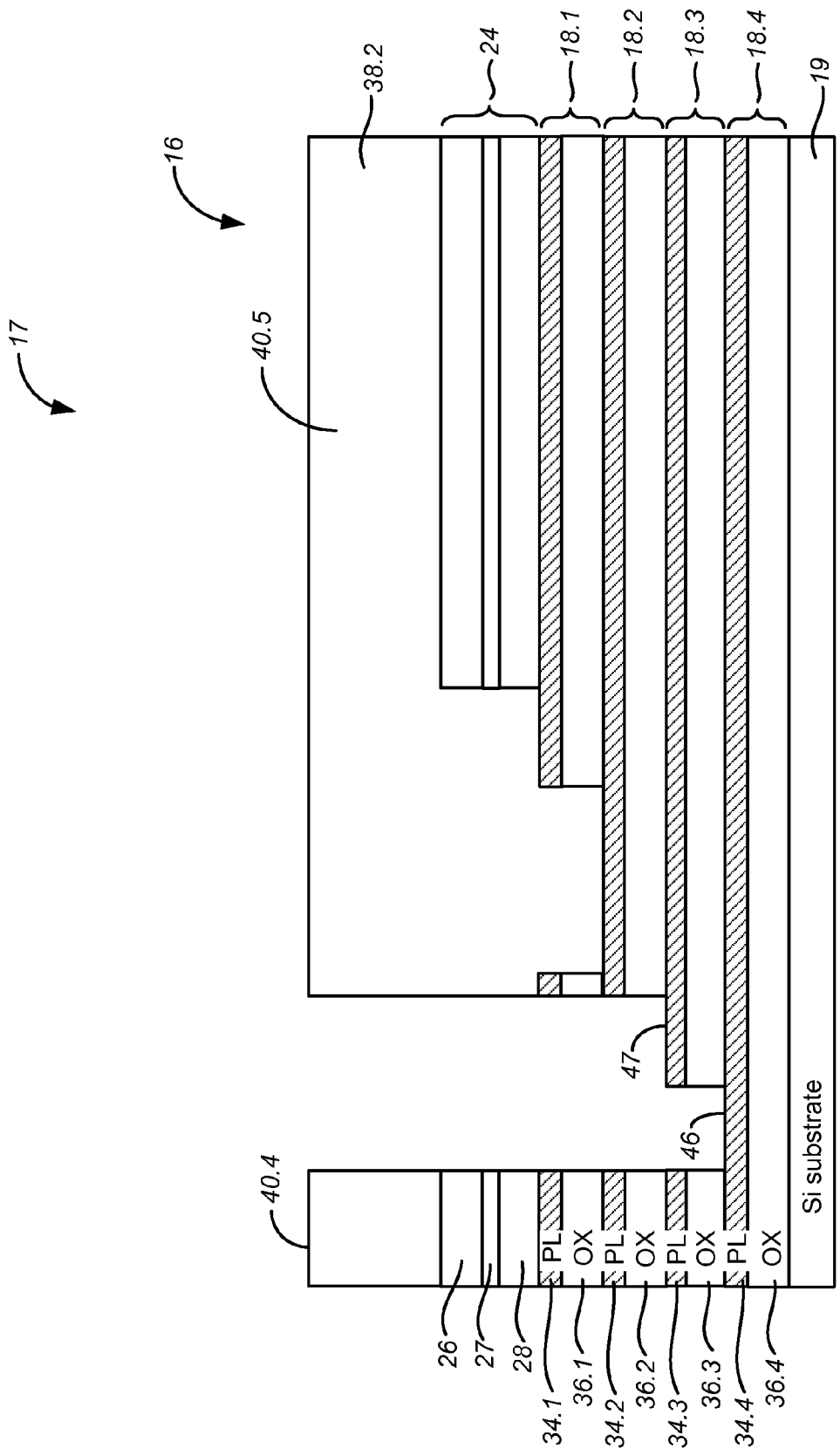

FIG. 23 shows the results of etching through two contact levels of FIG. 22.

Figure 24:
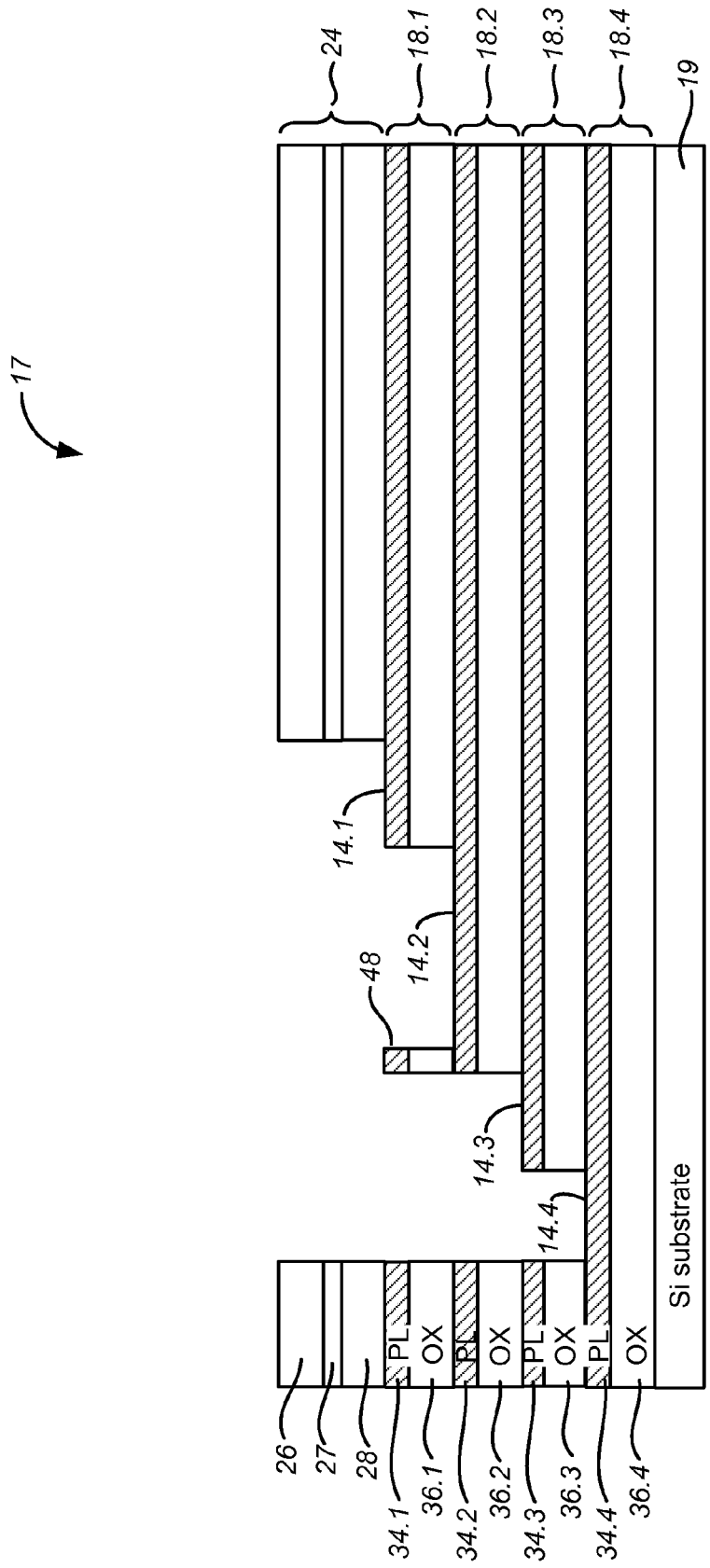

FIG. 24 shows the structure of FIG. 23 with the second mask removed thereby exposing interconnect contact regions at four different contact levels.

Figure 25:
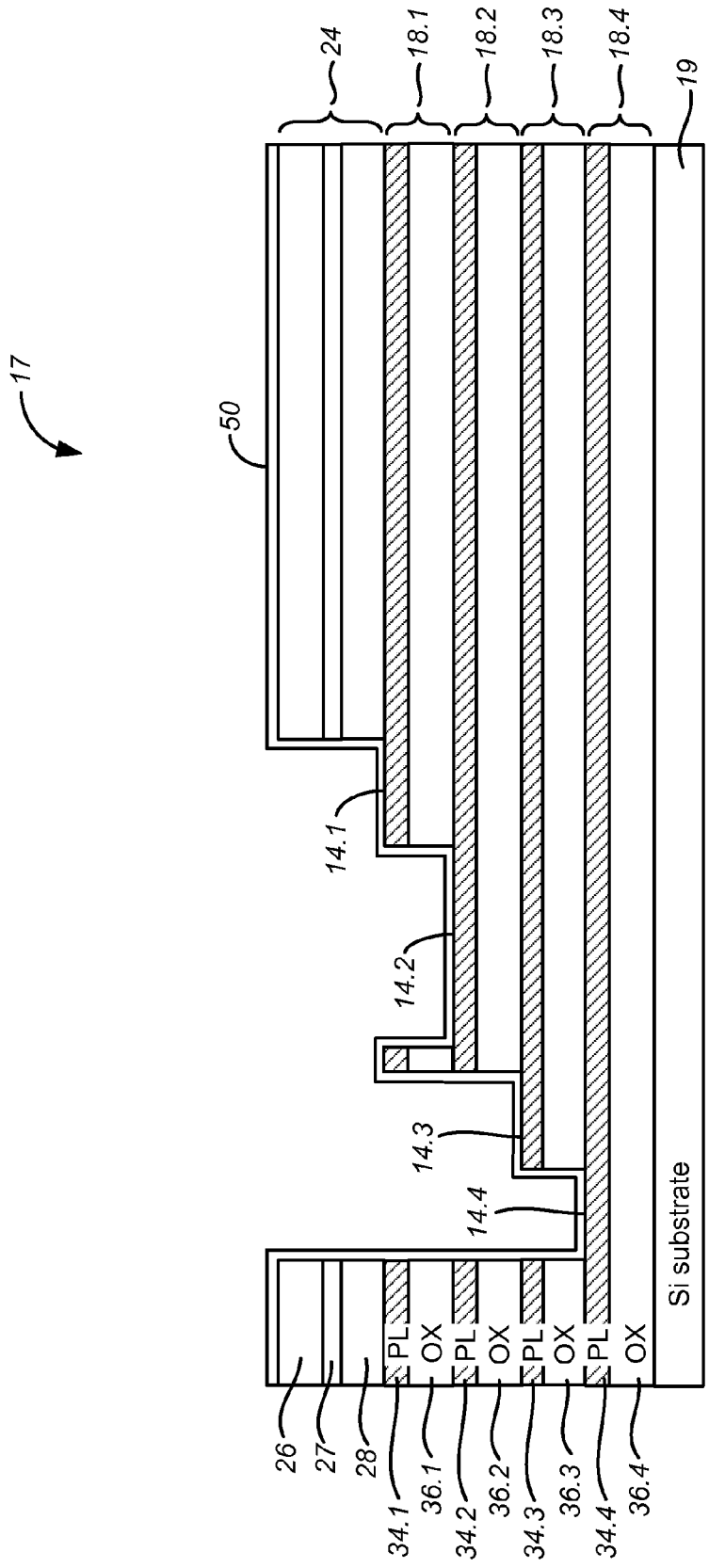

FIG. 25 shows the structure of FIG. 24 with an etch stop layer applied over the exposed surfaces of the structure of FIG. 24.

Figure 26:
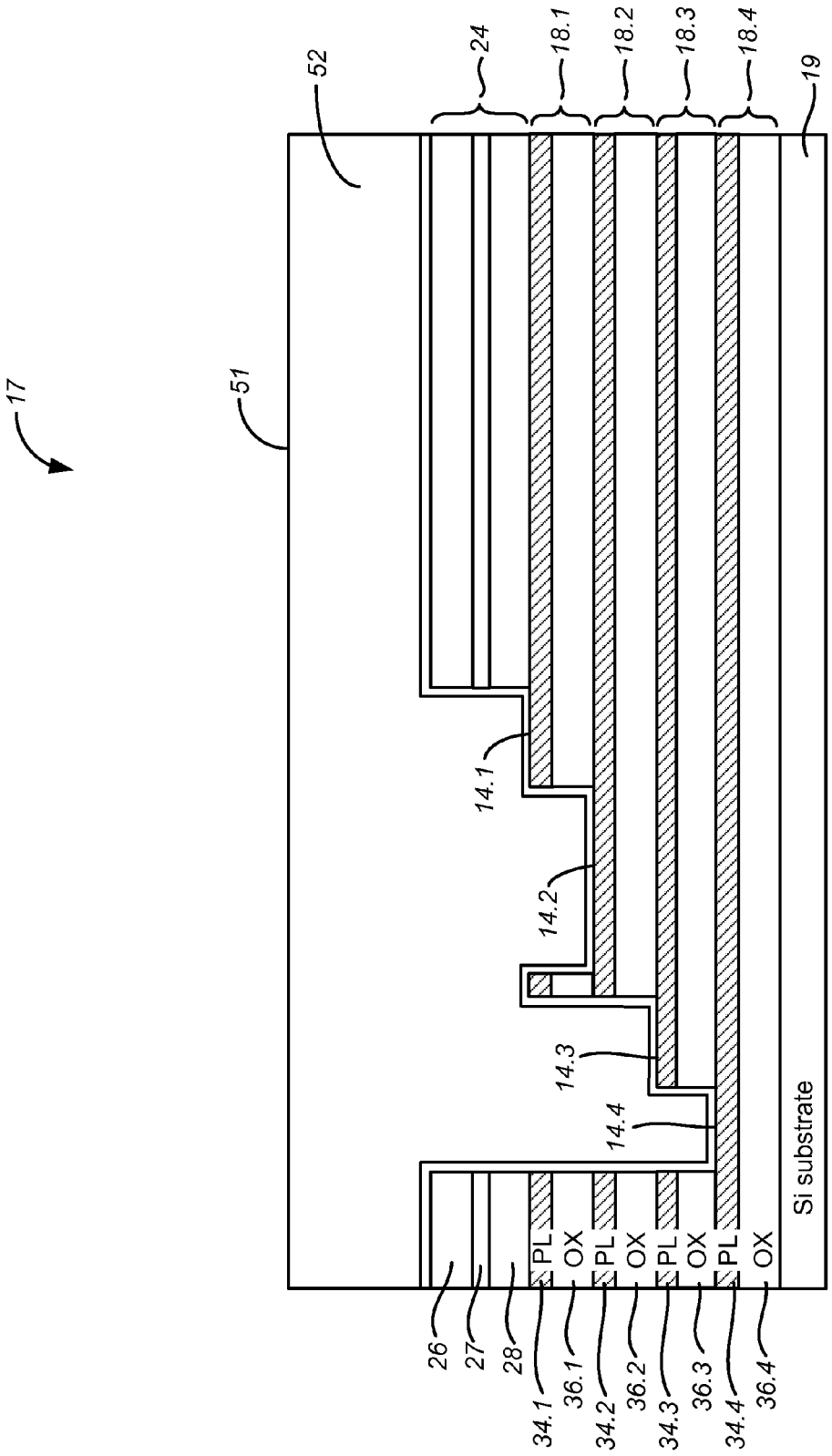

FIG. 26 shows the structure of FIG. 25 covered by interlayer dielectric.

Figure 27:
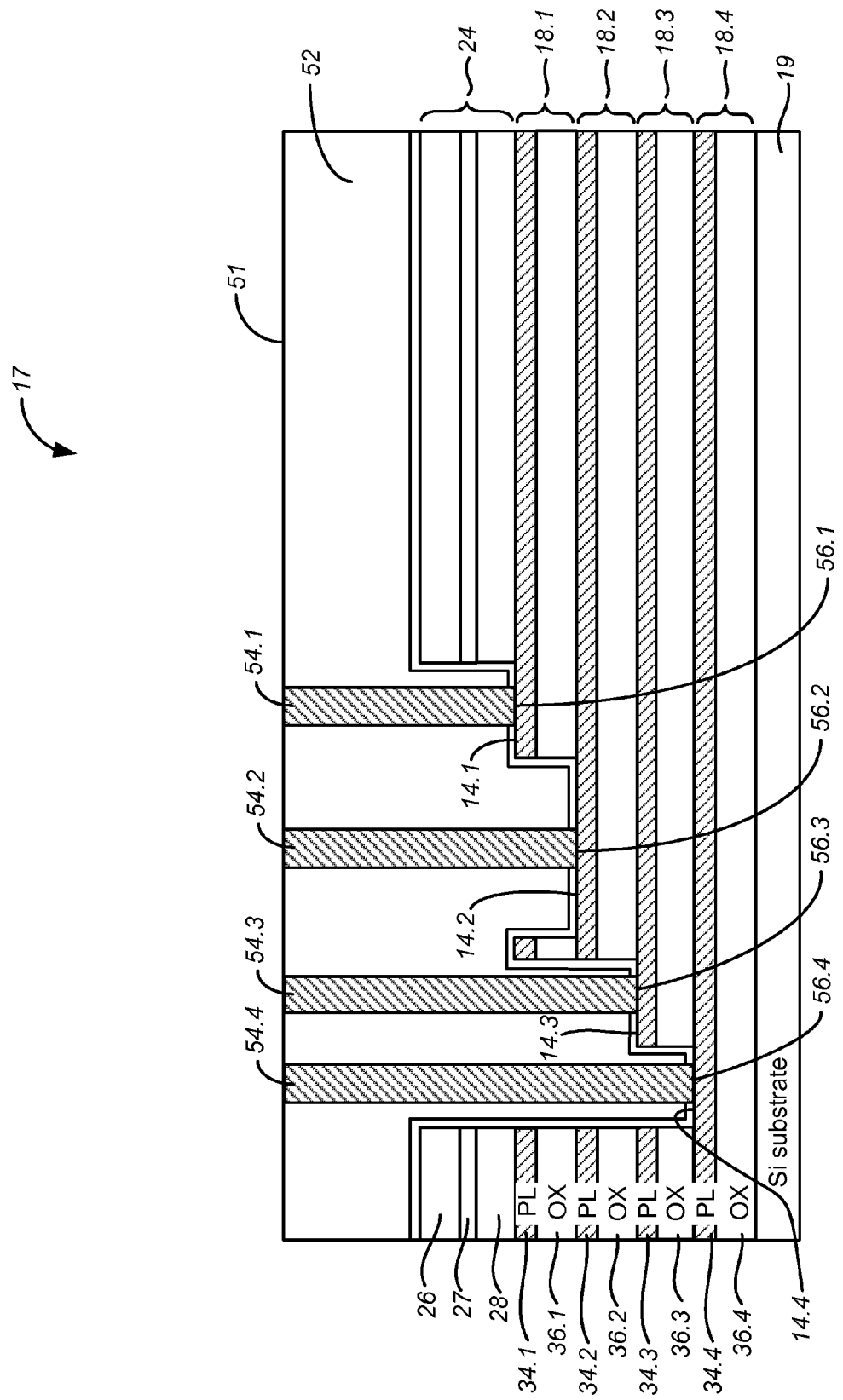
Figure 28:
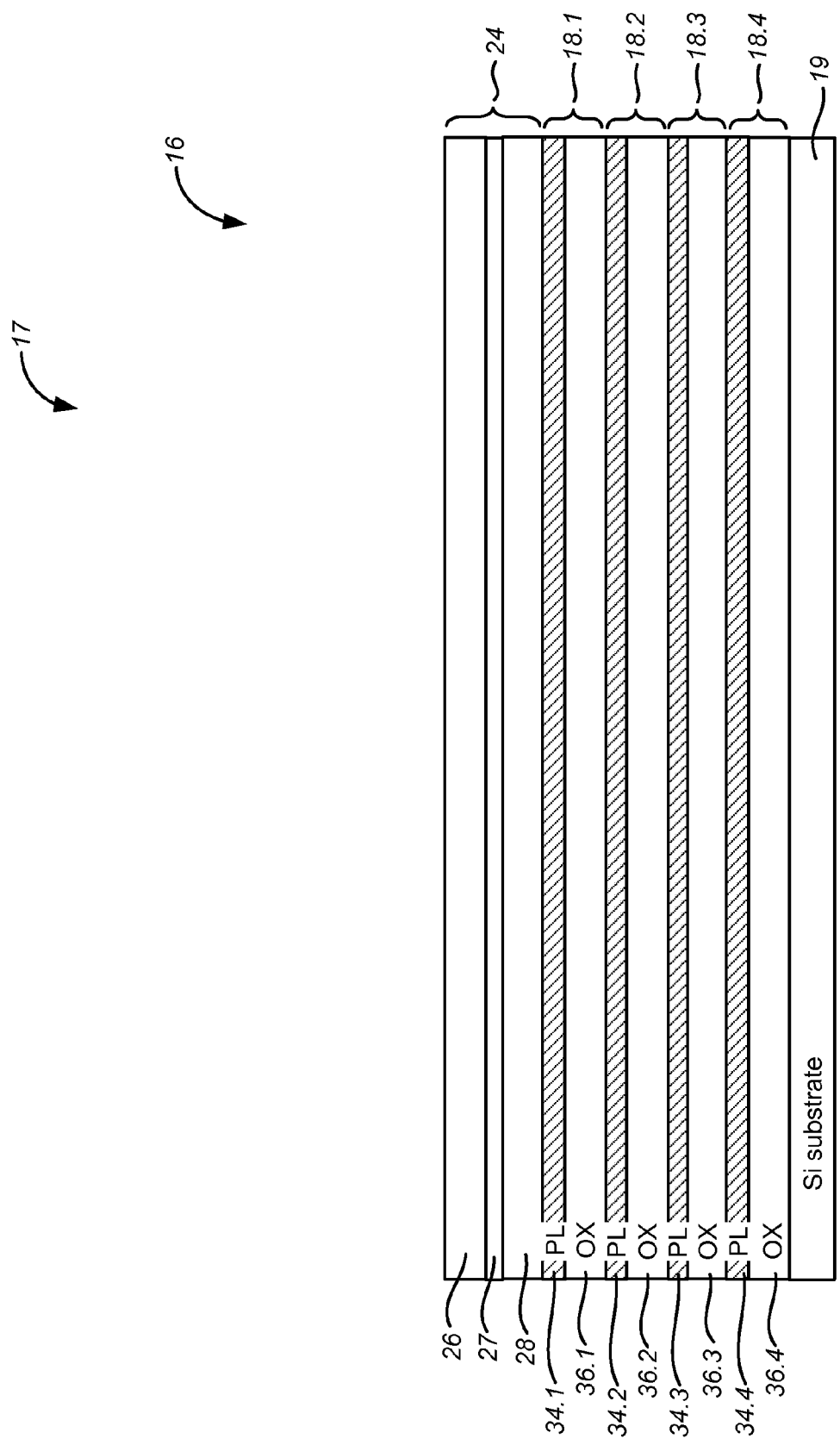
Figure 29:
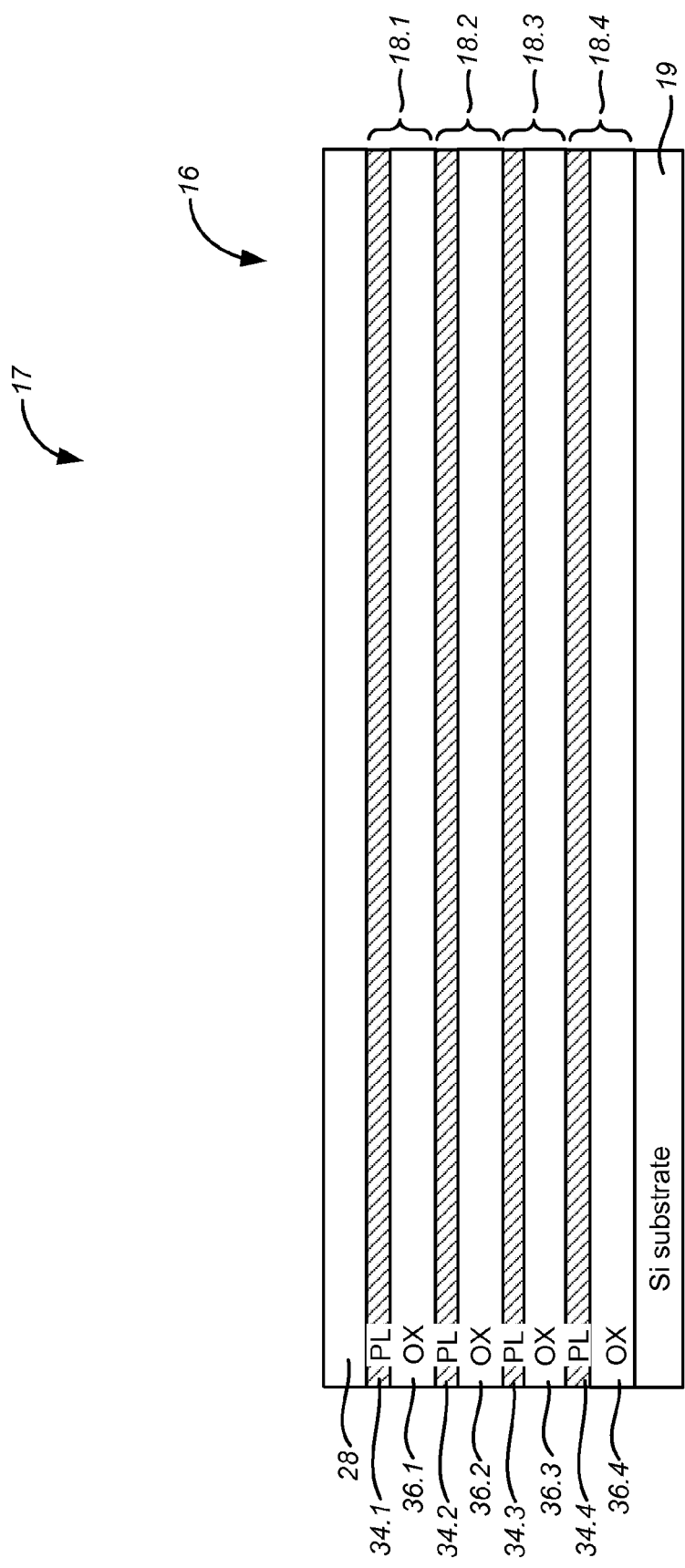
Figure 30:
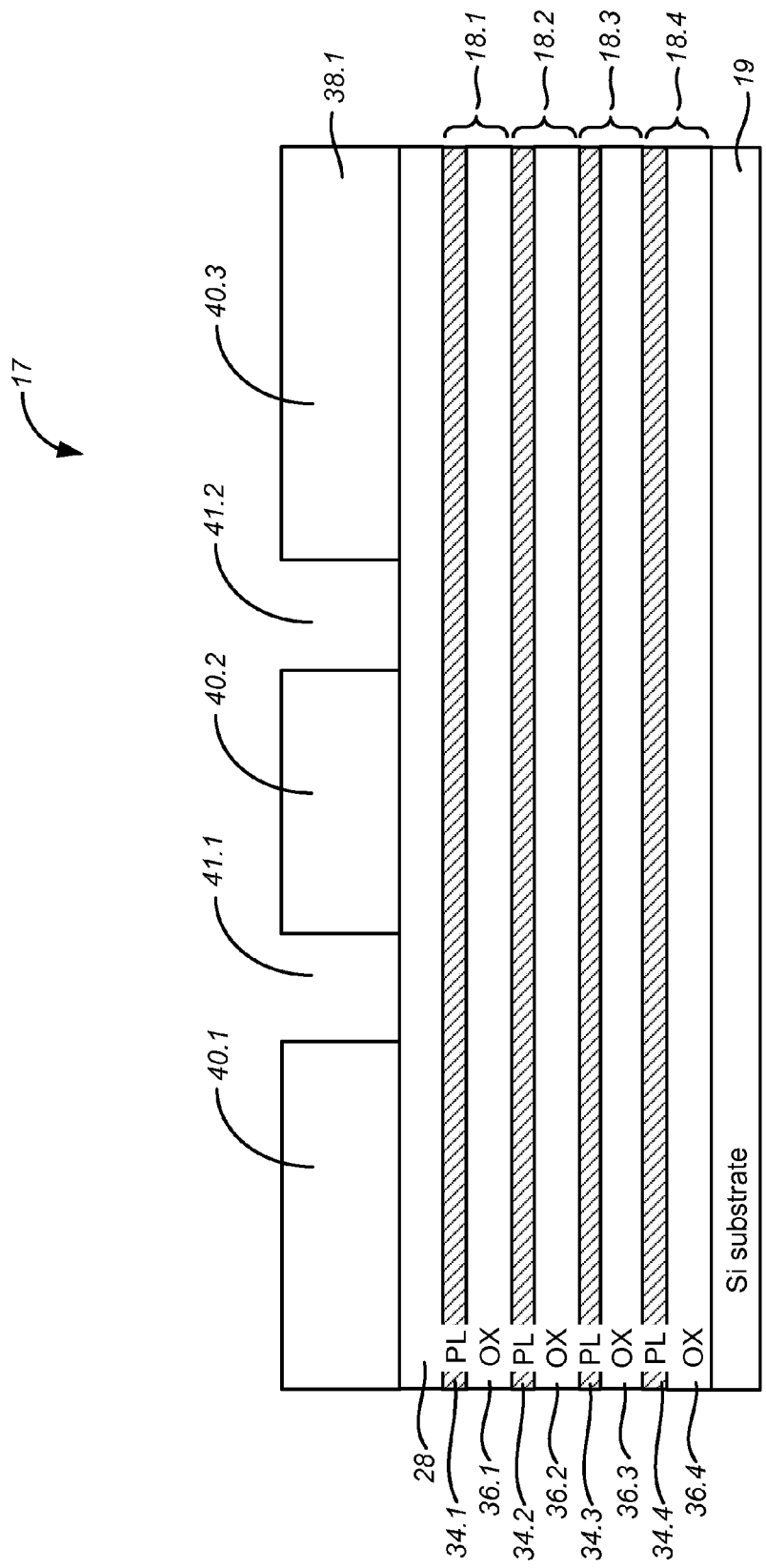
Figure 31:
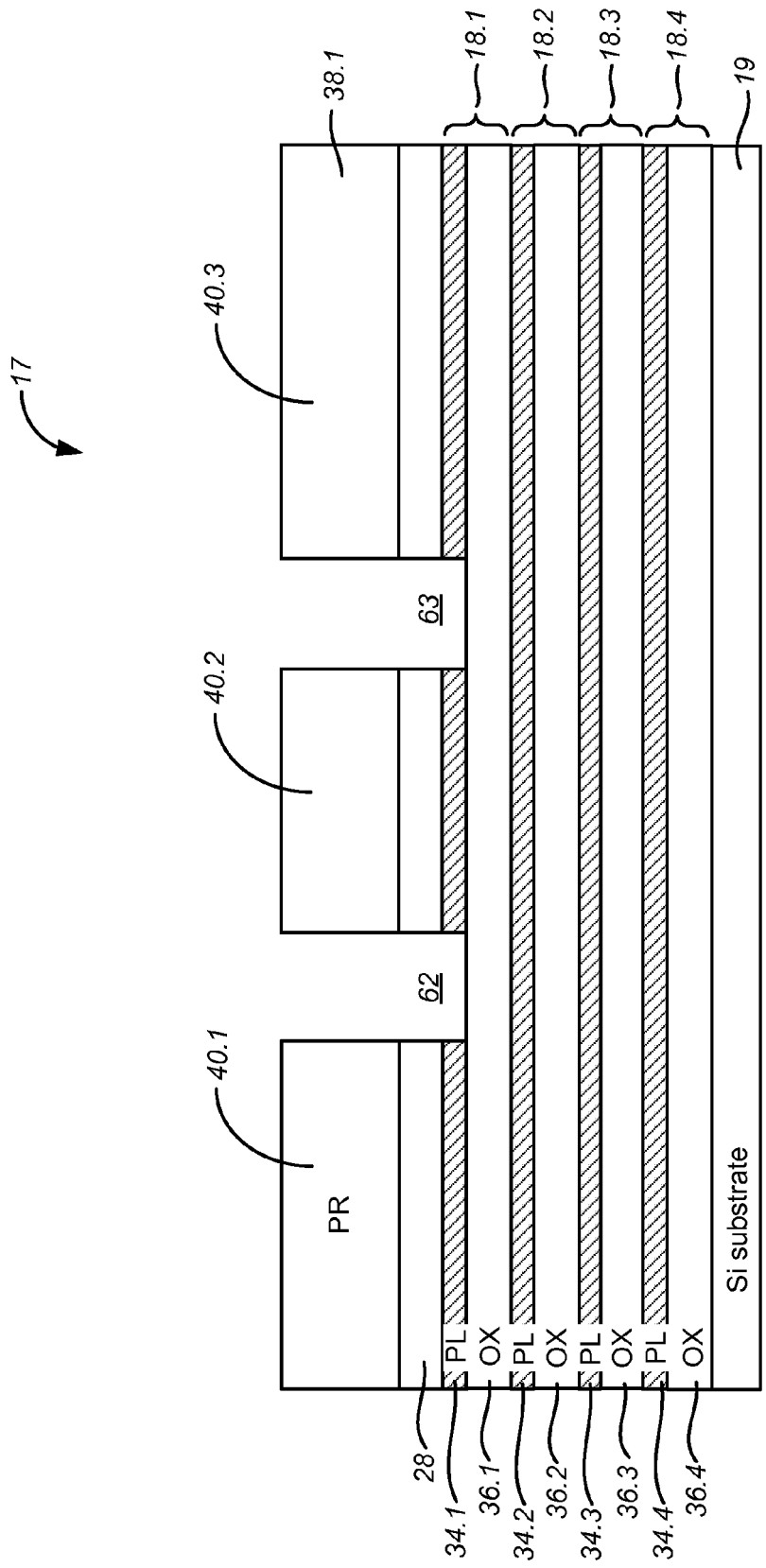
Figure 32:
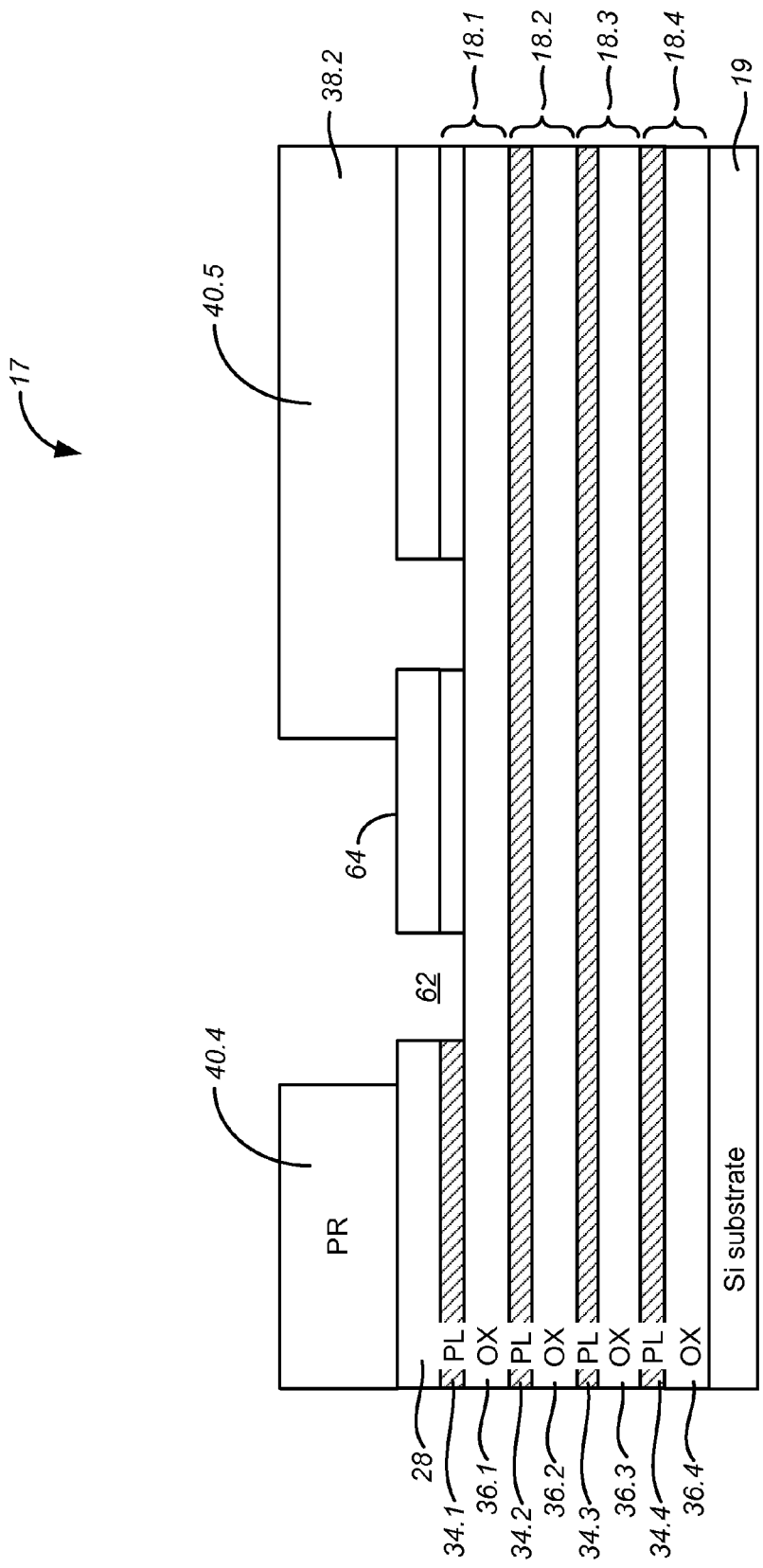

FIG. 27 shows the structure of FIG. 26 after electrical conductors have been formed through the interlayer dielectric and the etch stop layer to make contact with landing areas at the interconnect contact regions of each of the four contact levels.

FIGS. 28-34 illustrate a second example of a method for creating interconnect contact regions at a number of contact levels at an interconnect region of a three-dimensional stacked IC device.

FIGS. 35-44 illustrate a third example of a method for creating interconnect contact regions at a number of contact levels at an interconnect region of a three-dimensional stacked IC device.

Figure 45:
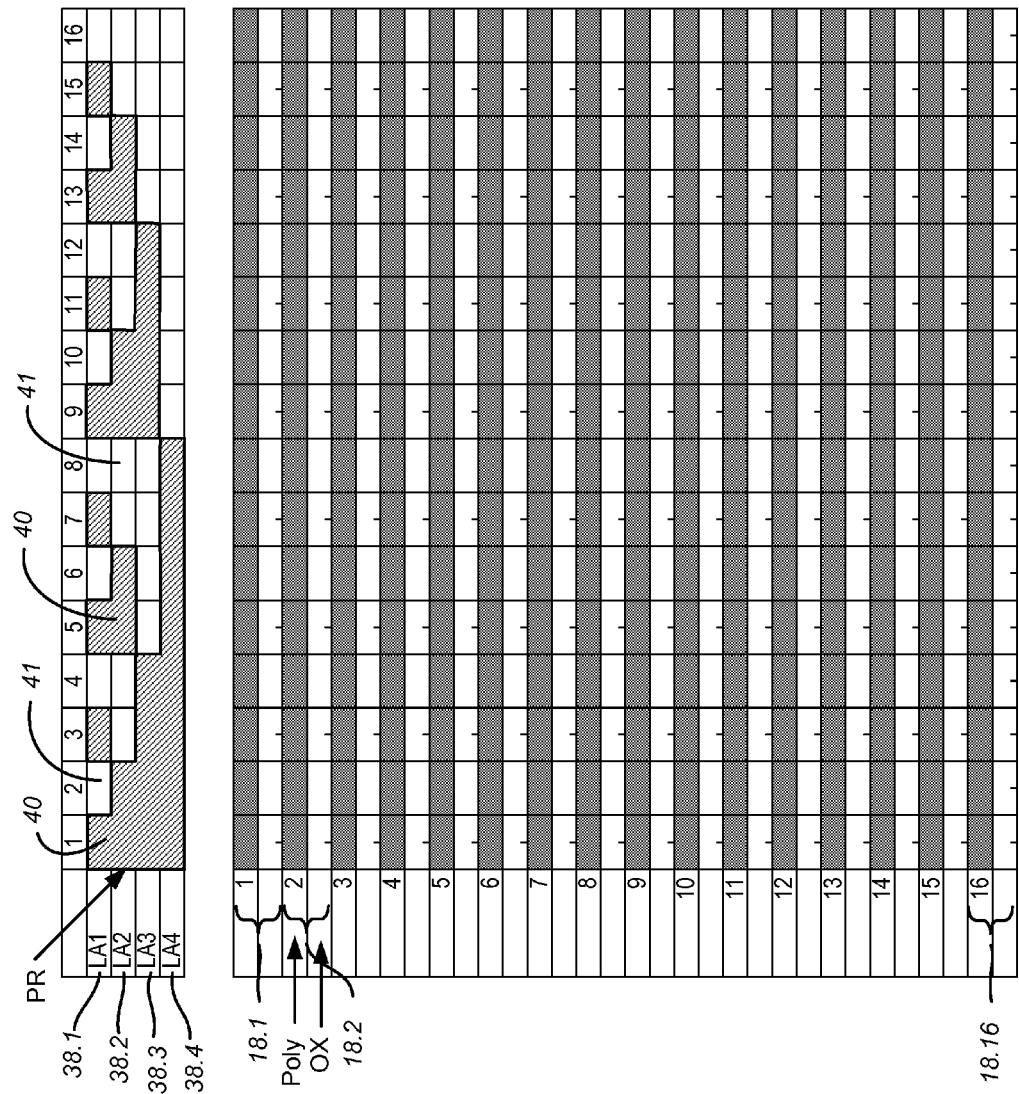
Figure 46:
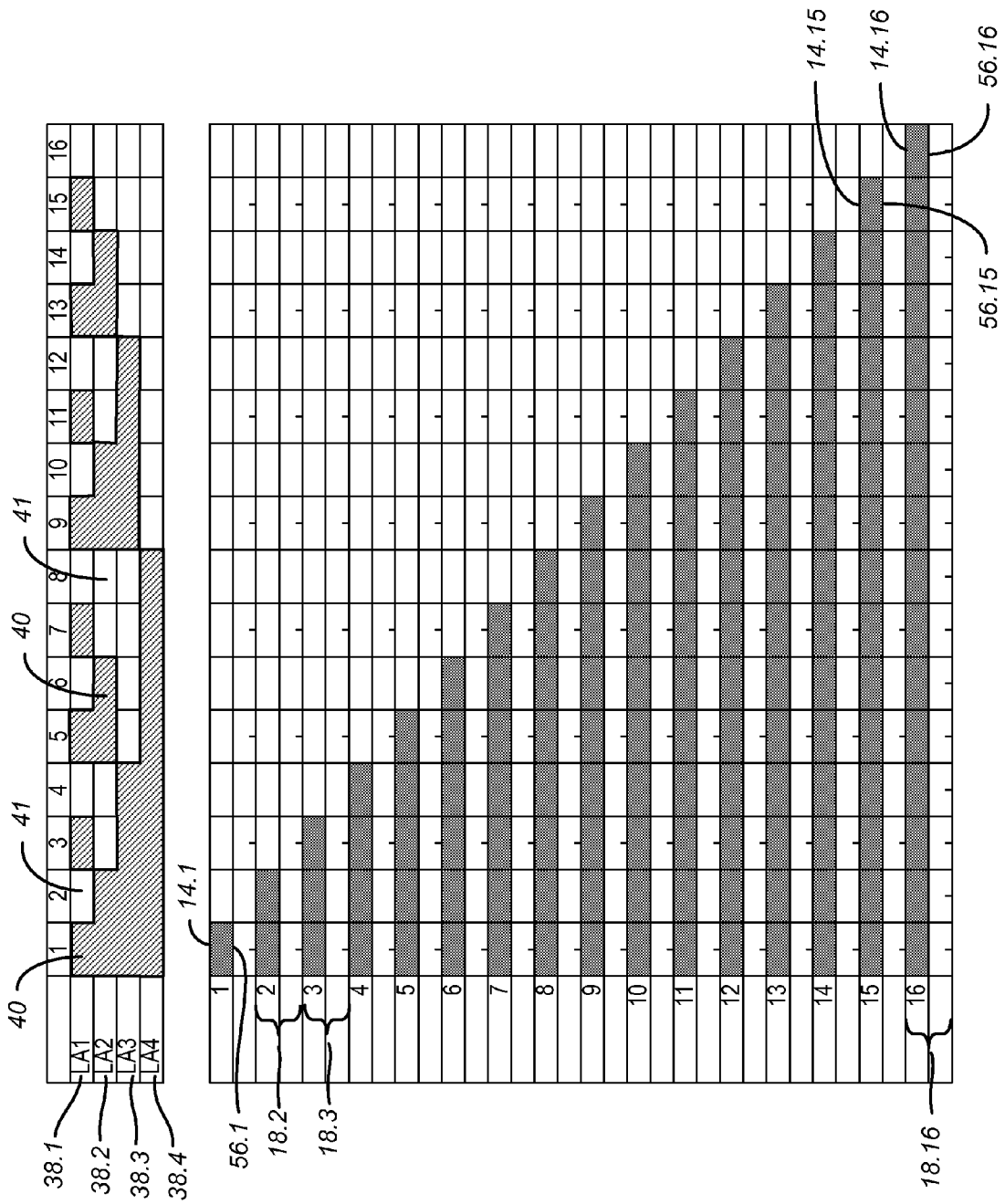

FIGS. 45 and 46 illustrate a process example for a stack of 16 contact levels with FIG. 46 illustrating the etching results.

Figure 47:
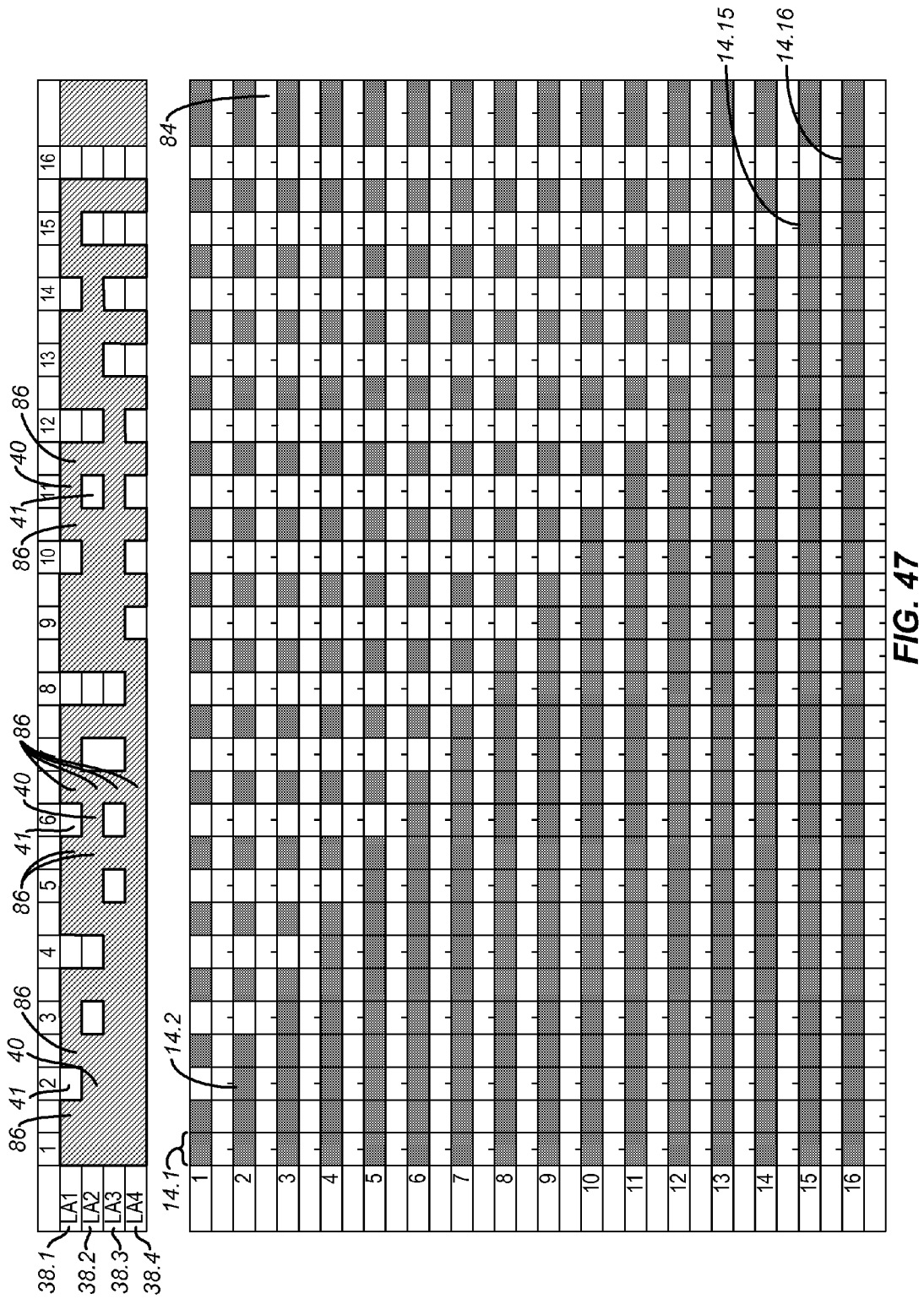

FIG. 47 illustrates the etching results when the masks have dummy contact regions so to create dummy stacks between the interconnect contact regions.

DETAILED DESCRIPTION

Figure 1:
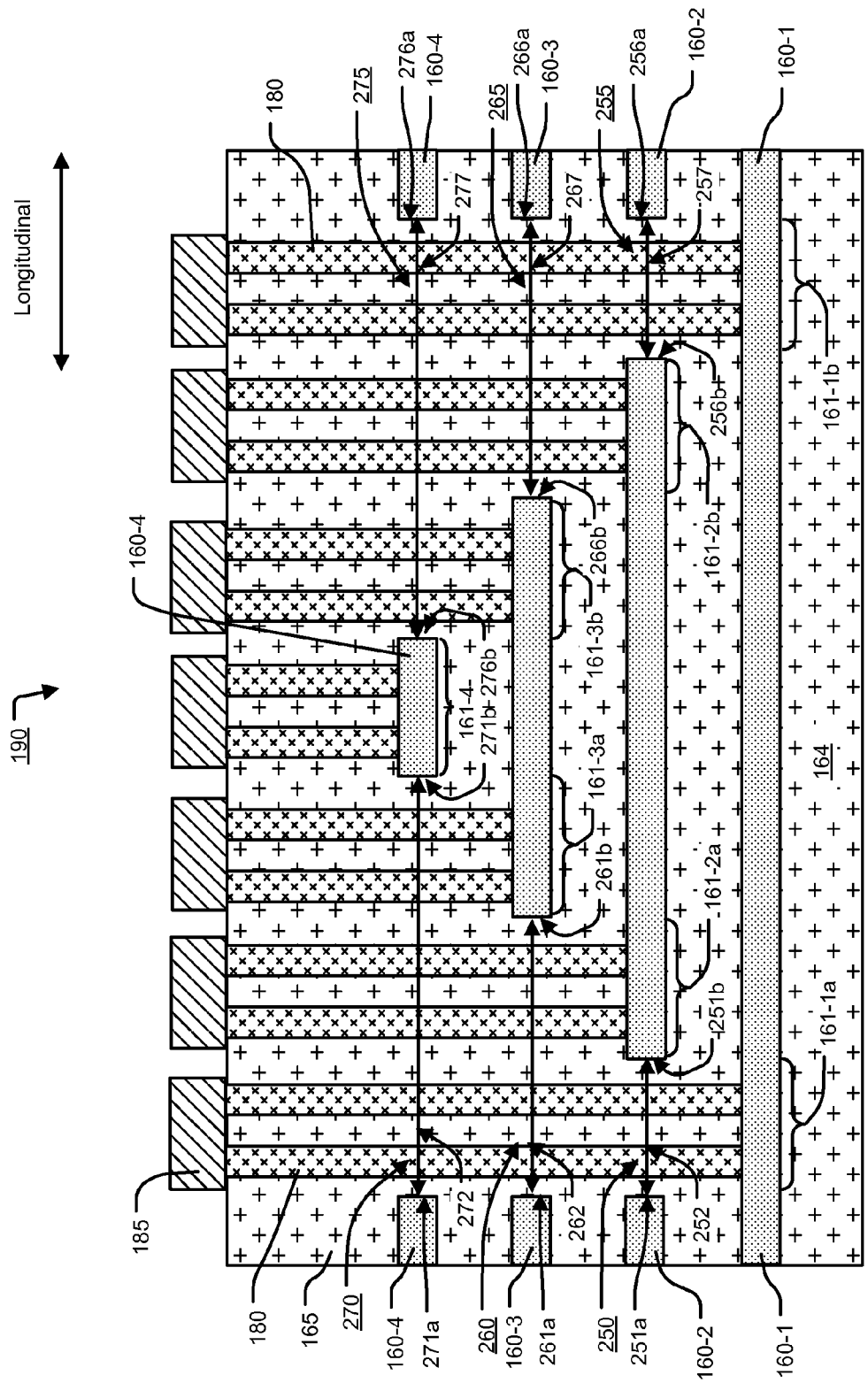

FIG. 1 illustrates a cross-sectional view of a device including three-dimensional structure having an interconnect structure 190 with a small footprint where conductors 180 extend to various levels 160-1 to 160-4 in the device. In the illustrated example, four levels 160-1 to 160-4 are shown. More generally, the small interconnect structure 190 described herein can be implemented in a structure having levels 0 to N, where N is at least 2.

The conductors 180 are arranged within the interconnect structure 190 to contact landing areas on the various levels 160-1 to 160-4. As described in more detail below, the conductors 180 for each particular level extend through openings in the overlying levels to contact the landing areas 161-1a, 161-1b, 161-2a, 161-2b, 161-3a, 161-3b, 161-4. The conductors 180 are used in this example for coupling the contact levels 160-1 to 160-4 to interconnect lines 185 in a wiring layer overlying the levels 160-1 to 160-4.

The landing areas are the portions of contact levels 160-1 to 160-4 used for contact with conductors 180. The sizes of the landing areas are large enough to provide room for the conductors 180 to adequately couple the electrically conductive landing areas within the landing areas of the various contact levels 160-1 to 160-4 to the overlying interconnect lines 185, as well as to address issues such as misalignment between the conductors 180 and the overlying openings in one level for landing areas in different levels.

The size of a landing area thus depends on a number of factors, including the size and number of conductors used, and will vary from embodiment to embodiment. In addition, the number of the conductors 180 can be different for each of the landing areas.

In the illustrated example, the levels 160-1 to 160-4 consist of respective planar conductive layers of material such as doped polysilicon, with layers of insulating material 165 separating the levels 160-1 to 160-4. Alternatively, the levels 160-1 to 160-4 need not be planar stacked material layers, and instead the layers of material can vary in the vertical dimension.

The conductors 180 contacting the different levels 160-1 to 160-4 are arranged in a direction extending along the cross-section illustrated in FIG. 1A. This direction defined by the arrangement of the conductors 180 contacting different levels 160-1 to 160-4 is referred to herein as the "longitudinal" direction. The "transverse" direction is perpendicular to the longitudinal direction, and is into and out of the cross-section illustrated in FIG. 1A. Both the longitudinal and transverse directions are considered to be "lateral dimensions", meaning a direction that is in a two-dimensional area of a plan view of the levels 160-1 to 160-4. The "length" of structures or features is its length in the longitudinal direction, and its "width" is its width in the transverse direction.

Level 160-1 is the lowest level in the plurality of levels 160-1 to 160-4. The level 160-1 is on insulating layer 164.

The level 160-1 includes first and second landing areas 161-1a, 161-1b for contact with conductors 180.

In FIG. 1 the level 160-1 includes two landing areas 161-1a, 161-1b on opposite ends of the interconnect structure 190. In some alternative embodiments one of the landing areas 161-1a, 161-1b is omitted.

Figure 2A:
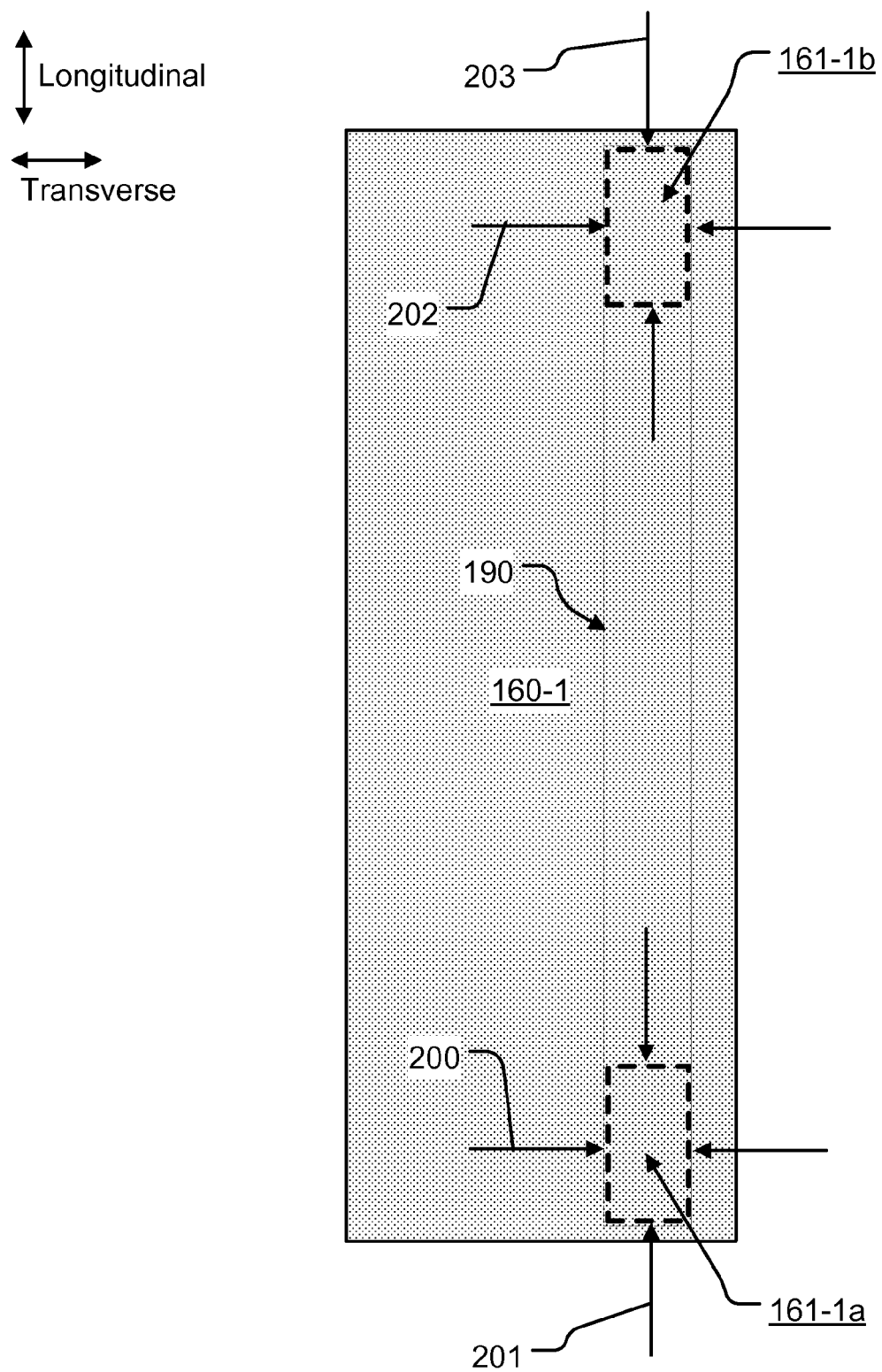
FIG. 2A illustrates a plan view of level 160-1 showing the landing areas.

FIG. 2A is a plan view of a portion of level 160-1, including the landing areas 161-1a, 161-1b within the footprint of the interconnect structure 190. The footprint of the interconnect structure 190 can be close to the width of the via size for the conductors, and have a length that can be much longer than the width. As shown in FIG. 2A, landing area 161-1a has a width 200 in the transverse direction and a length 201 in the longitudinal direction. Landing area 161-1b has a width 202 in the transverse direction and a length 203 in the longitudinal direction. In the embodiment of FIG. 2A the landing areas 161-1a, 161-1b each have a rectangular cross-section. In embodiments, the landing areas 161-1a, 161-1b may each have a cross-section that is circular, elliptical, square, rectangular, or somewhat irregularly shaped.

Because level 160-1 is the lowest level, the conductors 180 need not pass through the level 160-1 to underlying levels. Thus, in this example, level 160-1 does not have openings within the interconnect structure 190.

Referring back to FIG. 1, level 160-2 overlies level 160-1. Level 160-2 includes an opening 250 overlying the landing area 161-1a on level 160-1. The opening 250 has a distal longitudinal sidewall 251a and a proximal longitudinal sidewall 251b defining the length 252 of the opening 250. The length 252 of the opening 250 is at least as large as the length 201 of the underlying landing area 161-1a, so that the conductors 180 for the landing area 161-1a can pass through the level 160-2.

The level 160-2 also includes opening 255 overlying the landing area 161-1b. The opening 255 has distal and proximal longitudinal sidewalls 256a, 256b defining the length 257 of the opening 255. The length 257 of the opening 255 is at least as large as the length 203 of the underlying landing area 161-1b, so that the conductors 180 for the landing area 161-1b can pass through the level 160-2.

The level 160-2 also includes first and second landing areas 161-2a, 161-2b adjacent the openings 250, 255 respectively. The first and second landing areas 161-2a, 161-2b are the portions of level 160-2 used for contact with the conductors 180.

Figure 2B:
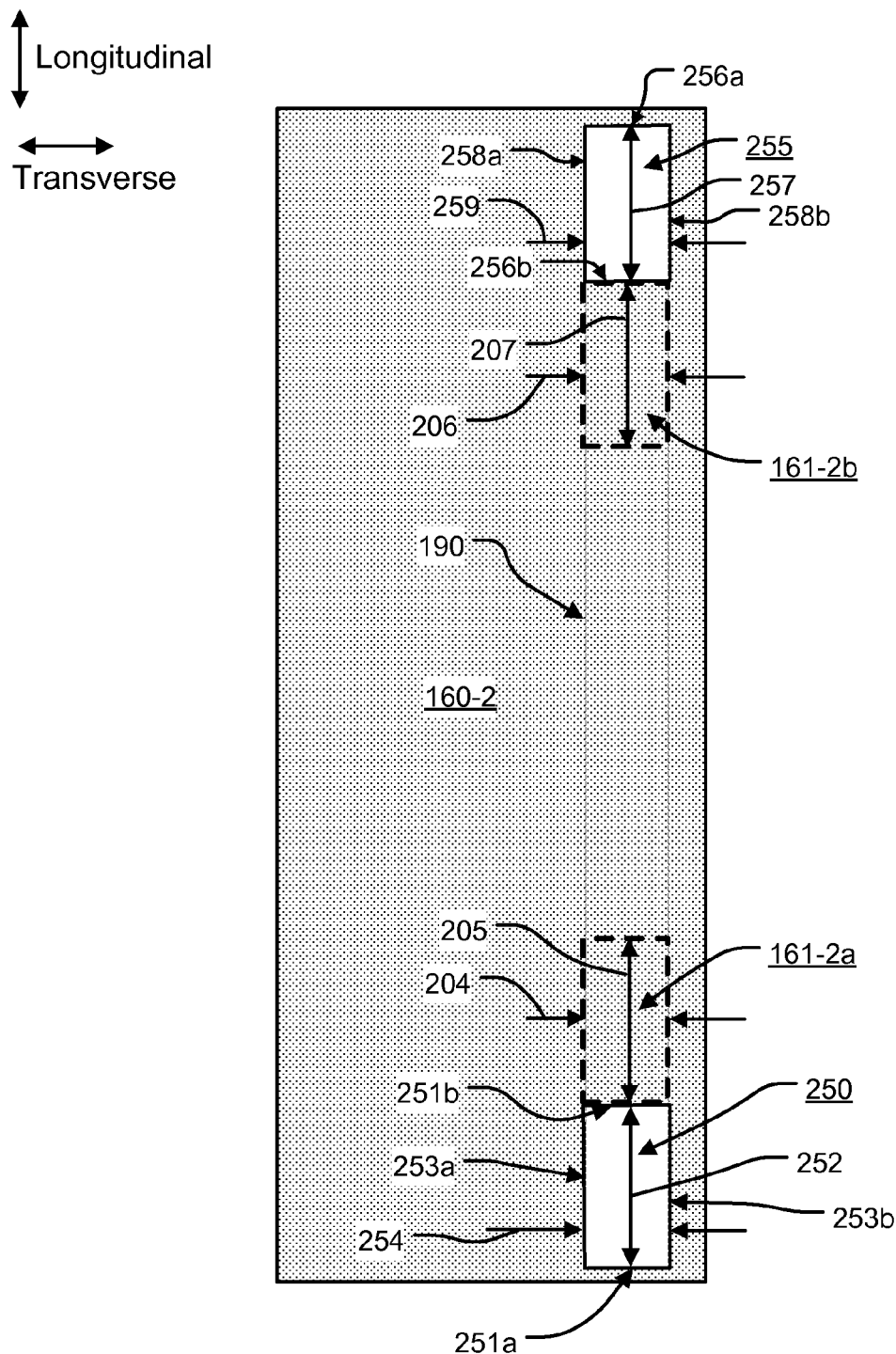
FIG. 2B illustrates a plan view of level 160-2 showing openings adjacent the landing areas.

FIG. 2B is a plan view of a portion of level 160-2, including the first and second landing areas 161-2a, 161-2b and the openings 250, 255 within the interconnect structure 190.

As shown in FIG. 2B, opening 250 has longitudinal sidewalls 251a, 251b defining the length 252, and has transverse sidewalls 253a, 253b defining the width 254 of the opening 250. The width 254 is at least as large as the width 200 of the underlying landing area 161-1a, so that the conductors 180 can pass through the opening 250.

Opening 255 has longitudinal sidewalls 256a, 256b defining the length 257, and has transverse sidewalls 258a, 258b defining the width 259. The width 259 is at least as large as the width 202 of the underlying landing area 161-1b, so that the conductors 180 can pass through the opening 255.

In the plan view of FIG. 2B the openings 250, 255 each have a rectangular cross-section. In embodiments, the openings 250, 255 may each have a cross-section that is circular, elliptical, square, rectangular, or somewhat irregularly shaped, depending on the shape of the mask used to form them.

As shown in FIG. 2B, landing area 161-2a is adjacent the opening 250 and has a width 204 in the transverse direction and a length 205 in the longitudinal direction. Landing area 161-2b is adjacent the opening 255 and has a width 206 in the transverse direction and a length 207 in the longitudinal direction.

Referring back to FIG. 1, level 160-3 overlies level 160-2. Level 160-3 includes an opening 260 overlying landing area 161-1a on level 160-1 and landing area 161-2a on level 160-2. The opening 260 has distal and proximal longitudinal sidewalls 261a, 261b defining the length 262 of the opening 260. The length 262 of the opening 260 is at least as large as the sum of the lengths 201 and 205 of the underlying landing areas 161-1a and 161-2a, so that the conductors 180 for the landing areas 161-1a and 161-2a can pass through the level 160-3.

As can be seen in FIG. 1, the distal longitudinal sidewall 261a of opening 260 is vertically aligned with the distal longitudinal sidewall 251a of the underlying opening 250. In the manufacturing embodiment described in more detail below, the openings can be formed using the opening in a single etch mask and one additional mask formed over the opening in the single etch mask, as well as processes for etching the addition mask without a critical alignment step, resulting in the formation of openings having distal longitudinal sidewalls (261a, 251a, . . . ) along the perimeter of the single etch mask that are vertically aligned.

The level 160-3 also includes opening 265 overlying the landing area 161-1b on level 160-1 and landing area 161-2b on level 160-2. The opening 265 has outside and inside longitudinal sidewalls 266a, 266b defining the length 267 of the opening 265. The outside longitudinal sidewall 266a of opening 265 is vertically aligned with the outside longitudinal sidewall 256a of the underlying opening 255.

The length 267 of the opening 265 is at least as large as sum of the lengths 203 and 207 of the underlying landing areas 161-1b and 161-2b, so that the conductors 180 for the landing areas 161-1b and 161-2b can pass through the level 160-3.

The level 160-3 also includes first and second landing areas 161-3a, 161-3b adjacent the openings 260, 265 respectively. The first and second landing areas 161-3a, 161-3b are the portions of level 160-3 used for contact with the conductors 180.

Figure 2C:
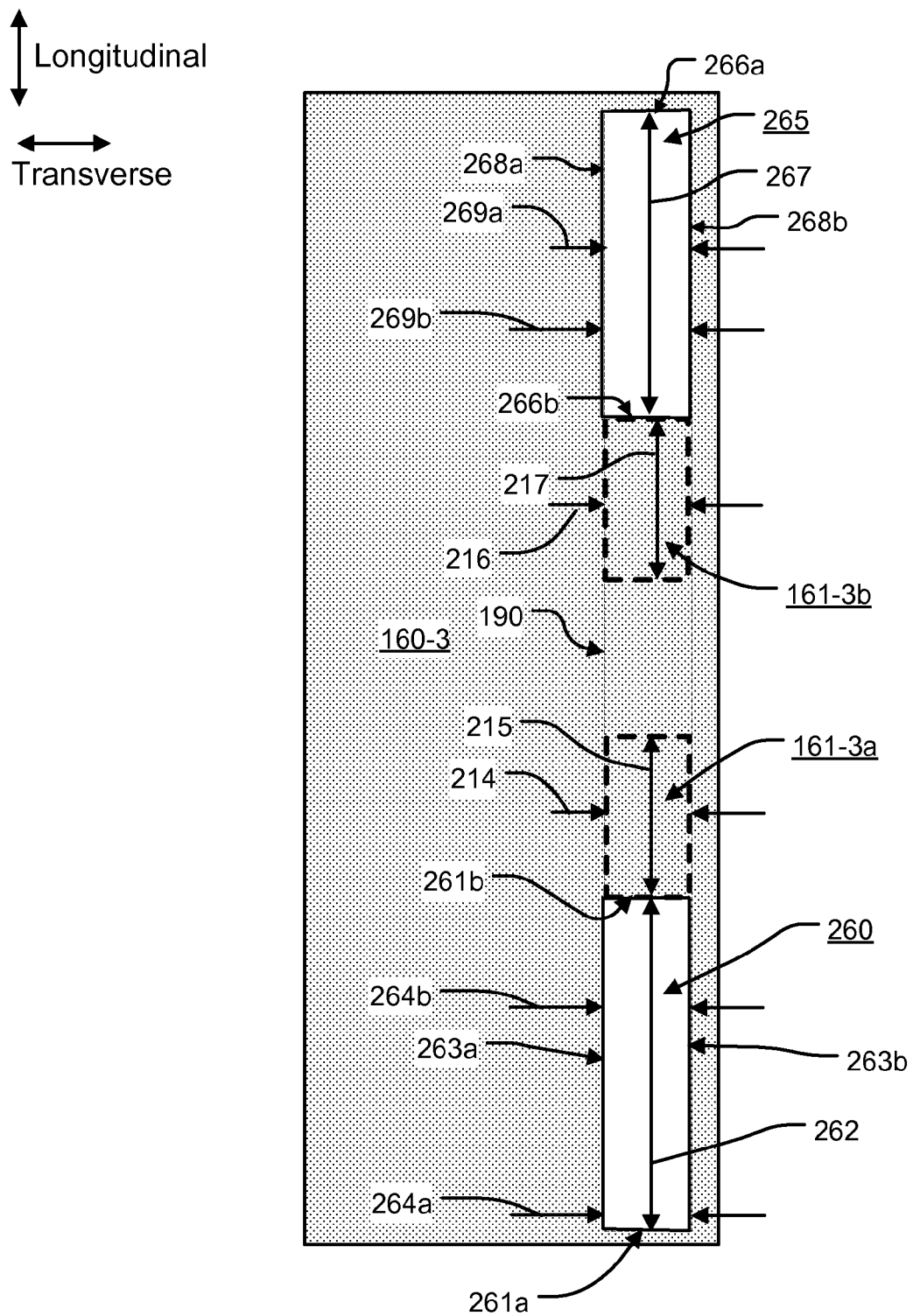
FIG. 2C illustrates a plan view of level 160-3 showing openings adjacent the landing areas.

FIG. 2C is a plan view of a portion of level 160-3, including the first and second landing areas 161-3a, 161-3b and the openings 260, 265 within the interconnect structure 190.

As shown in FIG. 2C, opening 260 has outside and inside longitudinal sidewalls 261a, 261b defining the length 262, and has transverse sidewalls 263a, 263b defining the width 264a, 264b of the opening 260. The width 264a is at least as large as the width 200 of the underlying landing area 161-1a, and width 264b is at least as large as the width 204 of the underlying landing area 161-2a, so that the conductors 180 can pass through the opening 260.

In the illustrated embodiments, widths 264a and 264b are substantially the same. Alternatively, the widths 264a and 264b can be different, in order to accommodate landing areas having different widths.

Opening 265 has longitudinal sidewalls 266a, 266b defining the length 267, and has transverse sidewalls 268a, 268b defining the width 269a, 269b. The width 269a is at least as large as the width 202 of the underlying landing area 161-1b, and the width 269b is at least as large as the width 206 of the underling landing area 161-2b, so that the conductors 180 can pass through the opening 265.

As shown in FIG. 2C, landing area 161-3a is adjacent the opening 260 and has a width 214 in the transverse direction and a length 215 in the longitudinal direction. Landing area 161-3b is adjacent the opening 265 has a width 216 in the transverse direction and a length 217 in the longitudinal direction.

Referring back to FIG. 1, level 160-4 overlies level 160-3. Level 160-4 includes an opening 270 overlying the landing area 161-1a on level 160-1, the landing area 161-2a on level 160-2, and the landing area 161-3a on level 160-3. The opening 270 has longitudinal sidewalls 271a, 271b defining the length 272 of the opening 270. The length 272 of the opening 270 is at least as large as the sum of the lengths 201, 205, and 215 of the underlying landing areas 161-1a, 161-2a, 161-3a so that the conductors 180 for the landing areas 161-1a, 161-2a, 161-3a can pass through the level 160-4. As shown in FIG. 1, the longitudinal sidewall 271a of opening 270 is vertically aligned with the longitudinal sidewall 261a of the underlying opening 260.

The level 160-4 also includes opening 275 overlying the landing area 161-1b on level 160-1, the landing area 161-2b on level 160-2, and the landing area 161-3b on level 160-3. The opening 275 has longitudinal sidewalls 276a, 276b defining the length 277 of the opening 275. The longitudinal sidewall 276a of opening 275 is vertically aligned with the longitudinal sidewall 266a of the underlying opening 265.

The length 277 of the opening 275 is at least as large as sum of the lengths 203, 207, and 217 of the underlying landing areas 161-1b, 161-2b and 161-3b, so that the conductors 180 for the landing areas 161-1b, 161-2b, and 161-3b can pass through the level 160-4.

The level 160-4 also includes a landing area 161-4 between the openings 270, 275. The landing area 161-4 is the portion of level 160-4 used for contact with the conductors 180. In FIG. 1, the level 160-4 has one landing area 161-4. Alternatively, the level 160-4 may include more than one landing area.

Figure 2D:
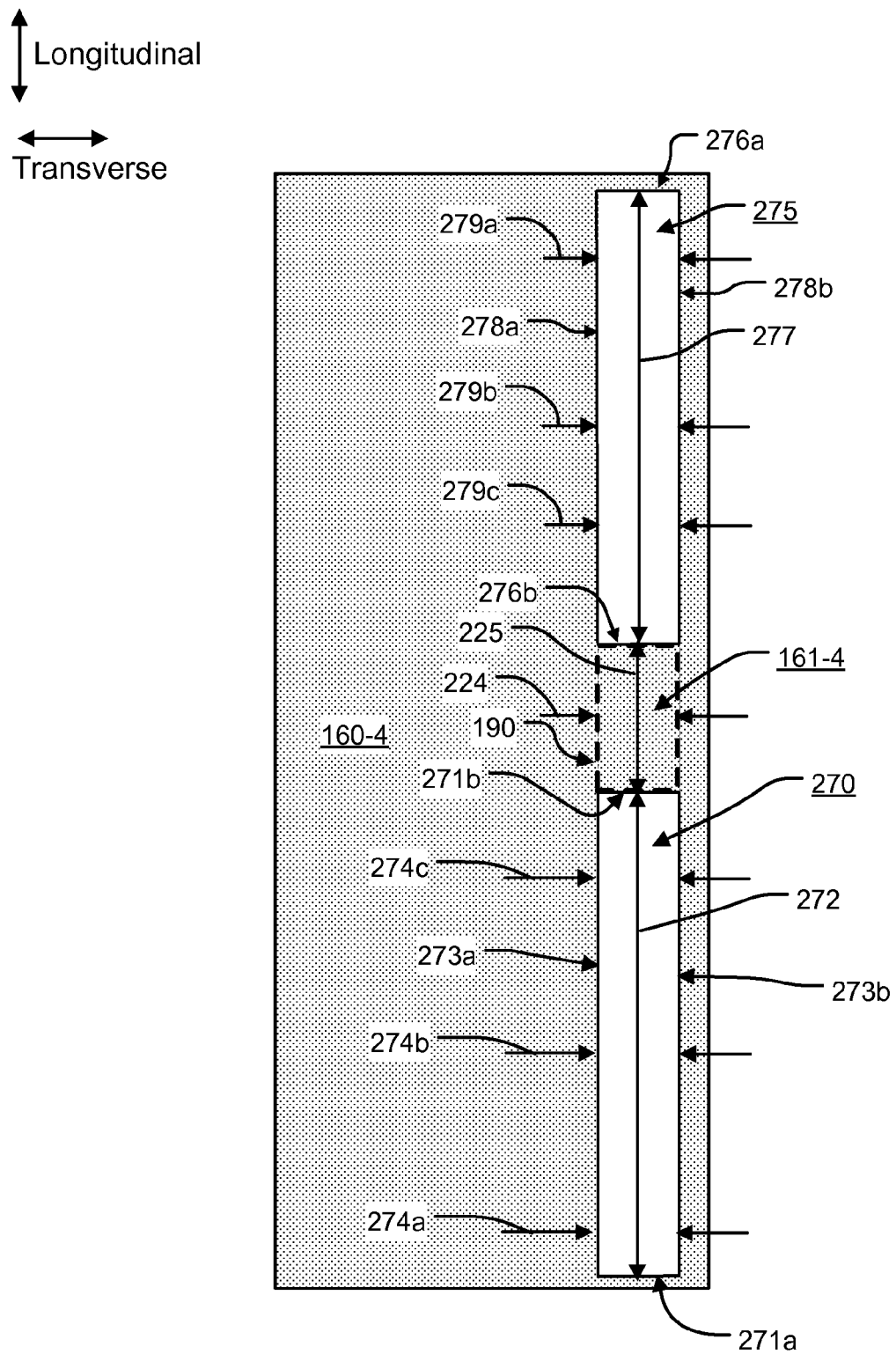
FIG. 2D illustrates a plan view of level 160-4 showing openings adjacent the landing area.

FIG. 2D is a plan view of a portion of level 160-4, including landing area 161-4 and the openings 270, 275 within the interconnect structure 190.

As shown in FIG. 2D, opening 270 has longitudinal sidewalls 271a, 271b defining the length 272, and has transverse sidewalls 273a, 273b defining the width 274a, 274b, 274c of the opening 270. The widths 274a, 274b, 274c are at least as large as the widths 200, 204, and 214 of the underlying landing areas 161-1a, 161-2a and 161-3a, so that the conductors 180 can pass through the opening 270.

Opening 275 has longitudinal sidewalls 276a, 276b defining the length 277, and has transverse sidewalls 278a, 278b defining the width 279a, 279b, 279c. The widths 279a, 279b, 279c are at least as large as the widths 202, 206, and 216 of the underlying landing areas 161-1b, 161-2b and 161-3b, so that the conductors 180 can pass through the opening 275.

As shown in FIG. 2D, landing area 161-4 is between the openings 270, 275 and has a width 224 in the transverse direction and a length 225 in the longitudinal direction.

Referring back to FIG. 1, the distal longitudinal sidewalls 271a, 261a, and 251a of openings 270, 260, and 250 are vertically aligned, so that the difference in the length of the openings 270, 260, and 250 is due to the horizontal offset of the sidewalls 271b, 261b, and 251b. As used herein, elements or features "vertically aligned" are substantially flush with an imaginary plane perpendicular to both the transverse and longitudinal directions. As used herein, the term "substantially flush" is intended to accommodate manufacturing tolerances in the formation of the openings using the opening in a single etch mask and multiple etch processes which may cause variations in the planarity of the sidewalls.

As shown in FIG. 1, the longitudinal sidewalls 276a, 266a, and 256a of openings 275, 265, and 255 also are vertically aligned.

Similarly, the transverse sidewalls of the openings in the levels are also vertically aligned. Referring to FIGS. 2A-2D, the transverse sidewalls 273a, 263a, and 253a of openings 270, 260, and 250 are vertically aligned. In addition the transverse sidewalls 273b, 263b, and 253b are vertically aligned. For openings 275, 265, and 255 the longitudinal sidewalls 276a, 266a, and 256a are vertically aligned, and the transverse sidewalls 278b, 268b, and 258b are vertically aligned.

In the illustrated embodiment, the openings in the various levels 160-1 to 160-4 have substantially the same width in the transverse direction. Alternatively, the width of the openings can vary along the longitudinal direction, for example, in a step-like manner, in order to accommodate landing areas having different widths.

This technique for implementing the interconnect structure 190 as described herein significantly reduces the area or footprint needed for making contact to the plurality of levels

160-1 to 160-4, compared to prior art techniques. As a result, more space is available for implementing memory circuits in the various levels 160-1 to 160-4. This allows for higher memory density and a smaller cost per bit in the upper levels compared to prior art techniques.

In the cross-section of FIG. 1, the openings within the interconnect structure 190 result in the levels having a staircase-like pattern on both sides of the landing area 161-4 on level 160-4. That is, the two openings in each level are symmetrical about an axis perpendicular to both the longitudinal and transverse directions, and the two landing areas of each level are also symmetrical about that axis. As used herein, the term "symmetrical" is intended to accommodate manufacturing tolerances in the formation of the openings using the opening in a single etch mask and multiple etch processes which may cause variations in the dimensions of the openings.

In alternative embodiments in which each level includes a single opening and a single landing area, the levels have a staircase-like pattern on only one side.

In the illustrated example, four levels 160-1 through 160-4 are shown. More generally, the small interconnect structure described herein can be implemented in levels 0 to N, where N is at least 2. Generally, level (i), for (i) equal to 1 through N, overlies level (i−1), and has an opening (i) adjacent the landing area (i) on level (i). The opening (i) extends over the landing area (i−1) on level (i−1), and for (i) greater than 1, over the adjacent opening (i−1) in level (i−1). The opening (i) has a distal longitudinal sidewall aligned with the distal longitudinal sidewall of opening (i−1) in level (i), and a proximal longitudinal sidewall defining a length of the opening (i). The length of the opening (i) is at least as large as the length of the landing area (i−1) plus the length of the opening (i−1), if any. For (i) greater than 1, the opening (i) has transverse sidewalls aligned with the transverse sidewalls of opening (i−1) in level (i−1) and defines a width of the opening (i) at least as large as the width of the landing area (i−1).

Other types of memory cells and configurations can be used in alternative embodiments. Examples of the other types of memory cells which may be used include dielectric charge trapping and floating gate memory cells. For example, in an alternative the levels of the device may be implemented as planar memory cell arrays separated by insulating material, with the access devices and access lines formed within the levels using thin film transistors or related technologies. In addition, the interconnect structure described herein can be implemented in other types of three-dimensional stacked integrated circuit devices, where having conductors extending to various levels in the device within a small footprint is useful.

FIG. 3A is a cross-section of a portion of a three-dimensional stacked integrated circuit device 100 including a memory array region 110 and a periphery region 120 with an interconnect structure 190 as described herein.

In FIG. 3A, the memory array region 110 is implemented as one-time programmable multi-level memory cells as described in U.S. patent application Ser. No. 12/430,290 by Lung, which is commonly owned by the assignee of the present application and incorporated by reference herein. It is described here as a representative integrated circuit structure in which the 3D interconnect structure described herein can be implemented.

The memory array region 110 includes a memory access layer 112 including horizontal field effect transistor access devices 131*a*, 131*b* having source regions 132*a*, 132*b* and drain regions 134*a*, 134*b* in a semiconductor substrate 130. The substrate 130 can comprise bulk silicon or a layer of silicon on an insulating layer or other structures known in the art for supporting integrated circuits. Trench isolation structures 135*a*, 135*b* isolate regions in the substrate 130. Word lines 140*a*, 140*b* act as gates for the access devices 131*a*, 131*b*. Contact plugs 142*a*, 142*b* extend through inter-layer dielectric 144 to couple the drain regions 134*a*, 134*b* to bit lines 150*a*, 150*b*.

Contact pads 152*a*, 152*b* are coupled to underlying contacts 146*a*, 146*b*, providing connection to the source regions 132*a*, 132*b* of the access transistors. The contact pads 152*a*, 152*b* and bit lines 150*a*, 150*b* are within an inter-layer dielectric 154.

In the illustrated example, the levels consist of respective planar conductive layers of material such as doped polysilicon. Alternatively, the levels need not be planar stacked material layers, and instead the layers of material can vary in the vertical dimension.

Insulating layers 165-1 to 165-3 separate the levels 160-1 to 160-4 from one another. An insulating layer 166 overlies the levels 160-1 to 160-4 and insulating layers 165-1 to 165-3.

A plurality of electrode pillars 171*a*, 171*b* are arranged on top of the memory cell access layer 112 and extend through the levels. In this drawing, a first electrode pillar 171*a* includes a central conductive core 170*a* made, for example, of tungsten or other suitable electrode material, surrounded by a polysilicon sheath 172*a*. A layer 174*a* of anti-fuse material, or other programmable memory material, is formed between the polysilicon sheath 172*a* and the plurality of levels 160-1 through 160-4. The levels 160-1 through 160-4 comprise a relatively highly doped, n-type polysilicon in this example, while the polysilicon sheath 172*a* comprises a relatively lightly doped, p-type polysilicon. Preferably, the thickness of the polysilicon sheath 172*a* is greater than the depth of the depletion region formed by the p-n junction. The depth of the depletion region is determined in part by the relative doping concentrations of the n-type and p-type polysilicon used to form it. The levels 160-1 through 160-4 and the sheath 172*a* can be implemented using amorphous silicon as well. Also, other semiconductor materials could be utilized.

The first electrode pillar 171*a* is coupled to the pad 152*a*. A second electrode pillar 171*b* including conductive core 170*b*, polysilicon sheath 172*b*, and anti-fuse material layer 174*b* is coupled to the pad 152*b*.

Interface regions between the plurality of levels 160-1 through 160-4 and the pillars 171*a*, 171*b* include memory elements comprising a programmable element in series with a rectifier, as explained in more detail below.

In the native state, the layer 174*a* of anti-fuse material of pillar 171*a*, which can be a silicon dioxide, silicon oxynitride, or other silicon oxide, has a high resistance. Other anti-fuse materials may be used, such as silicon nitride. After programming by applying appropriate voltages to the word lines 140, bit lines 150, and the plurality of levels 160-1 to 160-4, the layer 174*a* of anti-fuse material breaks down and an active area within the anti-fuse material adjacent a corresponding level assumes a low resistance state.

As shown in FIG. 3A, the plurality of conductive layers of levels 160-1 to 160-4 extend into the periphery region 120 where supporting circuitry and conductors 180 are made to the plurality levels 160-1 to 160-4. A wide variety of devices are implemented in the periphery 120 to support decoding logic and other circuits on the integrated circuit 100.

The conductors 180 are arranged within the interconnect structure 190 to contact landing areas on the various levels 160-1 to 160-4. As discussed in more detail below, the conductors 180 for each particular level 160-1 to 160-4 extend through openings in the overlying levels to a wiring layer including conductive interconnect lines 185. The conductive interconnect lines 185 provide for interconnection between the levels 160-1 to 160-4 and decoding circuitry in the periphery 120.

As represented by the dashed line in FIG. 3A, the conductors 180 contacting the different levels 160-1 to 160-4 are arranged in the longitudinal direction extending into and out of the cross-section illustrated in FIG. 3A.

Figure 3B:
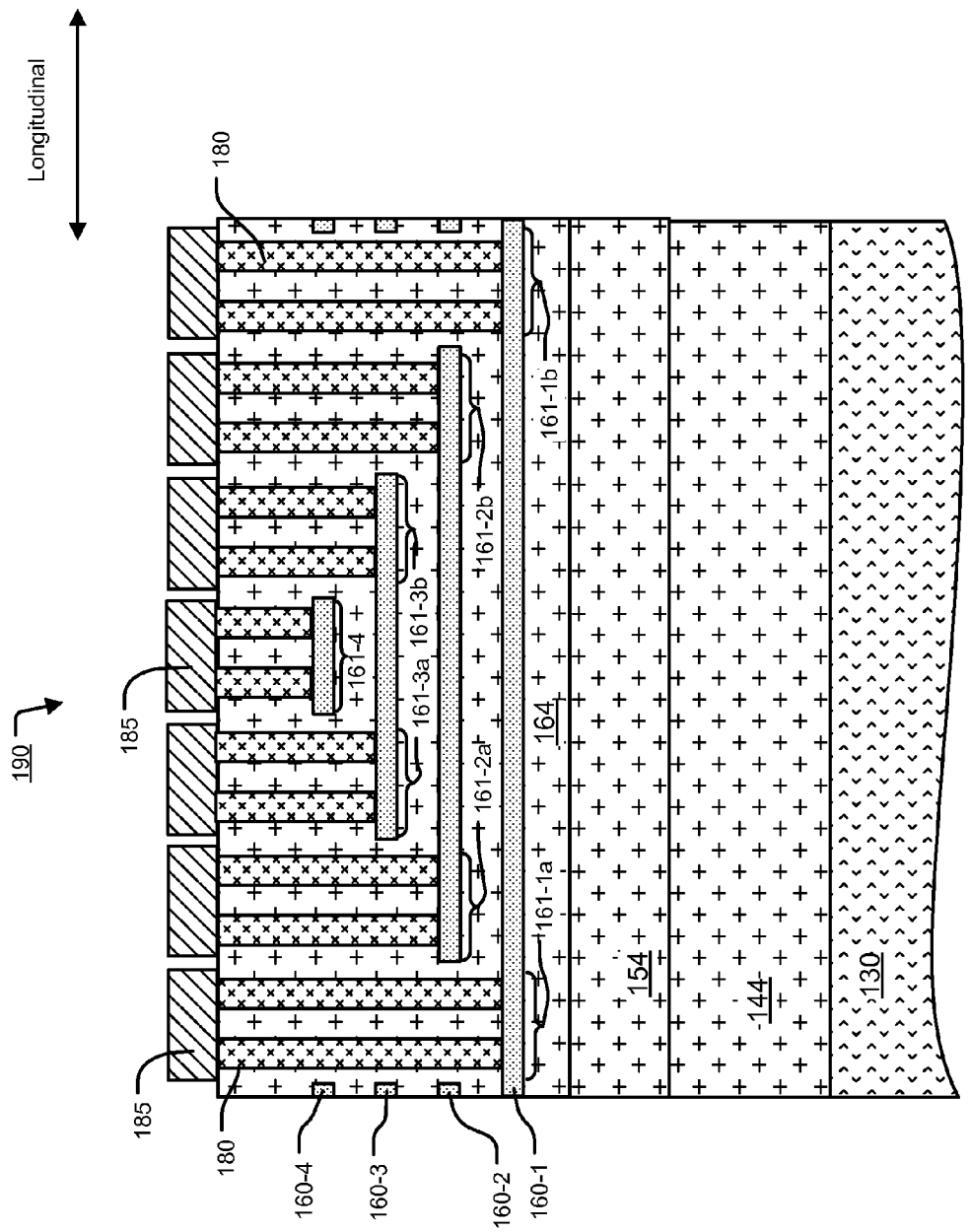

FIG. 3B is a cross-sectional view in the longitudinal direction taken along line FIG. 3B-FIG. 3B through the interconnect structure 190 of FIG. 3A, showing a view of the interconnect structure 190 like that shown in FIG. 1. As can be seen in FIG. 3B, the conductors 180 for each particular level extend through openings in the overlying levels to contact the landing areas.

In the illustrated example, four levels 160-1 through 160-4 are shown. More generally, the small interconnect structure described herein can be implemented in levels 0 to N, where N is at least 2.

Other types of memory cells and configurations can be used in alternative embodiments. For example, in an alternative the levels of the device may be implemented as planar memory cell arrays separated by insulating material, with the access devices and access lines formed within the levels using thin film transistors or related technologies. In addition, the interconnect structure described herein can be implemented in other types of three-dimensional stacked integrated circuit devices, where having conductors extending to various levels in the device within a small footprint is useful.

Figure 4:
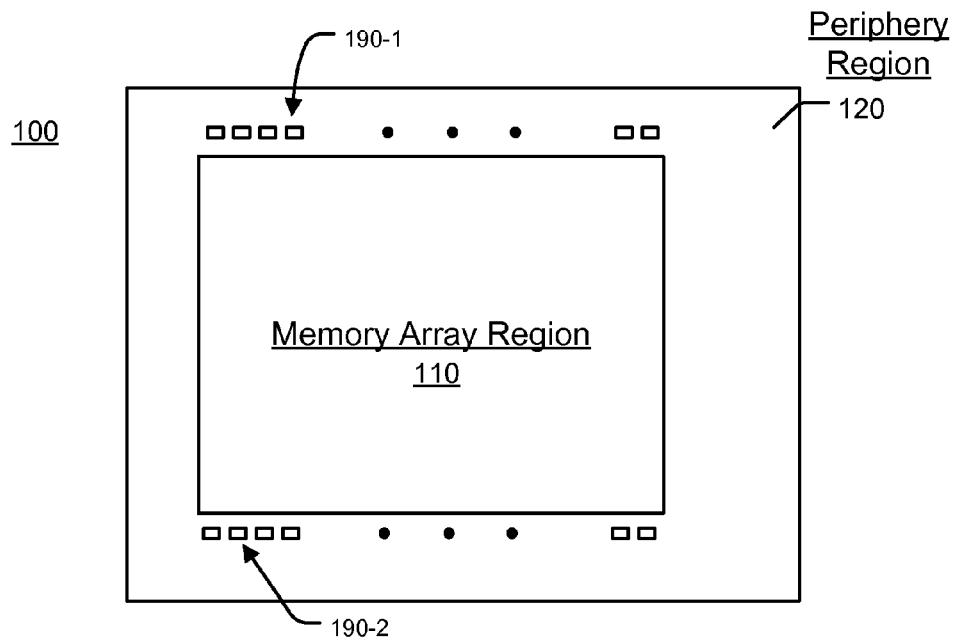
Figure 5:
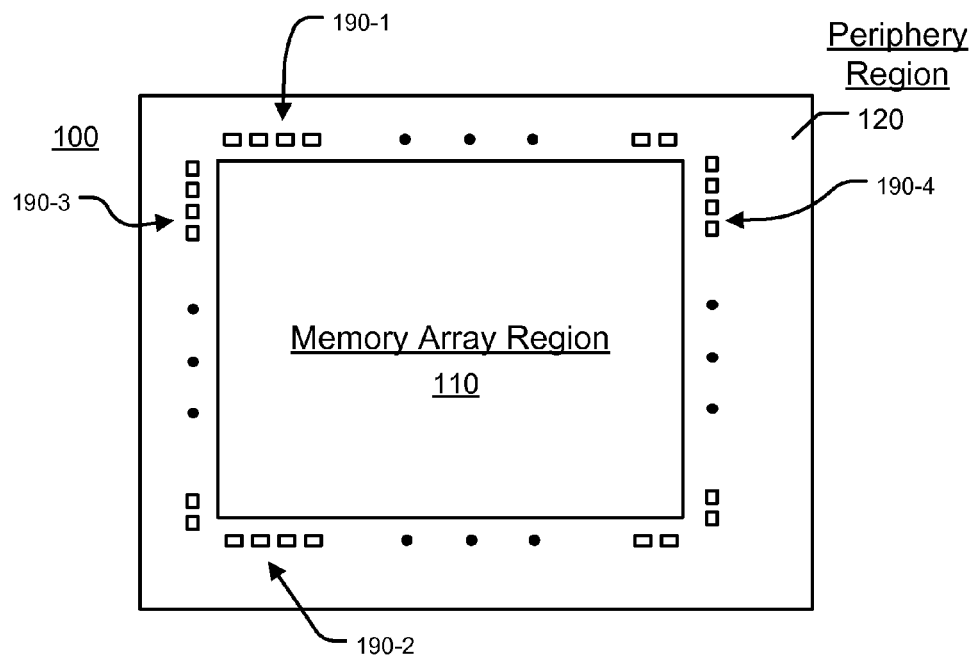

In FIGS. 3A-3B, a single interconnect structure 190 is shown. A plurality of interconnect structures can be arranged at various locations in the device, such as surrounding the memory array region 110, so as to provide more even power distribution. FIG. 4 illustrates a top view layout of an embodiment of the device 100 which includes a two series of interconnect structures, including series in the regions 190-1 and 190-2 in the periphery 120 on respective sides of an array. FIG. 5 illustrates a top view layout of an embodiment which includes four series of interconnect structures, including series 190-1, 190-2, 190-3, and 190-4, in the periphery 120 on all four sides of an array. For an example array size including 1000 columns and 1000 rows of cells, and having 10 levels, with a feature size F defining the word line width and the bit line width, and in which the size of the landing areas on the levels is about F, then one can see that the length of the area occupied by one interconnect structure is about 2F times the number of levels or 20F, while the pitch per word line is about 2F or more making the width of the array about 2000 F. Thus, following this example, about 100 interconnect structures could be formed in a series such as series 190-3 along the array width, and a similar number could be formed in a series such as series 190-1 along the array length.

In yet other alternative embodiments, one or more interconnect structures can be implemented within the memory array region 110 in addition to, or as a replacement of, having an interconnect structure in the periphery 120. In addition, the interconnect structures can extend diagonally or in any other direction, rather than being parallel to an edge of the memory array region 110.

Figure 6:
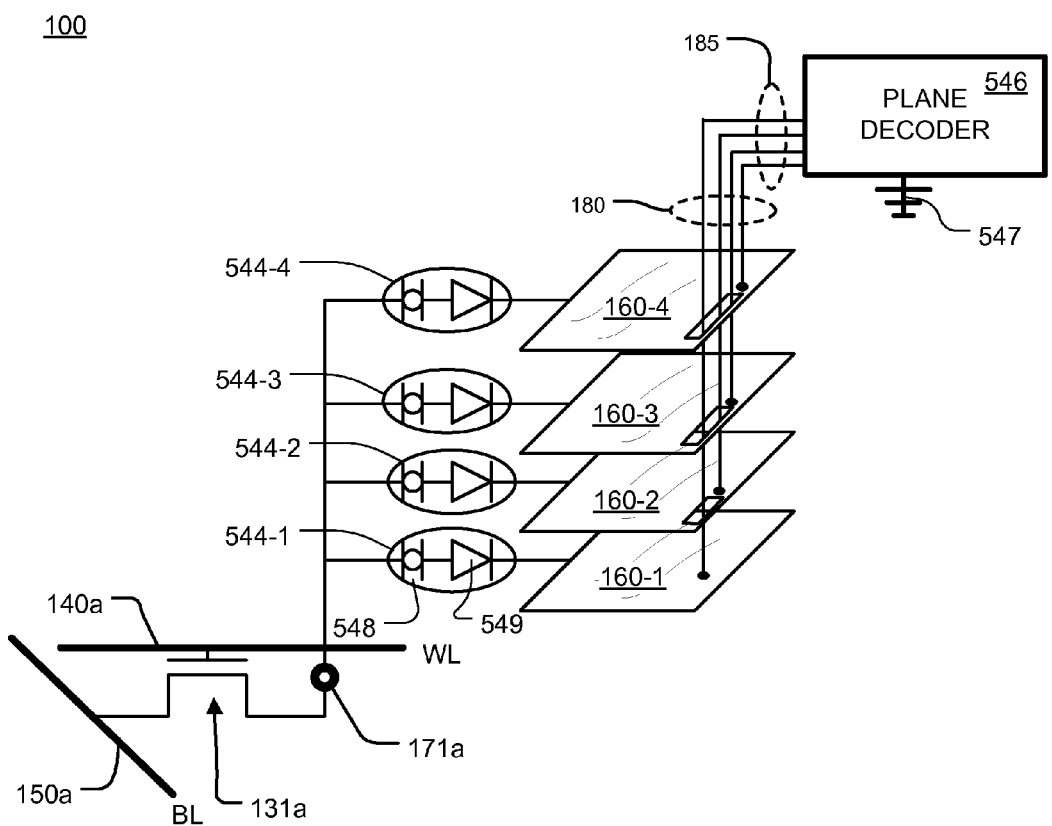

FIG. 6 is a schematic illustration of a portion of the memory device including an interconnect structure as described herein. First electrode pillar 171a is coupled to the access transistor 131a which is selected using the bit line 150a and word line 140a. A plurality of memory elements 544-1 through 544-4 are connected to the pillar 171a. Each of the memory elements includes a programmable element 548 in series with a rectifier 549. This series arrangement represents the structure shown in FIGS. 3A-3B, even though the layer of anti-fuse material is placed at the p-n junction. The programmable element 548 is represented by a symbol often used to indicate anti-fuses. However, it will be understood that other types of programmable resistance materials and structures can be utilized.

Also, the rectifier 549 implemented by the p-n junction between the conductive plane and the polysilicon in the electrode pillar can be replaced by other rectifiers. For example, a rectifier based on a solid electrolyte like germanium silicide, or other suitable material, could be used to provide a rectifier. See U.S. Pat. No. 7,382,647 for other representative solid electrolyte materials.

Each of the memory elements 544-1 through 544-4 is coupled to corresponding conductive levels 160-1 through 160-4. The levels 160-1 to 160-4 are coupled via conductors 180 and interconnect lines 185 to a plane decoder 546. The plane decoder 546 is responsive to addresses to apply a voltage, such as ground 547, to a selected level so that the rectifier in the memory element is forward biased and conducting, and to apply a voltage to or float unselected levels so that the rectifier in the memory element is reversed biased or non-conducting.

Figure 7:
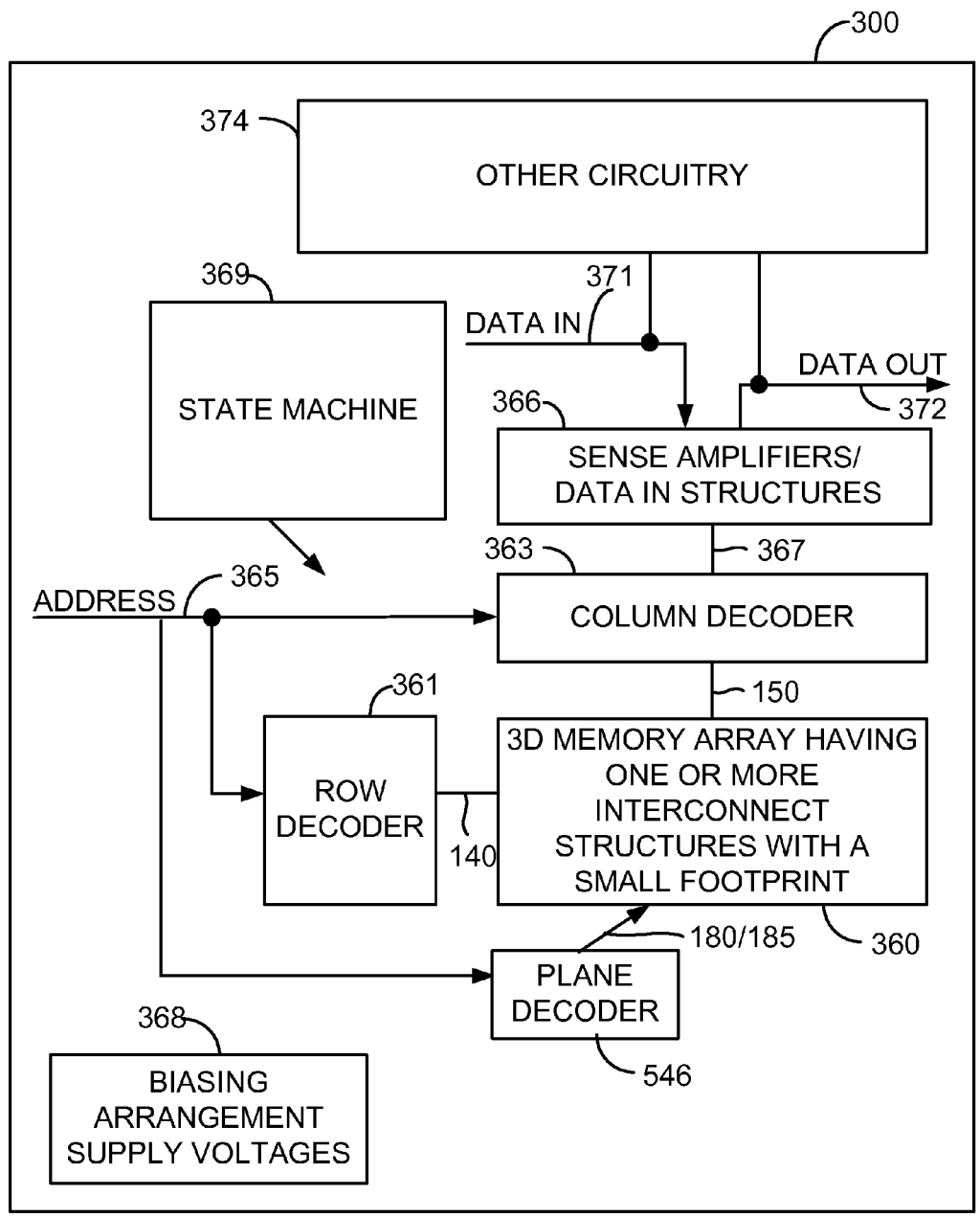

FIG. 7 is a simplified block diagram of an integrated circuit device 300 including a 3D memory array 360 having an interconnect structure as described herein. A row decoder 361 is coupled to a plurality of word lines 140 arranged along rows in the memory array 360. A column decoder 363 is coupled to a plurality of bit lines 150 arranged along columns in the memory array 360 for reading and programming data from the memory cells in the array 360. The plane decoder 546 is coupled to a plurality of levels 160-1 to 160-4 in the memory array 360 via conductors 180 and interconnect lines 185. Addresses are supplied on bus 365 to column decoder 363, row decoder 361, and plane decoder 546. Sense amplifiers and data-in structures in block 366 are coupled to the column decoder 363 in this example via data bus 367. Data is supplied via the data-in line 371 from input/output ports on the integrated circuit 300, to the data-in structures in block 366. In the illustrated embodiment, other circuitry 374 is included on the integrated circuit 300, such as a general purpose processor or special purpose application circuitry, or a combination of modules providing system-on-a-chip functionality. Data is supplied via data-out line 372 from the sense amplifiers in block 366 to input/output ports on the integrated circuit 300, or to other data destinations internal or external to the integrated circuit 300.

A controller implemented in this example using bias arrangement state machine 369 controls the application of bias arrangement supply voltages generated or provided through the voltage supply or supplies in block 368, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

FIGS. 8A-8C to 15 illustrate steps in an embodiment of a fabrication sequence for manufacturing an interconnect structure having a very small footprint as described herein.

Figure 8B:
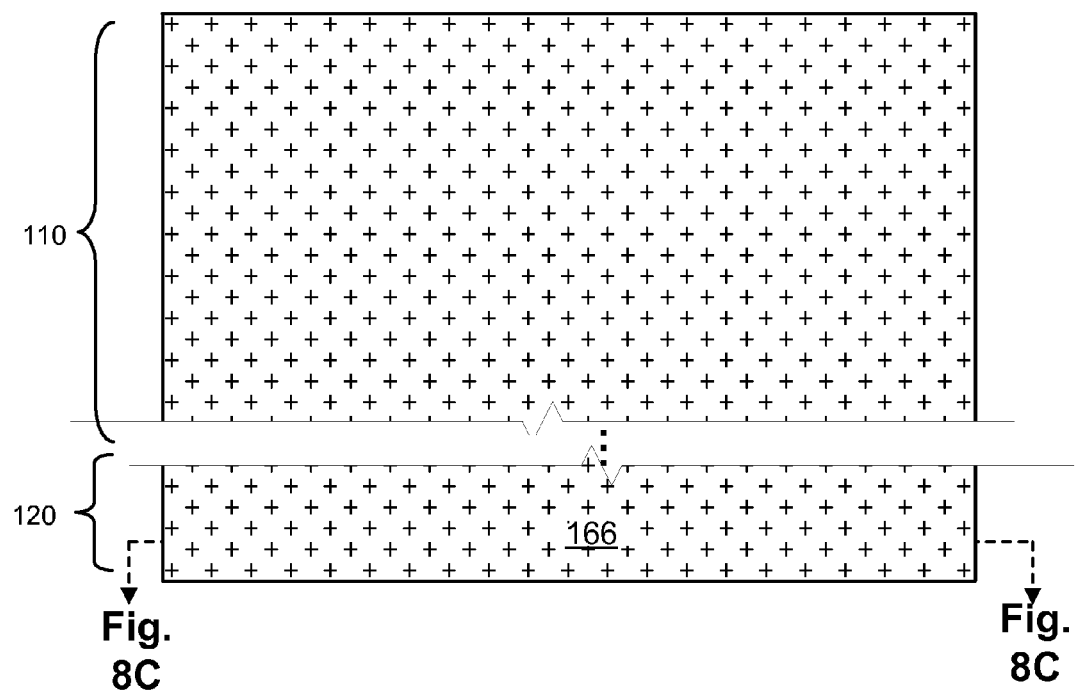
Figure 8C:
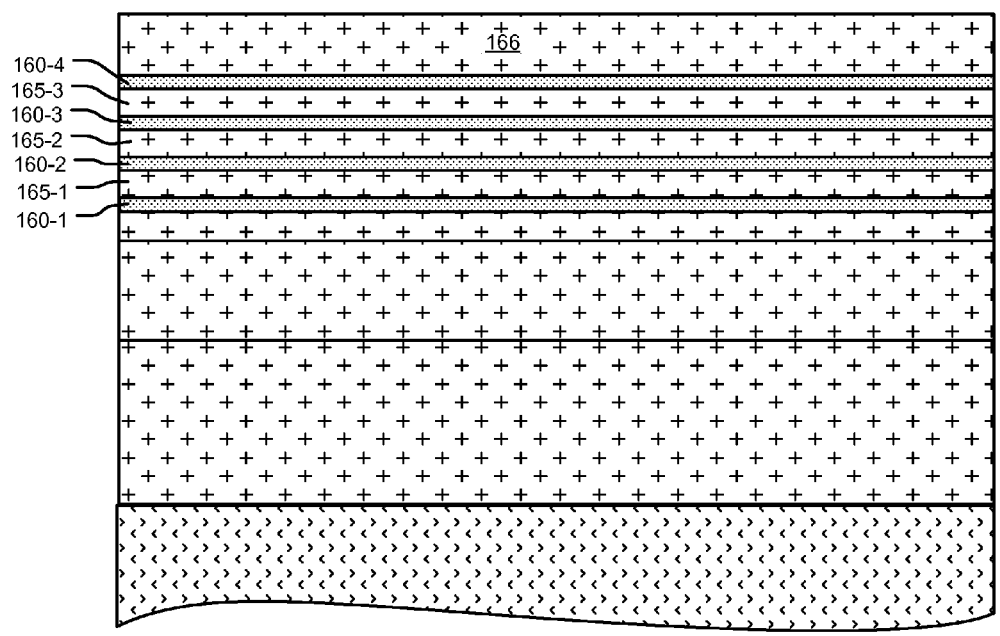

FIGS. 8A and 8C illustrate cross-sectional views, and FIG. 8B illustrates a top view, of a first step of the fabrication sequence. For the purposes of this application, the first step involves forming a plurality of levels 160-1 to 160-4 overlying the provided memory cell access layer 112. In the illustrated embodiment the structure illustrated in FIGS. 8A-8C is formed using processes described in commonly owned U.S. patent application Ser. No. 12/430,290 by Lung, which was incorporated by reference above.

In alternative embodiments, the levels can be formed by standard processes as known in the art and may include access devices such as transistors and diodes, word lines, bit lines and source lines, conductive plugs, and doped regions within a substrate, depending upon the device in which the interconnect structure described herein is to be implemented.

As noted above, other types of memory cells and configurations for the memory array region 110 can also be used in alternative embodiments.

Figure 9A:
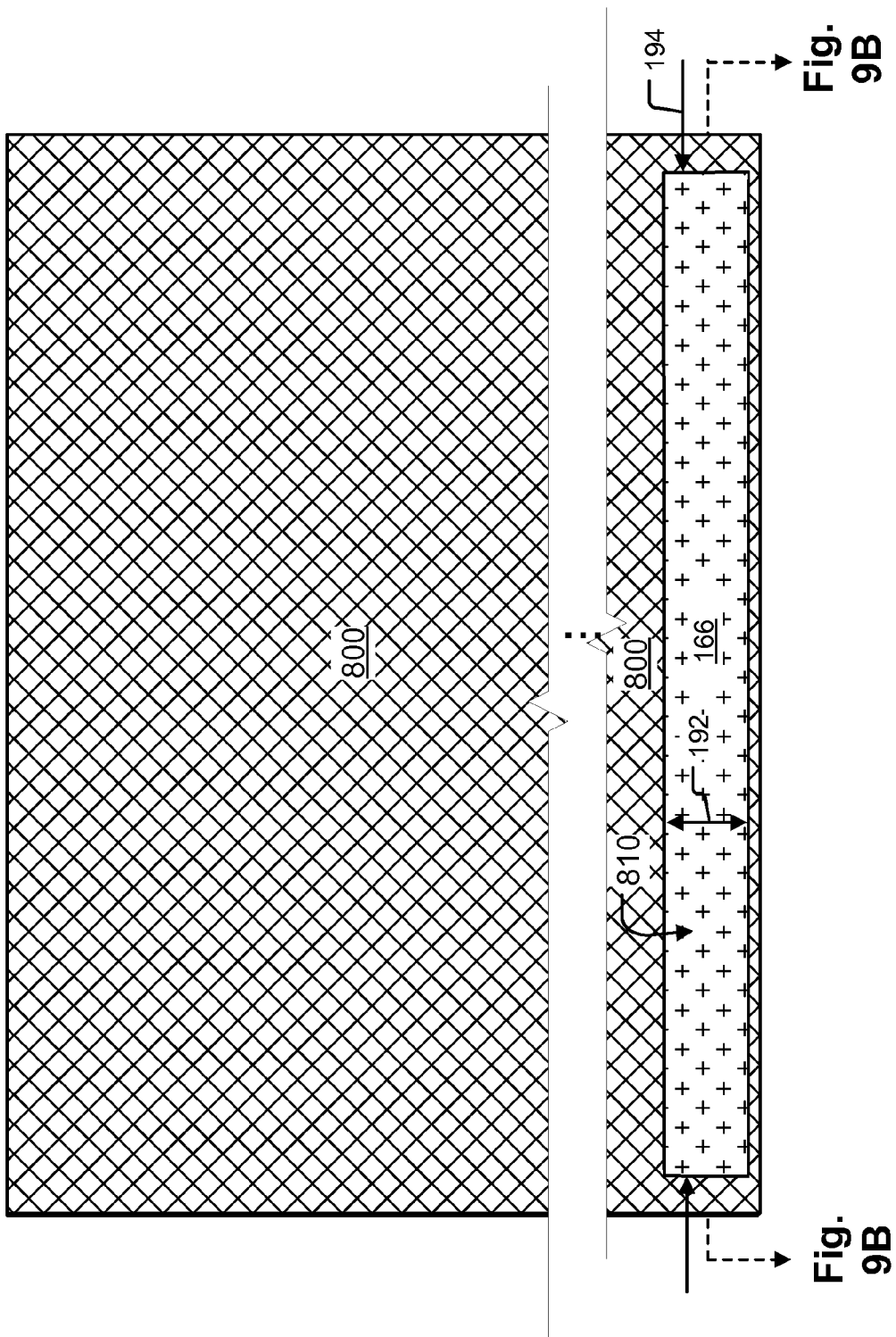
Figure 9B:
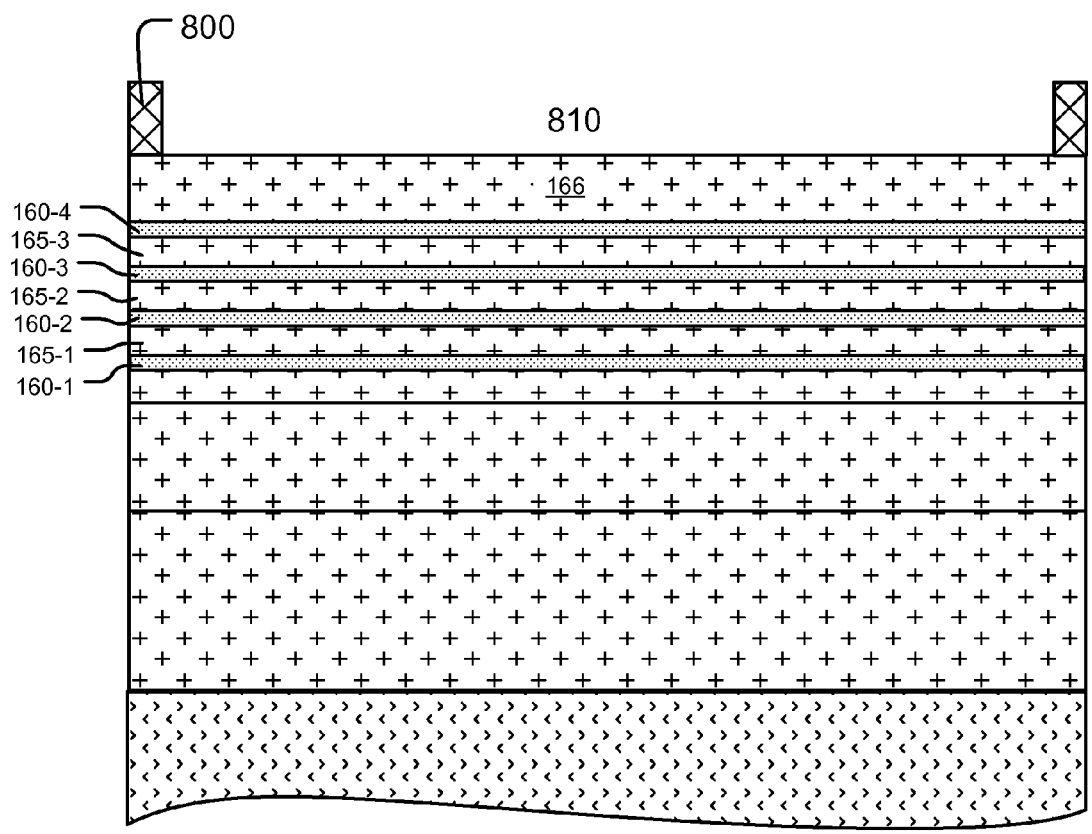

Next, a first mask 800 having an opening 810 is formed on the structure illustrated in FIGS. 8A-8C, resulting in the structure illustrated in the top and cross-sectional views of FIGS. 9A and 9B respectively. The first mask 800 can be formed by depositing the layer for the first mask 800, and patterning the layer using lithographic techniques to form the opening 810. The first mask 800 may comprise, for example, a hard mask material such as silicon nitride, silicon oxide, or silicon oxynitride.

The opening 810 in the first mask 800 surrounds the perimeter of the combination of landing areas on the levels 160-1 to 160-4. Thus, the width 192 of the opening 810 is at least as large as the widths of the landing areas on the levels 160-1 to 160-4, so that the subsequently formed conductors 180 can pass through the openings in the levels. The length 194 of the opening 810 is at least as large as the sum of the lengths of the landing areas on the levels 160-1 to 160-4, so that the subsequently formed conductors 180 can pass through the openings in the levels.

Figure 10A:
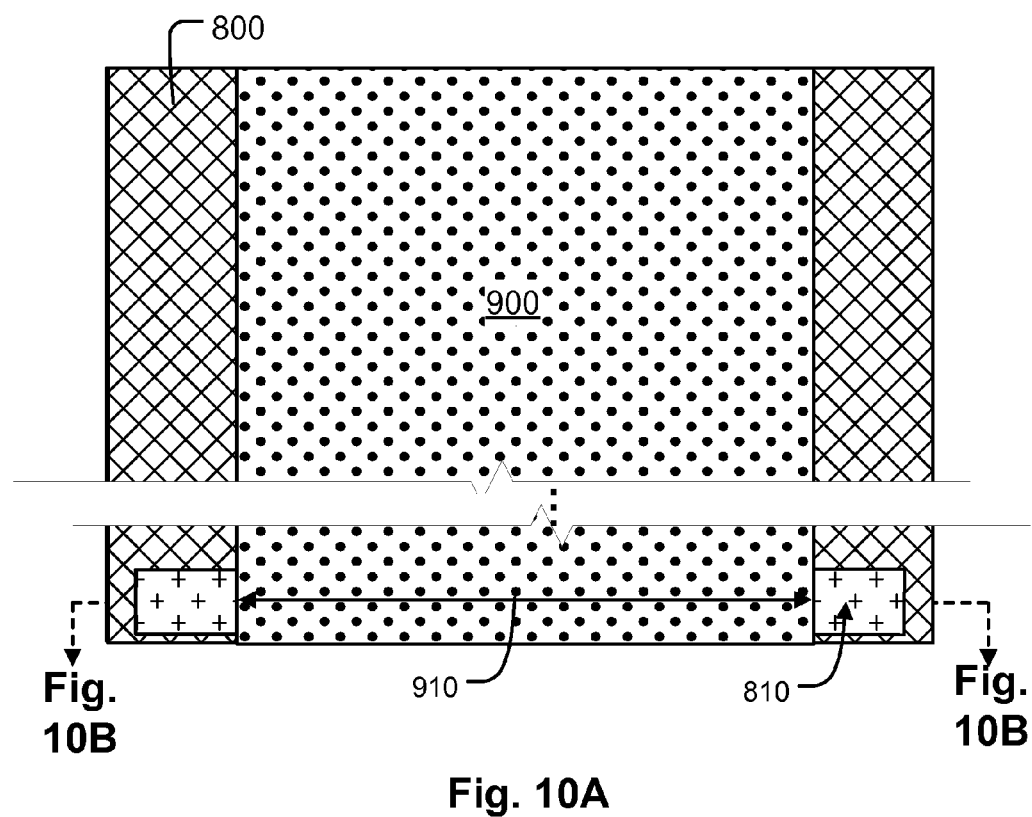
Figure 10B:
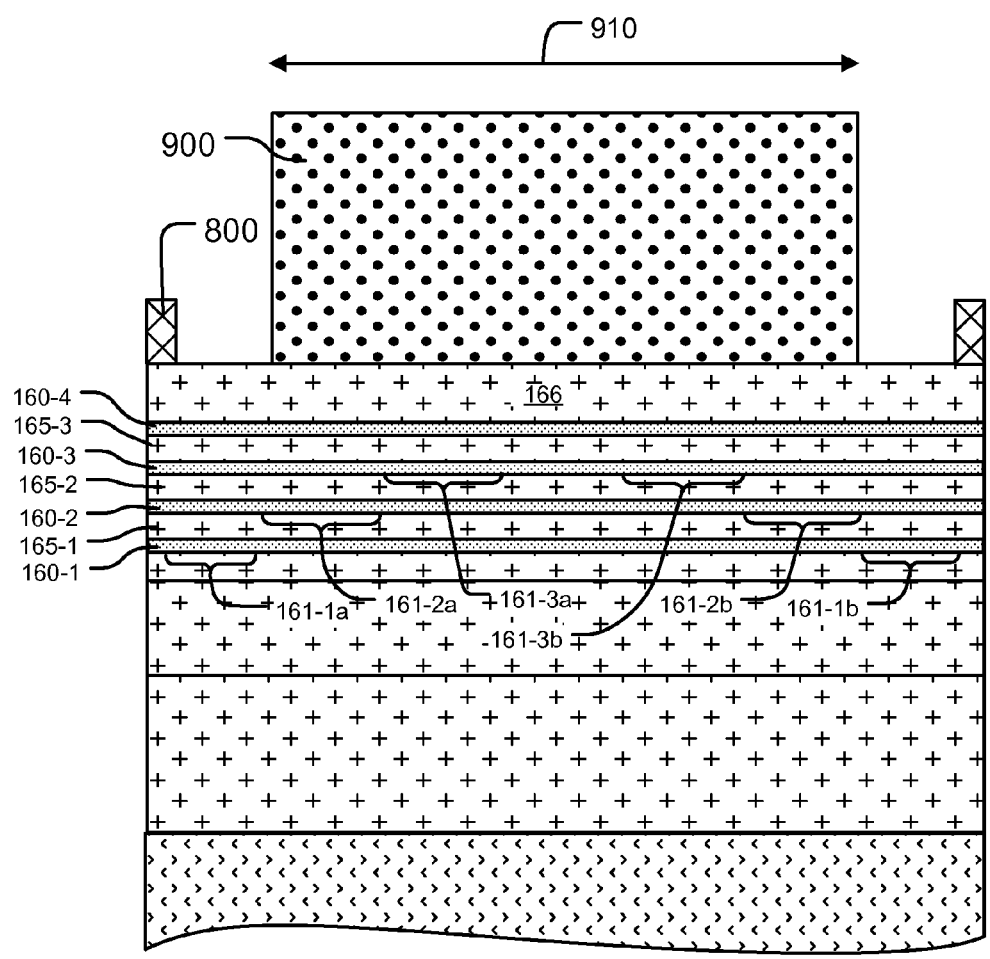

Next, a second etch mask 900 is formed on the structure illustrated in FIGS. 9A-9B, including within the opening 810, resulting in the structure illustrated in the top and cross-sectional views of FIGS. 10A and 10B respectively. As shown in the figures, the second etch mask 900 has a length 910 less than the length 194 of the opening 810, and has a width at least as large as the width 192 of the opening 810.

In the illustrated embodiment, the second etch mask 900 comprises a material that can be selectively etched relative to the material of the first mask 800, so that the length of the second mask 900 within the opening 810 can be selectively reduced in subsequent process steps described below. In other words, the material of the second mask 900 has an etching rate greater than an etching rate of the material of the first mask 800 for the process used to reduce the length of the second mask 900. For example, in embodiments in which the first mask 800 comprises a hard mask material, the second mask can comprise photoresist.

Figure 11A:
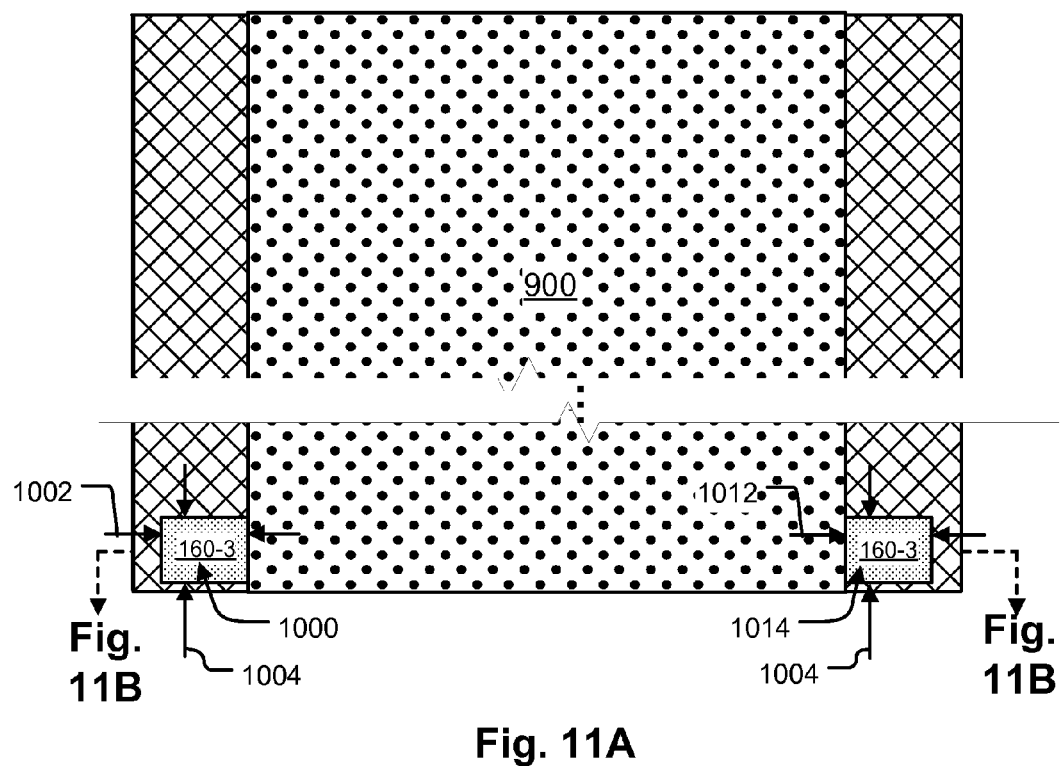
Figure 11B:
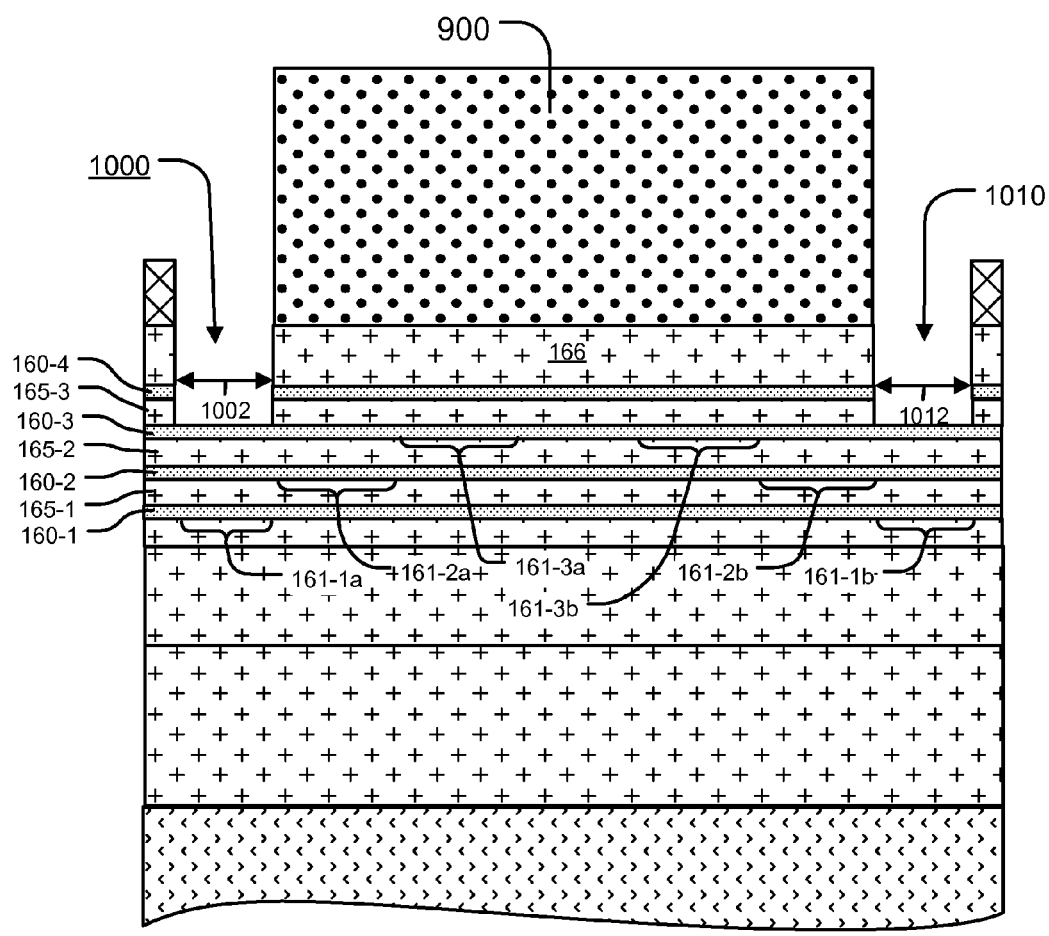

Next, an etching process is performed on the structure illustrated in FIGS. 10A-10B using the first and second masks 800, 900 as etch masks, resulting in the structure illustrated in the top and cross-sectional views of FIGS. 11A and 11B respectively. The etching process can be carried out using a single etch chemistry using, for example, timing mode etching. Alternatively, the etching process can be carried out using different etch chemistries to individually etch through insulating layer 166, level 160-4, insulating material 165-3, and level 160-3.

The etching forms an opening 1000 through the level 160-4 to expose a portion of level 160-3. The opening 1000 overlies the landing area 161-1a on level 160-1. The opening 1000 has a length 1002 at least as large as the length of the landing area 161-1a, and has a width 1004 at least as large as the width of the landing area 161-1a.

The etching also forms opening 1010 through the level 160-4 to expose a portion of level 160-3. The opening 1010 overlies the landing area 161-1b on level 160-1. The opening 1010 has a length 1012 at least as large as the length of the landing area 161-1b, and has a width 1004 at least as large as the width of the landing area 161-1b Next, the length 910 of the mask 900 is reduced to form reduced length mask 1100 with length 1110, resulting in the structure illustrated in the top and cross-sectional views of FIGS. 12A and 12B respectively. In the illustrated embodiment the mask 900 comprises photoresist, and can be trimmed, for example, using reactive ion etching with CL2 or HBr based chemistries.

Figure 12A:
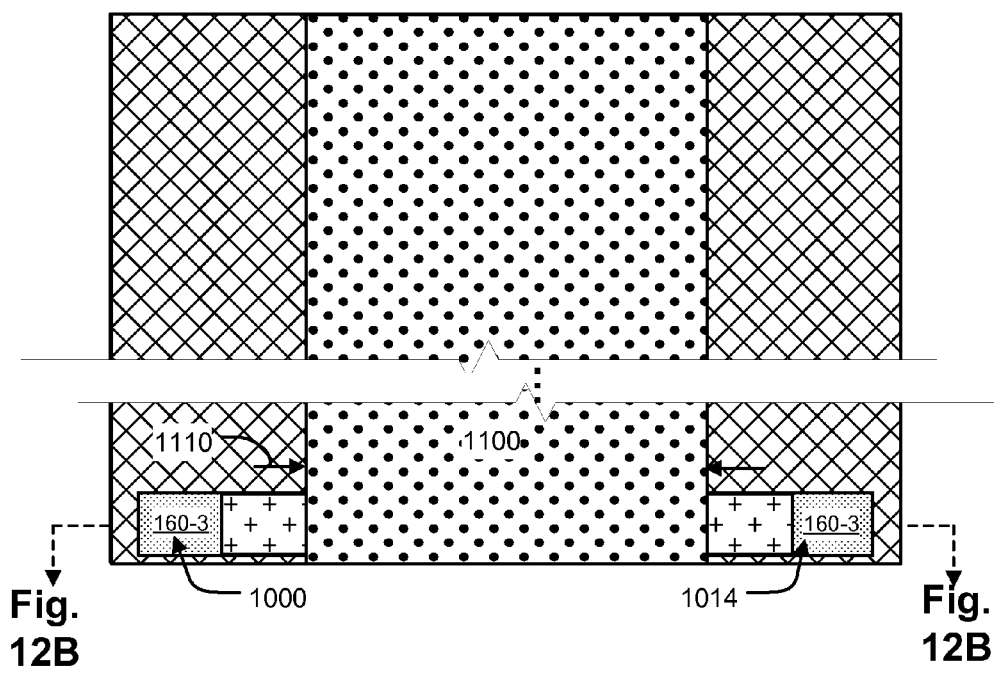
Figure 12B:
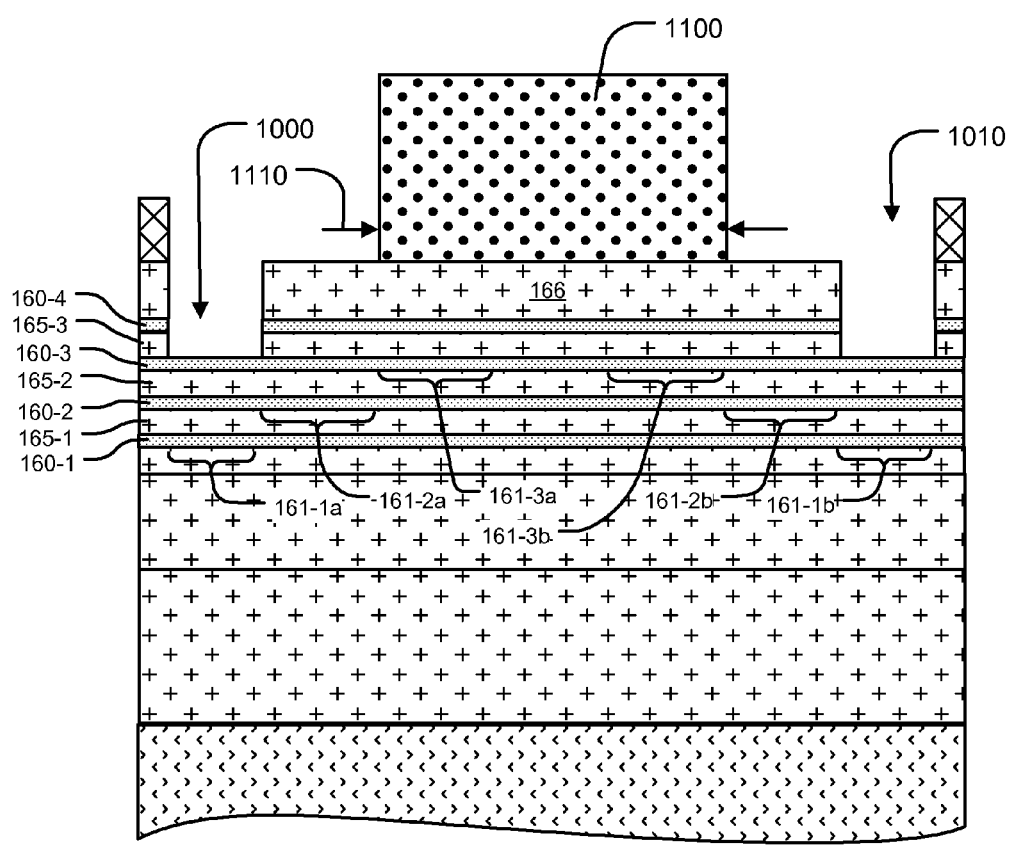
Figure 13A:
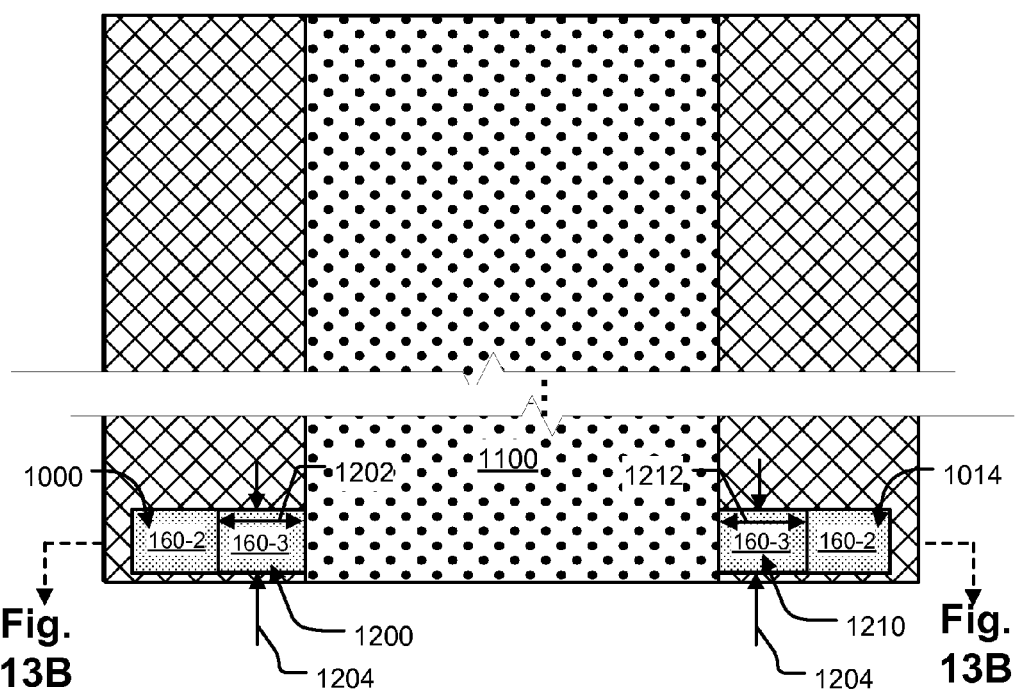
Figure 13B:
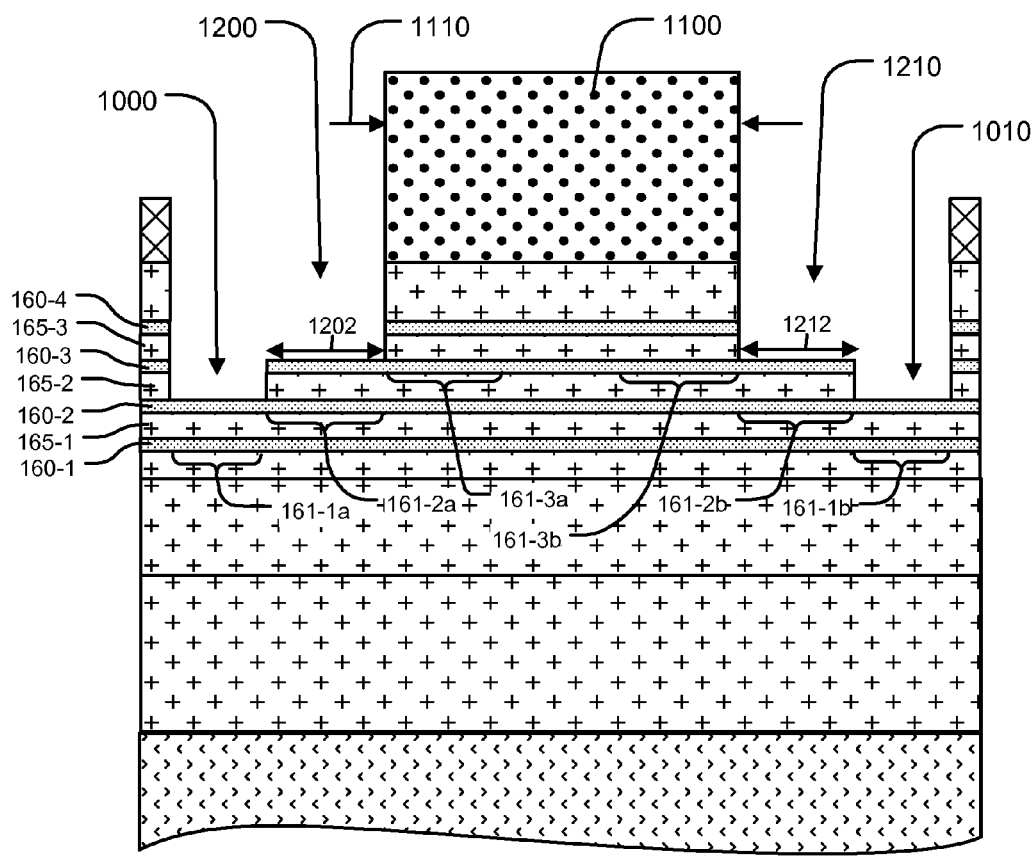

Next, an etching process is performed on the structure illustrated in FIGS. 12A-12B using the first mask 800 and the reduced length mask 1100 as etch masks, resulting in the structure illustrated in the top and cross-sectional views of FIGS. 13A and 13B.

The etching process extends the openings 1000, 1010 through level 160-3 to expose underlying portions of the level 160-2.

The etching also forms openings 1200, 1210 through the portions of the level 160-4 no longer covered by the mask 1100 due to the reduction in the length of mask 1100, thereby exposing portions of level 160-3. The opening 1200 is formed adjacent opening 1000, and overlies the landing area 161-2a on level 160-2. The opening 1200 has a length 1202 at least as large as the length of the landing area 161-2a, and has a width 1204 at least as large as the width of the landing area 161-2a.

The opening 1210 is formed adjacent opening 1010, and overlies the landing area 161-2b on level 160-2. The opening 1210 has a length 1212 at least as large as the length of the landing area 161-2b, and has a width 1204 at least as large as the width of the landing area 161-2b.

Next, the length 1110 of the mask 1100 is reduced to form reduced length mask 1300 with length 1305. An etching process performed using the first mask 800 and the mask 1300 as etch masks, resulting in the structure illustrated in the top and cross-sectional views of FIGS. 14A and 14B.

The etching process extends the openings 1000, 1010 through level 160-2 to expose the landing areas 161-1a, 161-1b on level 160-1. The etching process also extends the openings 1200, 1210 through level 160-3 to expose the landing areas 161-2a, 161-2b on level 160-2.

The etching also forms openings 1310, 1320 through the portions of the level 160-4 no longer covered due to the reduction in the length of mask 1300, thereby exposing the landing areas 161-3a, 161-3b on level 160-3.

The opening 1310 is formed adjacent opening 1200. The opening 1310 has a length 1312 at least as large as the length of the landing area 161-3a, and has a width 1314 at least as large as the width of the landing area 161-3a.

The opening 1320 is formed adjacent opening 1210. The opening 1320 has a length 1322 at least as large as the length of the landing area 161-3b, and has a width 1324 at least as large as the width of the landing area 161-3b.

Figure 14A:
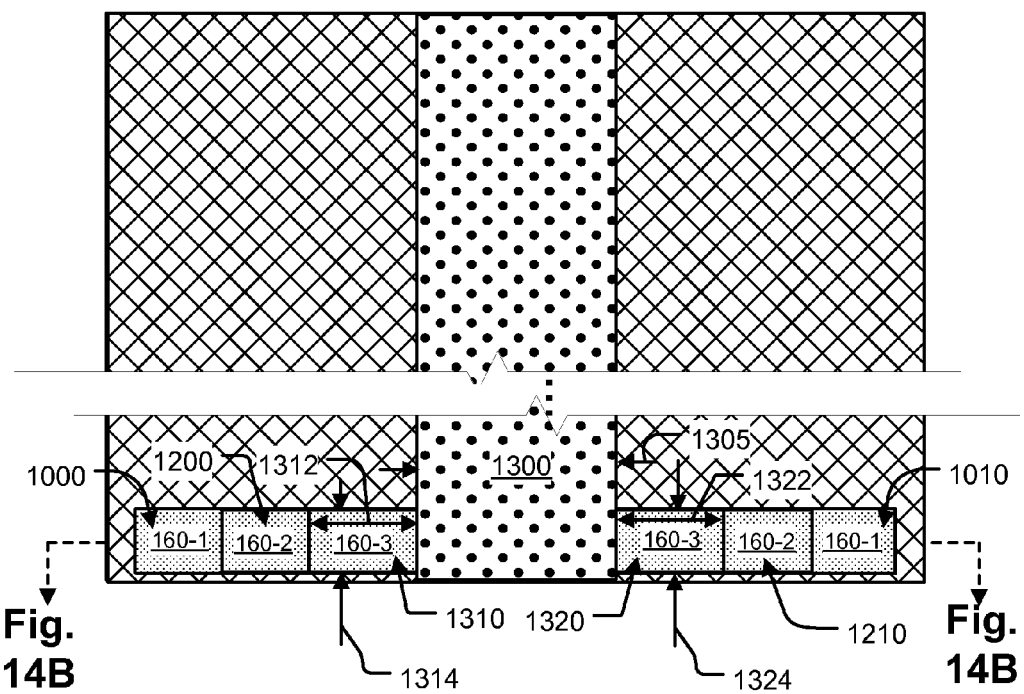
Figure 14B:
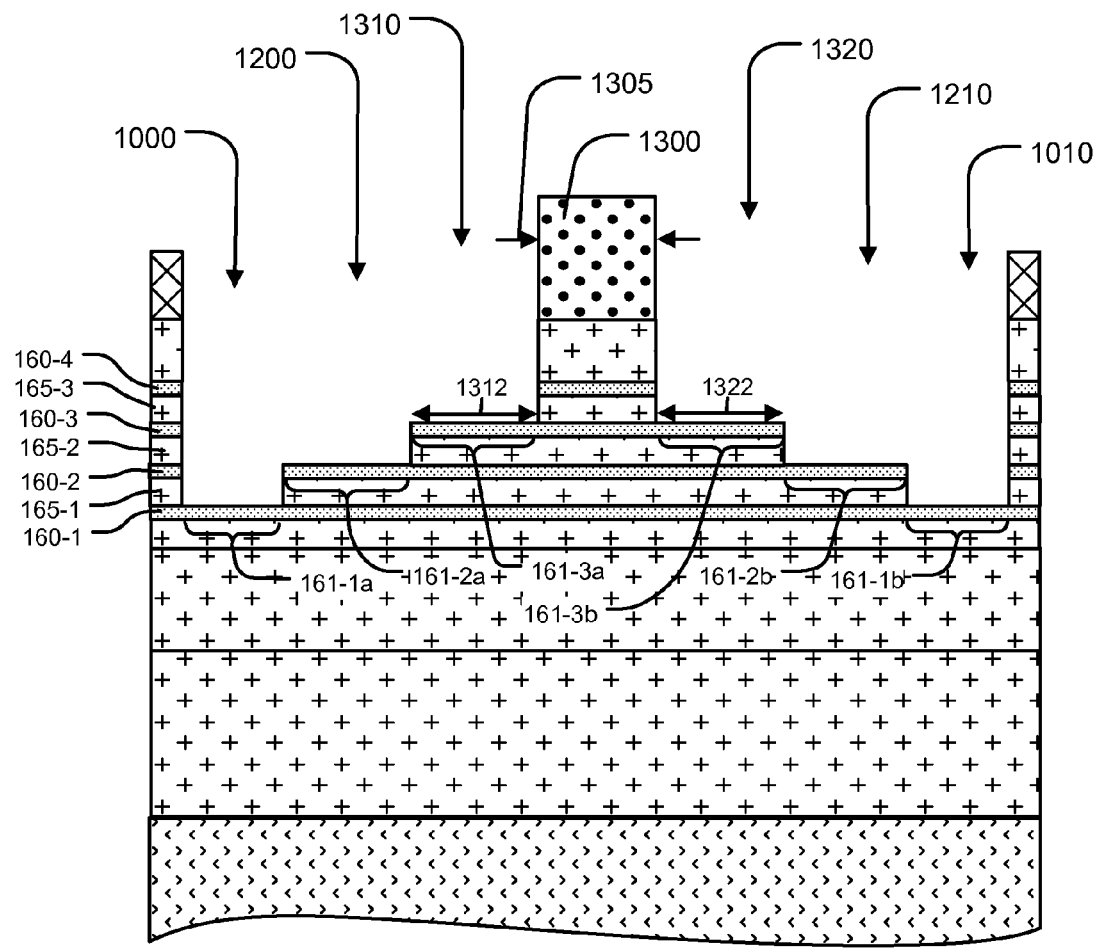
Figure 15:
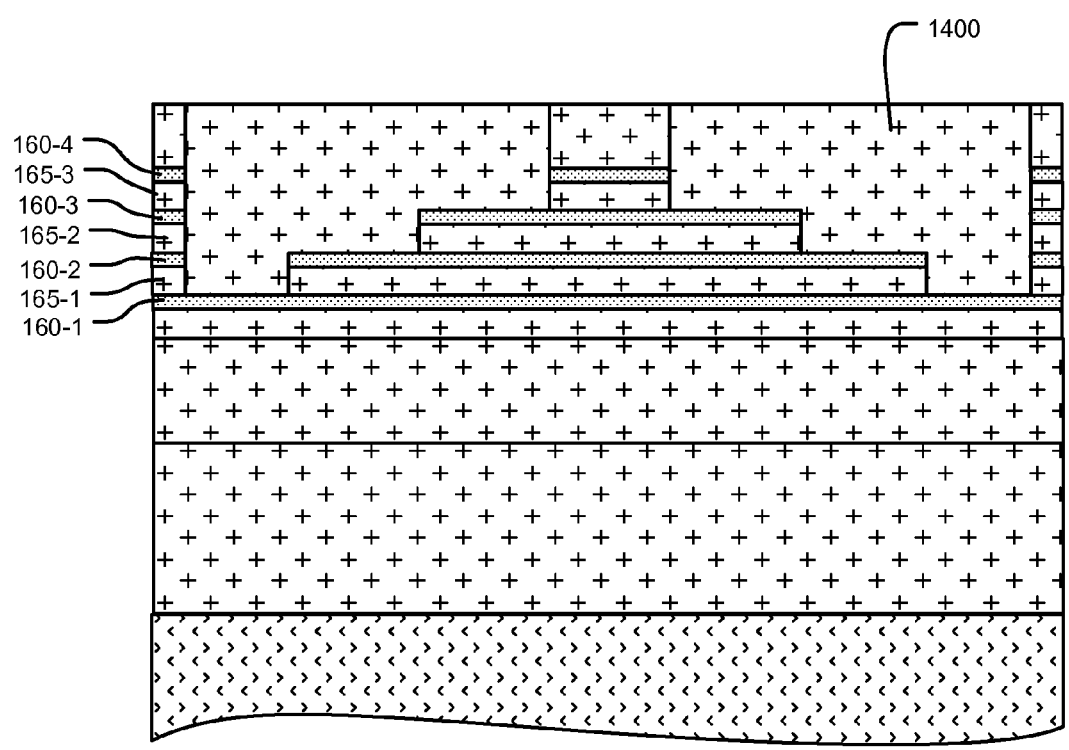

Next, insulating fill material 1400 is deposited on the structure illustrated in FIGS. 14A-14B and a planarization process such as Chemical Mechanical Polishing (CMP) is performed to remove the masks 800, 1300, resulting in the structure illustrated in the cross-sectional view of FIG. 15.

Next, a lithographic pattern is formed to define vias to the landing areas for the conductors 180. Reactive ion etching can be applied to form deep, high aspect ratio vias through the insulating fill material 1400 to provide vias for the conductors 180. After opening the vias, the vias are filled with tungsten or other conductive material to form the conductors 180. Metallization processes are then applied to form interconnect lines 185 to provide interconnection between the conductors 180 and plane decoding circuitry on the device. Finally, back end of line BEOL processes are applied to complete the integrated circuit, resulting in the structure illustrated in FIGS. 3A-3B.

The openings in the various levels used for passing conductors to the landing areas on underlying levels are formed by patterning the levels using the opening 810 in the single etch mask 800, as well as processes for etching the additional mask without a critical alignment step. As a result the openings in the various levels having vertically aligned sidewalls are formed in a self-aligned manner.

In the illustrated examples described above, the opening 810 in the mask 800 has a rectangular cross-section in plan view. As a result, the openings in the various levels have substantially the same width along the transverse direction. Alternatively, the opening in the mask 800 can have a cross-section that is circular, elliptical, square, rectangular, or somewhat irregularly shaped, depending on the shape of the landings areas of the various levels.

Figure 16:
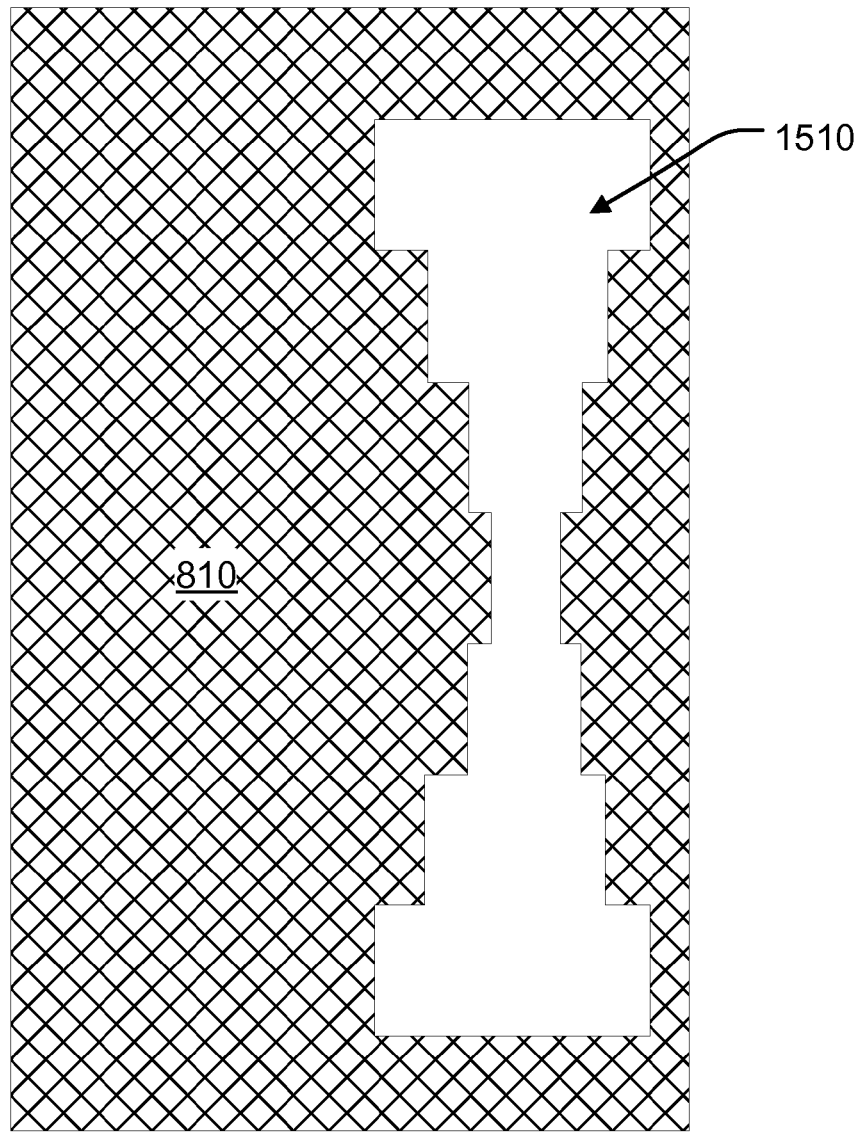

For example, the width of the opening in the mask 800 can vary along the longitudinal direction, in order to accommodate landing areas having different widths. FIG. 16 illustrates a plan view of an opening 1510 in the mask 800 having a width varying in the longitudinal direction in a step-like manner, which results in the widths of the openings in the levels varying accordingly.

The present invention will now be described primarily with reference to FIGS. 17-47.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 17 is a simplified flowchart for a method 10 for creating interconnect contact regions 14 according to the present invention. The interconnect contact region creating method 10 of FIG. 17 includes obtaining a set of N masks at obtaining step 12. Further steps in the method 10 shown in FIG. 17 will be discussed below in conjunction with FIGS. 18-27, which illustrate a first example of a method for carrying out the present invention.

The set of N masks are used to create up to 2N levels of interconnect contact regions 14, see FIG. 27, at the stack 16 of contact levels 18.1, 18.2, 18.3, 18.4, the stack 16 being at the interconnect region 17 of a three-dimensional stacked IC device. The interconnect region 17 will typically be a peripheral interconnect region, such as shown in FIGS. 4 and 5, but may be located elsewhere. In the three examples of FIGS. 18-44, four contact levels are shown on a substrate 19 for simplicity of illustration; three-dimensional stacked IC devices will commonly have many more contact levels. As will be discussed below, each mask comprises mask and etch regions, N is an integer equal to at least 2, and x is a sequence number for the masks so that for one mask x=1, for another mask x=2, and so forth through x=N. When x=1, the etching step for the associated mask will etch one contact level 18, when x=2, the etching step for the associated mask will etch two contact levels, etc.

Next, a portion removing step 20, see FIG. 17, is carried out to remove a portion 22, see FIG. 19, of an upper layer 24 overlying the stack 16 of contact levels 18. In this example, upper layer 24 includes first and second silicon oxide layers 26, 28 with a charge trapping layer 27, typically of silicon nitride, therebetween. In this example, this removal is accomplished using an additional mask 30 having an open region 32, see FIG. 18, to permit the etching of a portion 22 of upper layer 24 as shown in FIG. 19. In this example, contact levels 18 each include an upper conductive layer 34, typically a polysilicon layer patterned to form conductors such as word lines, and a lower insulating layer 36, typically a silicon oxide or silicon nitride compound. For ease of reference layer 34 will typically be referred to as polysilicon layer 34. However, layer 34 may be made of other appropriate materials, such as metals, metal silicides and multilayer combinations of more than one of polysilicon, metal silicides and metals. The etching through dielectric layer 28 of upper layer 24 is typically controlled by the use of material-selective etching processes. For example, when dielectric layer 28 is silicon oxide and layer 34 is polysilicon, using reactive ion etching to etch through dielectric layer 28, the etching is effectively stopped upon reaching layer 34. Similar techniques can be used to control the depth of etching in other situations. Other techniques for controlling the depth of etching may also be used. Additional mask 30 may not be considered a part of the set of N masks because it is used to simply open a space for etching of the stack 16 of contact levels 18. In the example discussed below with regard to FIGS. 28-34, any additional layer 24 is removed from the interconnect contact region using a blanket etch without the need for an additional mask.

FIG. 20 illustrates the formation of a first mask 38.1 on the stack 16 of contact levels 18 of FIG. 19. In this example, first mask 38.1 comprises photoresist mask elements 40.1, 40.2 and 40.3 with mask element 40.2 covering a central portion 42.1 of the first polysilicon layer 34.1 and mask element 40.3 covering an edge portion 42.2 of the first polysilicon layer 34.1. FIG. 21 illustrates the result of an etching step in which the portions of contact level 18.1 not covered by photoresist mask elements 40 are etched down to contact level 18.2. That is, one contact level 18 is etched in this first etching step.

FIG. 22 illustrates the formation of a second photoresist mask 38.2 on the stack 16 of contact levels 18 of FIG. 21. Mask 38.2 covers otherwise exposed portions of polysilicon layers 34.1 and 34.2 that are subsequently to be used as interconnect contact regions 14.1 and 14.2 as suggested by the dashed lead lines in FIG. 22. FIG. 23 shows the result of a second etching step in which two contact levels are etched. In particular, exposed surface portion 44 of polysilicon layer 34.2 is etched down two layers to expose a portion 46 of polysilicon layer 34.4. In addition, the exposed portion 42.3 of polysilicon layer 34.1 is also etched down two contact levels to expose a portion 47 polysilicon layer 34.3. FIG. 24 shows the result of removing second mask 38.2 leaving portions of the polysilicon layers 34.1, 34.2, 34.3 and 34.4 to act as interconnect contact regions 14.1, 14.2, 14.3 and 14.4. The thin column portion 48 of contact level 18.1, sometimes called a dummy stack or a partial height dummy stack, may be formed on purpose or as the result of manufacturing tolerances.

In the example of FIGS. 18-24, two masks 38.1, 38.2 were used to provide access to landing areas at four interconnect contact regions 14.1-14.4 at four different contact levels 18.1-18.4. According to the present invention, the interconnect region 17 is etched N times using N masks to create an interconnect contact region 14 at each of 2N contact levels 18. The interconnect contact regions 14 are aligned with and provide access to landing areas 56, discussed below with reference to FIG. 27, at each of the 2N contact levels. Each etching step comprises etching through 2x−1 contact levels for each mask of sequence number x. See interconnect region etch step 49 of FIG. 17.

FIG. 25 illustrates the result of the optional step of applying etch stop layer 50, such as a silicon nitride layer when the interlayer insulator is silicon oxide, over the exposed surfaces of the etched stack 16 of contact levels 18. Thereafter, an interlayer dielectric 52 is deposited on the structure of FIG. 25 as illustrated in FIG. 26 and by the etch regions fill step 53 of FIG. 17. This is followed by formation of electrical conductors 54 through the interlayer dielectric 52 and etch stop layer 50 to make electrical contact with the electrically conductive landing areas 56 at the interconnect contact regions 14. Conductors 54 may be formed using a tungsten plug process, that includes forming vias through the dielectric fill which provide openings to the landing areas on the selected layers, then using a CVD or PVD process, an adhesive liner may be formed in the via followed by deposition of tungsten to fill the vias, forming vertical conductors 54. This is illustrated in FIG. 27 and is shown as the electrical conductors forming step 60 of FIG. 17.

A second example will be discussed with reference to FIGS. 28-34 with like reference numerals referring to like elements of the first example of FIGS. 17-27. The stack 16 of contact levels 18 at interconnect region 17 of FIG. 28 has the same basic structure as in FIG. 18. In this example, dielectric layer 26 and charge trapping layer 27 of upper layer 24 are removed with a blanket etch process thereby eliminating the need for additional mask 30. First mask 38.1 is formed on dielectric layer 28, mask 38.1 with open regions 41.1, 41.2 between mask elements 40.1 and 40.2 and between mask elements 40.2 and 40.3. This is followed by the first etching step shown in FIG. 31 whereby openings 62, 63 are formed through dielectric layer 28 and polysilicon layer 34.1 at the openings 41.1 and 41.2 between the mask elements 40.1/40.2 and between the mask elements 40.2/40.3. Although such etching step could be continued down to polysilicon layer 34.2, it is not necessary for reasons that will be evident when discussing FIGS. 33 and 34. A second mask 38.2 is then formed on the etched stack 16 of contact levels 18. Second mask 38.2 includes mask elements 40.4 and 40.5 with mask element 40.5 covering opening 63 while leaving opening 62 and a portion 64 dielectric layer 28 between openings 62, 63 uncovered.

Figure 33:
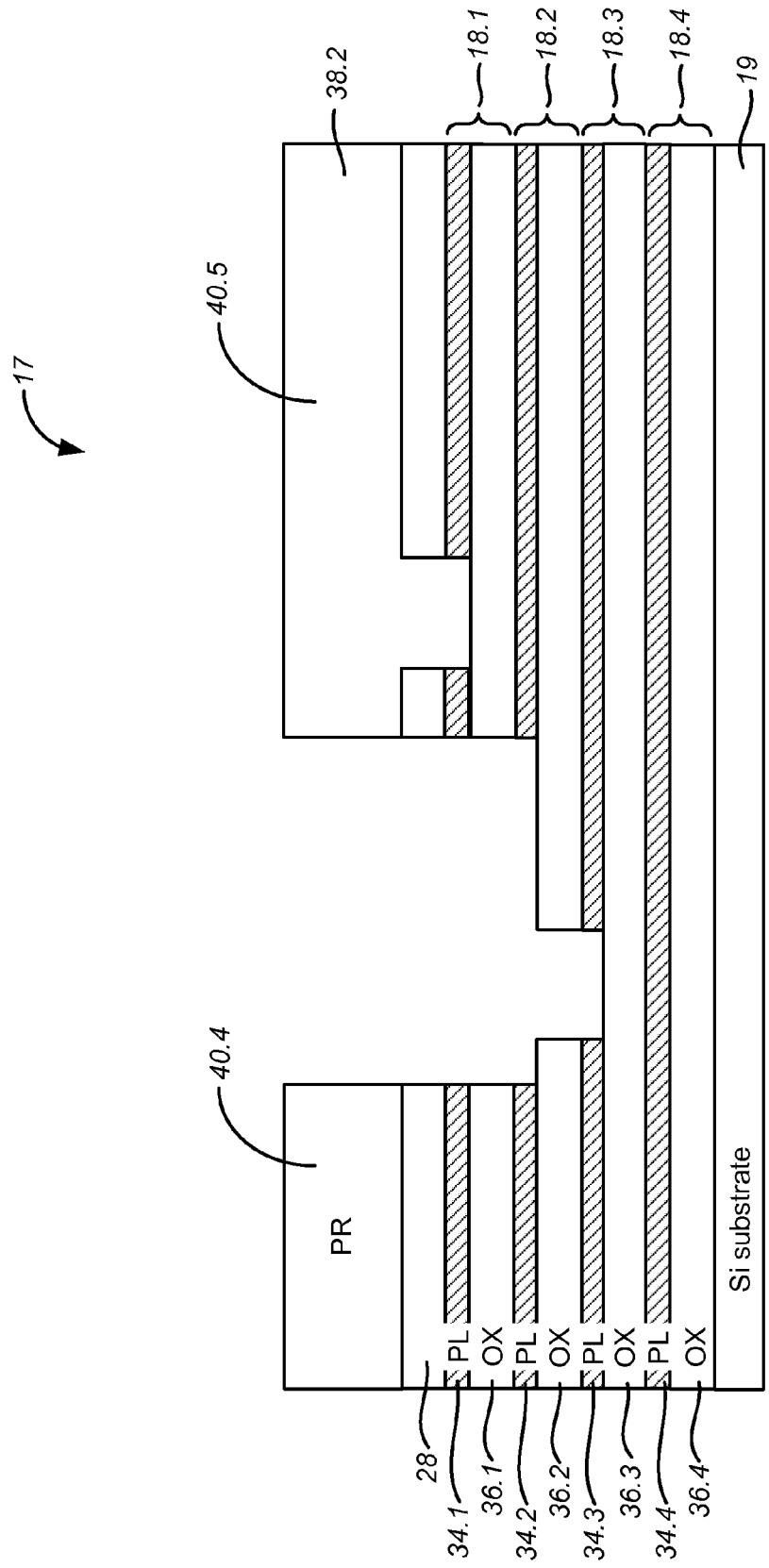
Figure 34:
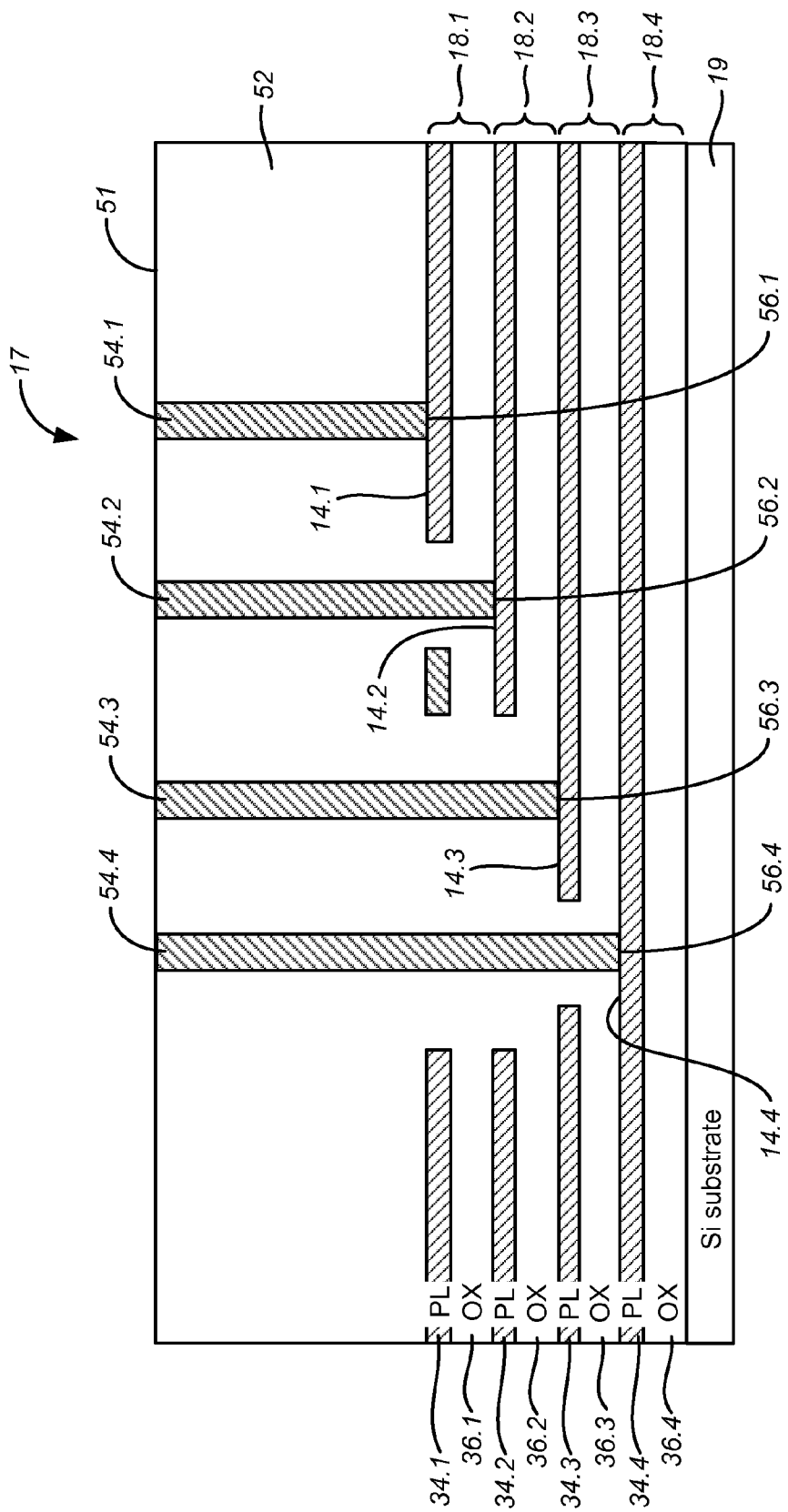

FIG. 33 illustrates result of the second etching step in which two contact levels are etched. Specifically, opening 62 is etched down to oxide layer 36.3 while portion 64 of dielectric layer 28 is etched two contact levels down to oxide layer 36.2. Thereafter, second mask 38.2 is removed and interlayer dielectric 52 is deposited on the etched structure as shown in FIG. 34. This is then followed by the formation of electrical conductors 54.1-54.4 through the interlayer dielectric 52 and the oxide layers 28, 36.1, 36.2, 36.3 covering polysilicon layers 34.1-34.4 so to make contact with the landing areas 56.1-56.4 at the interconnect contact regions 14.1-14.4.

As with the example of FIGS. 18-24, two masks 38.1, 38.2 were used in the example of FIGS. 28-34 to provide access to landing areas 56.1-56.4 at four interconnect contact regions 14.1-14.4 at four different contact levels 18.1-18.4. According to the present invention the interconnect region 17 is etched N times using N masks to create an interconnect contact region 14 at each contact level 18. The interconnect contact regions 14 are aligned with and provide access to landing areas 56 at each of the 2N contact levels. Again, the etching step comprising etching through 2x−1 contact levels for each mask of sequence number x.

Figure 35:
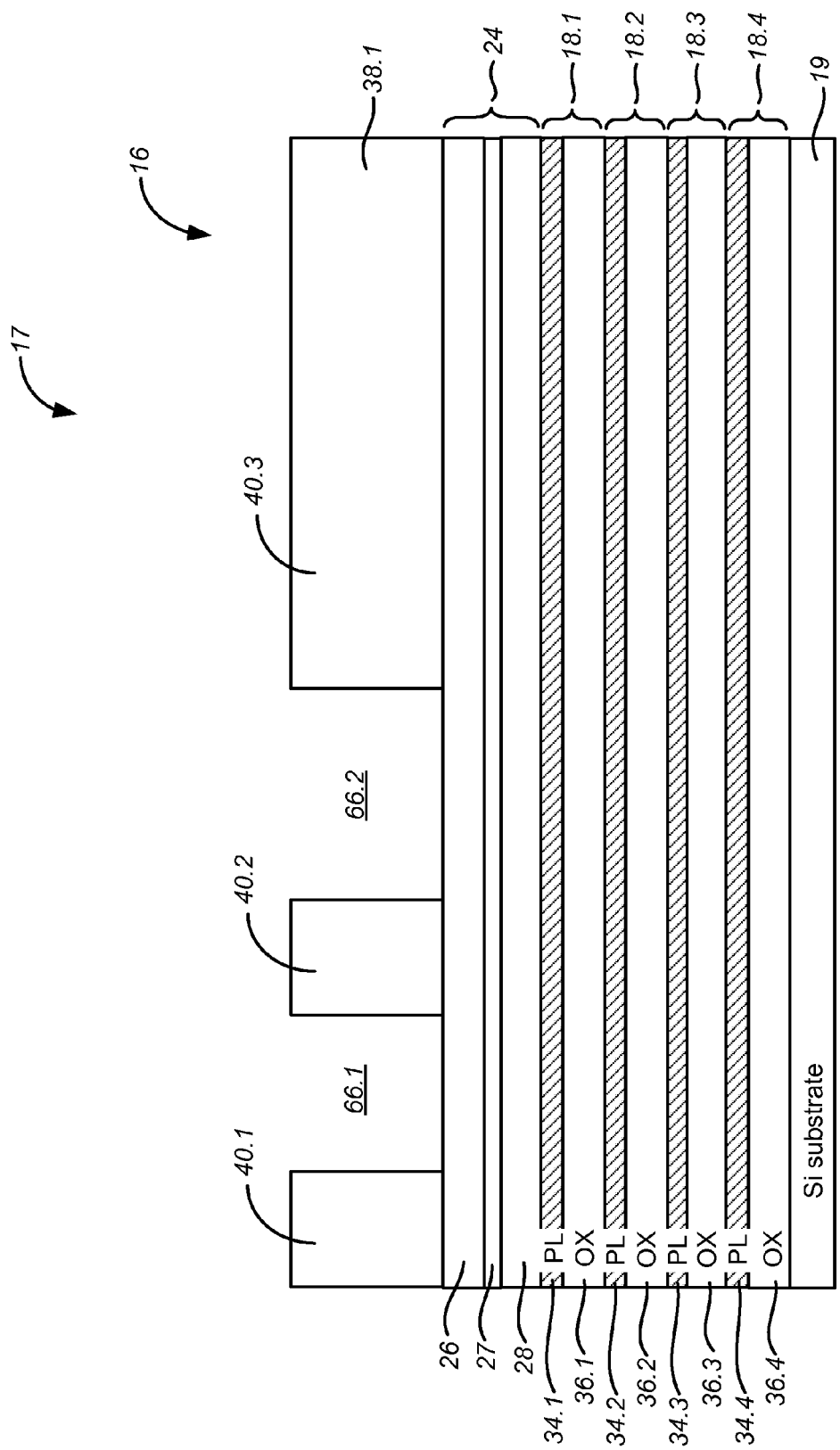
Figure 36:
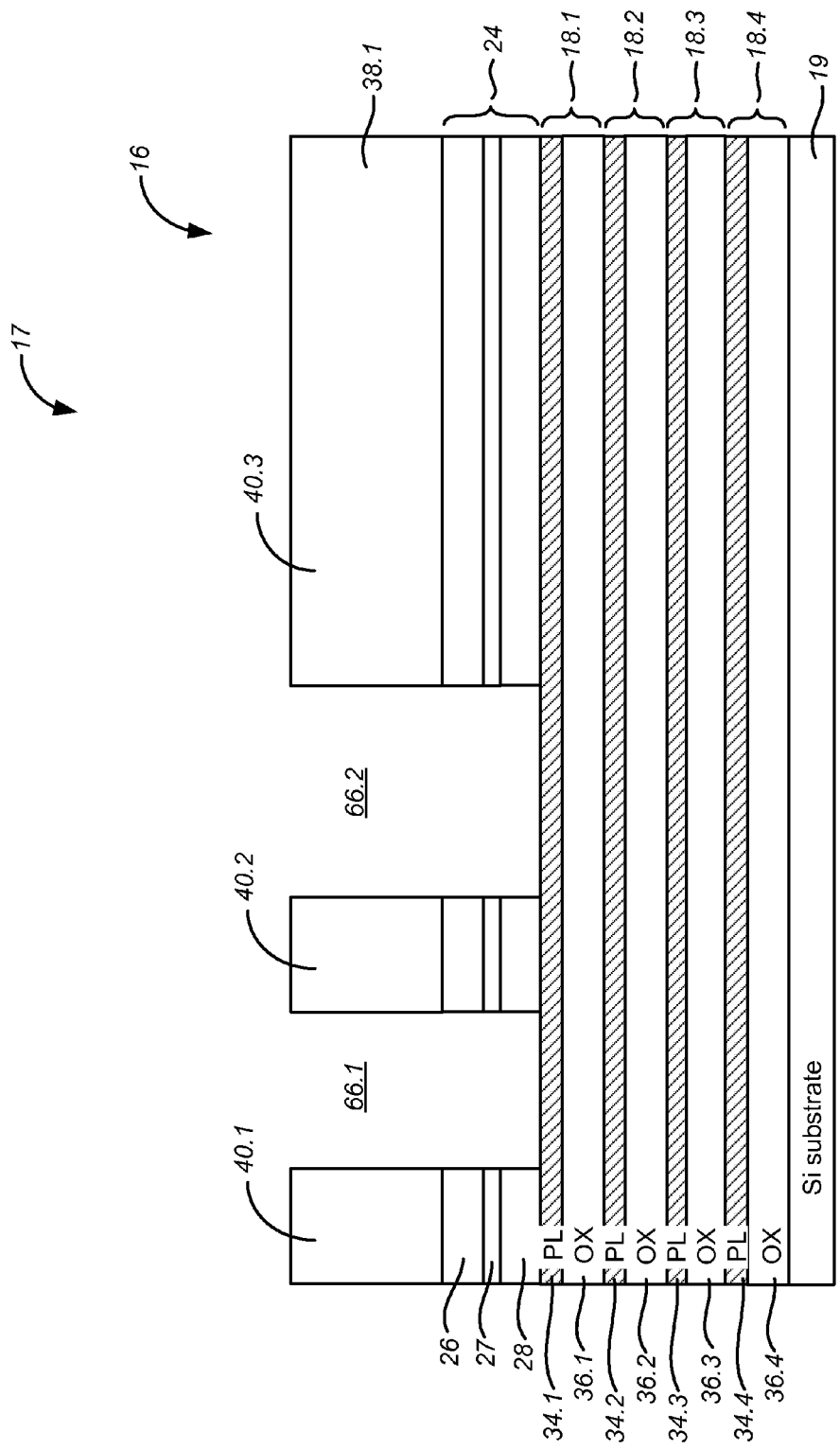
Figure 37:
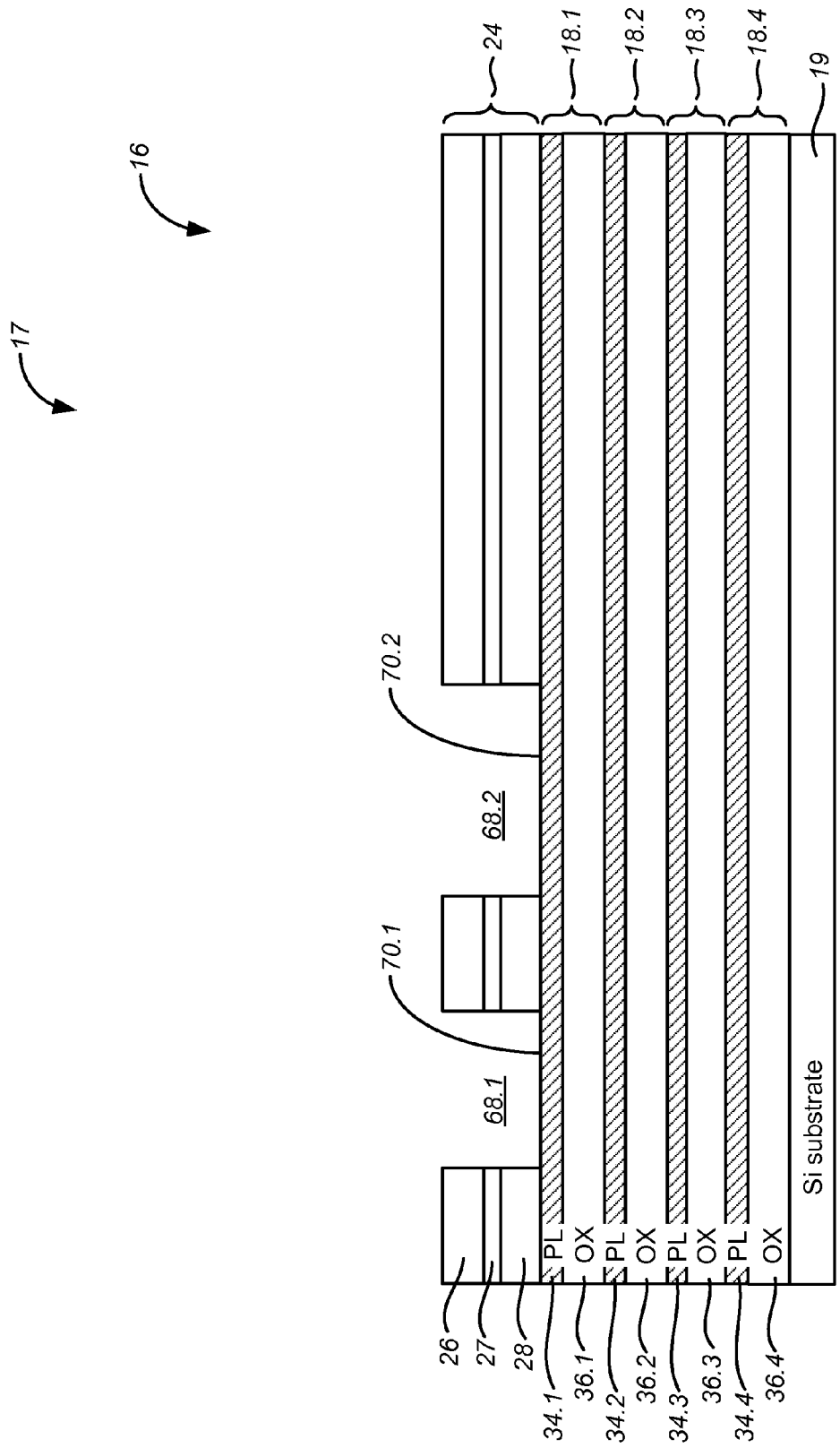

FIGS. 35-44 illustrate a third example of a method for carrying out the present invention again with like reference numerals referring to like elements. First mask 38.1 is formed over upper layer 24 and stack 16 of contact levels 18 at interconnect region 17. Photoresist mask elements 40.1, 40.2 and 40.3 form open regions 66.1 and 66.2 between mask elements 40.1 and 40.2 and between mask elements 40.2 and 40.3 as shown in FIG. 35. The portions of upper layer 24 underlying open regions 66.1 and 66.2 are etched down to polysilicon layer 34.1 of first contact level 18 creating first and second openings 68.1, 68.2 in upper layer 24. Openings 68.1 and 68.2 expose surface portions 70.1, 70.2 of first polysilicon layer 34.1.

Figure 38:
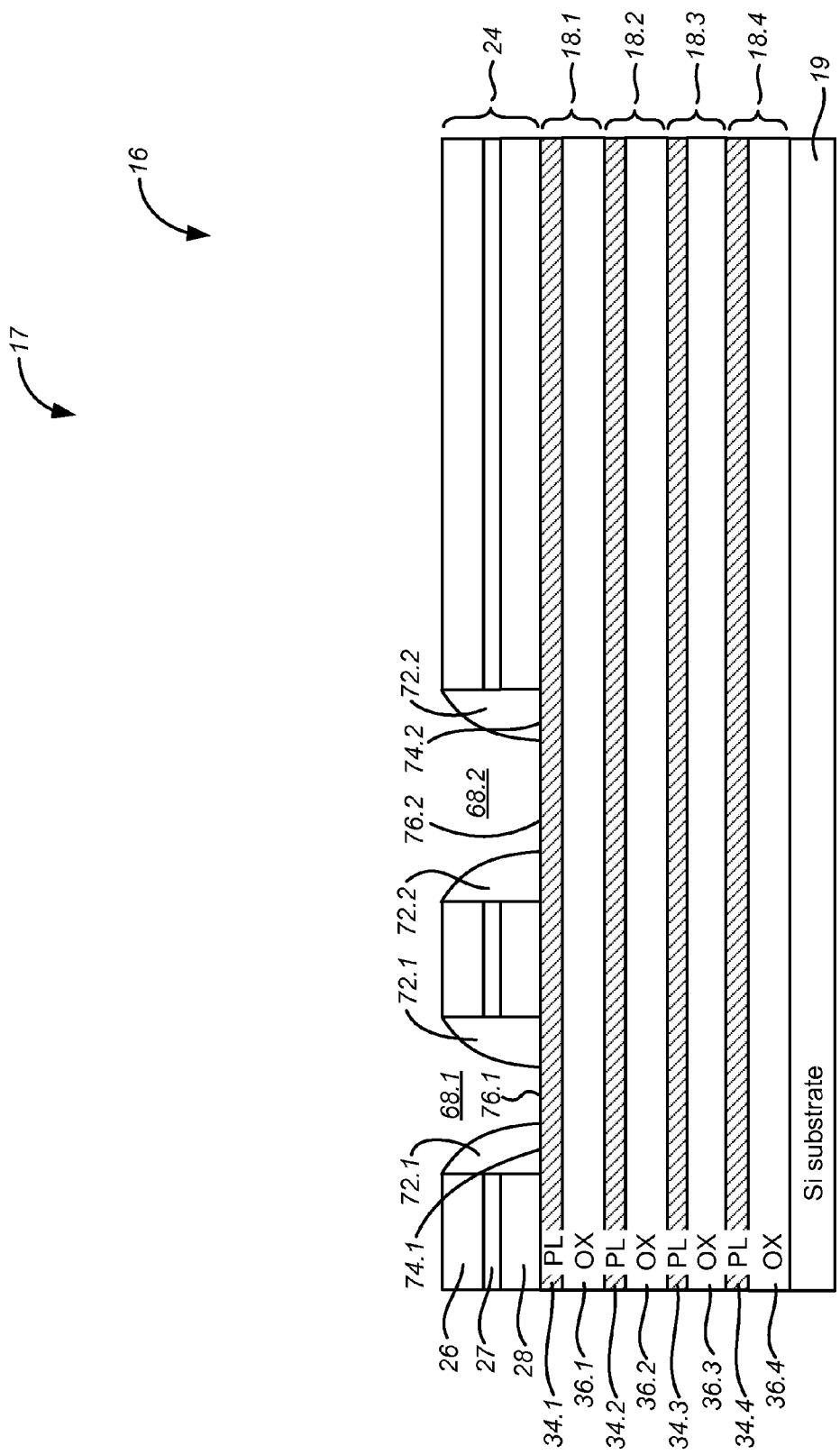
Figure 39:
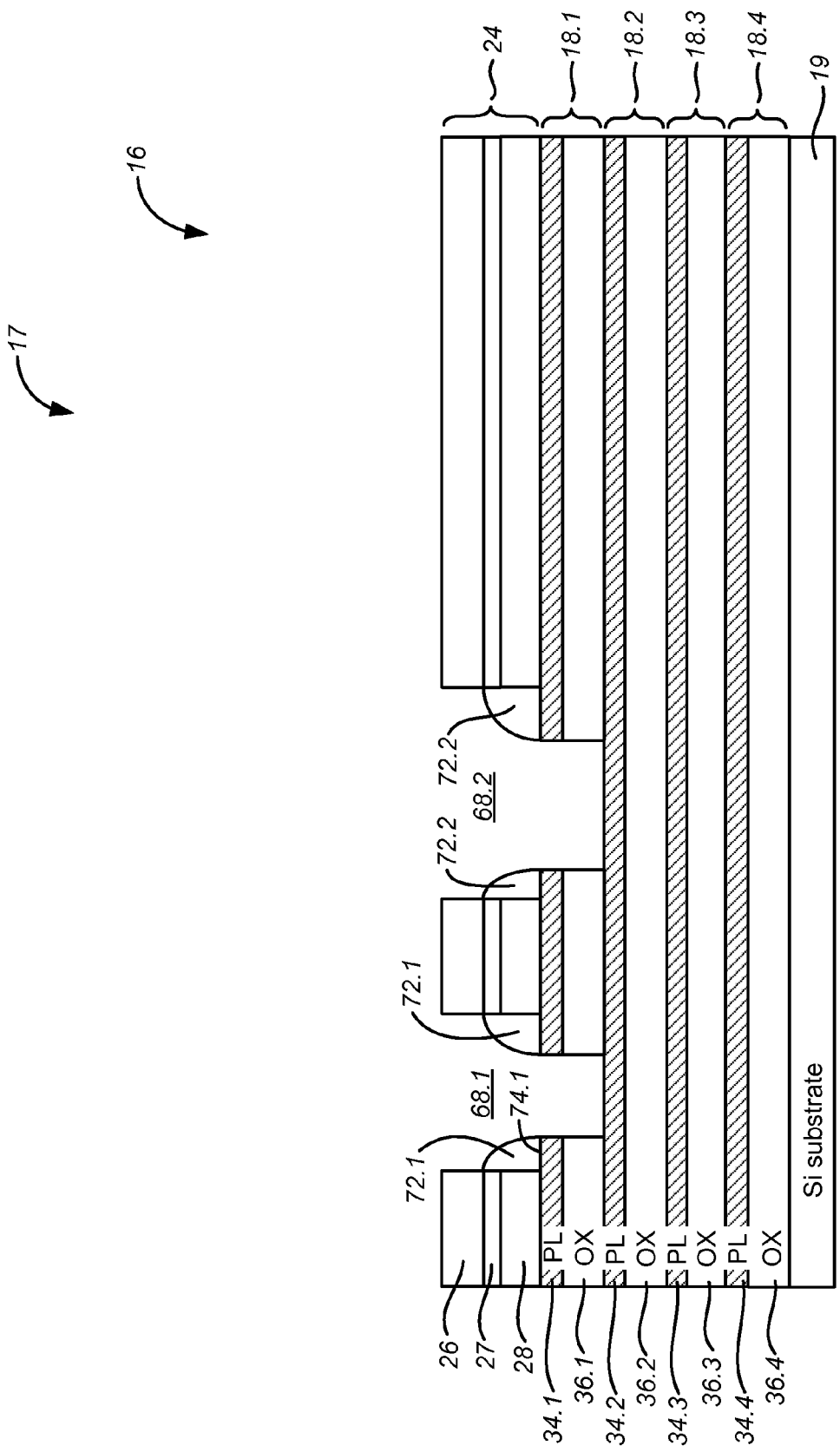
Figure 40:
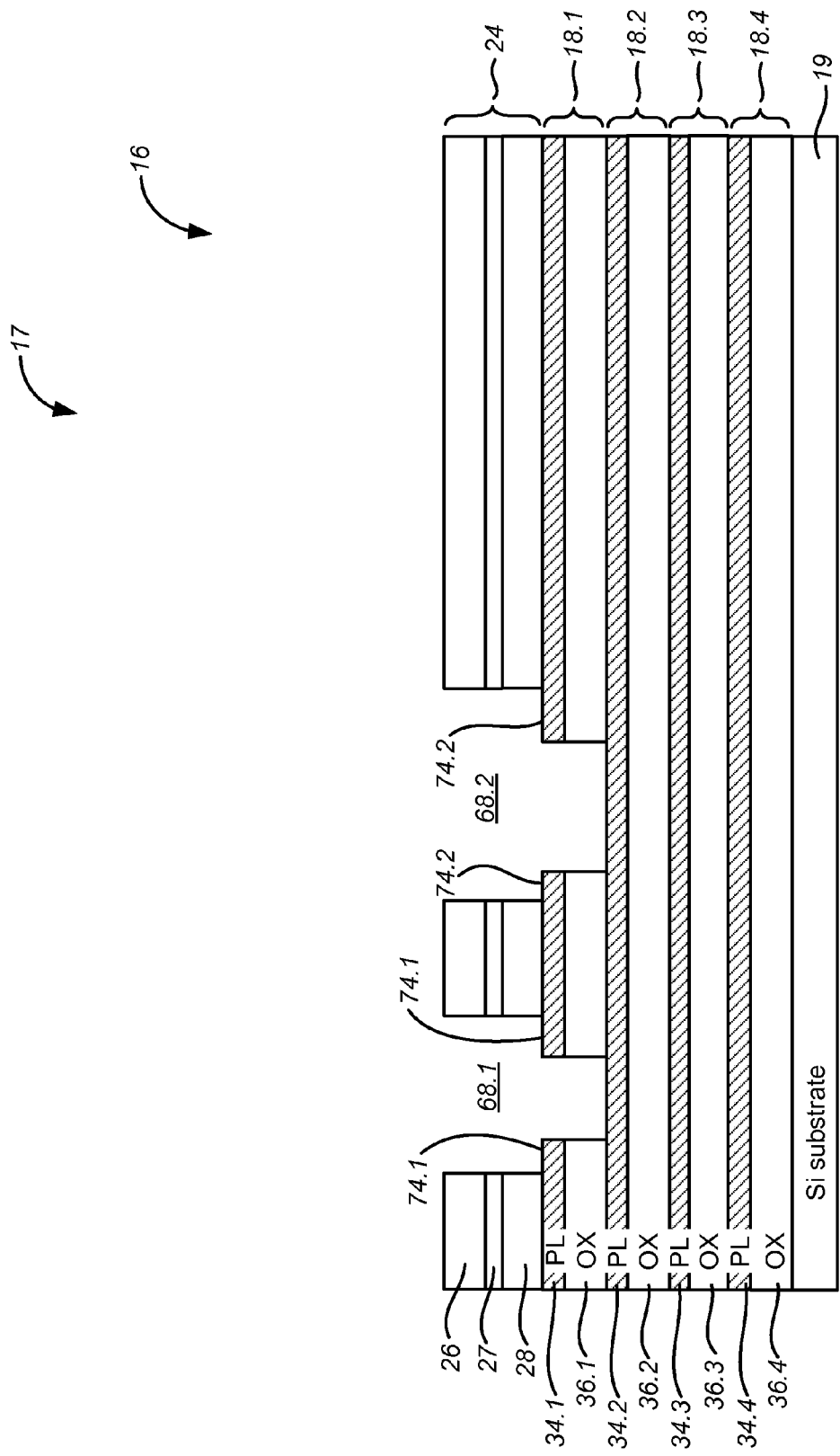

FIG. 38 shows result of depositing sidewall material 72.1 and 72.2 on the sidewalls of the first and second openings 68.1, 68.2. This can be accomplished in different ways, such as by depositing blanket layer of insulating material such as silicon nitride by CVD or sputtering over the wafer, followed by anisotropic etching until the material is removed from horizontal surfaces of the wafer, except regions adjacent vertical sidewalls, at which sidewall spacers are left. Sidewall material 72.1 and 72.2 covers a first part 74.1, 74.2 of each of the surface portions 70.1, 70.2 while leaving a second part 76.1, 76.2 of each of the surface portions 70.1, 70.2 uncovered.

Figure 41:
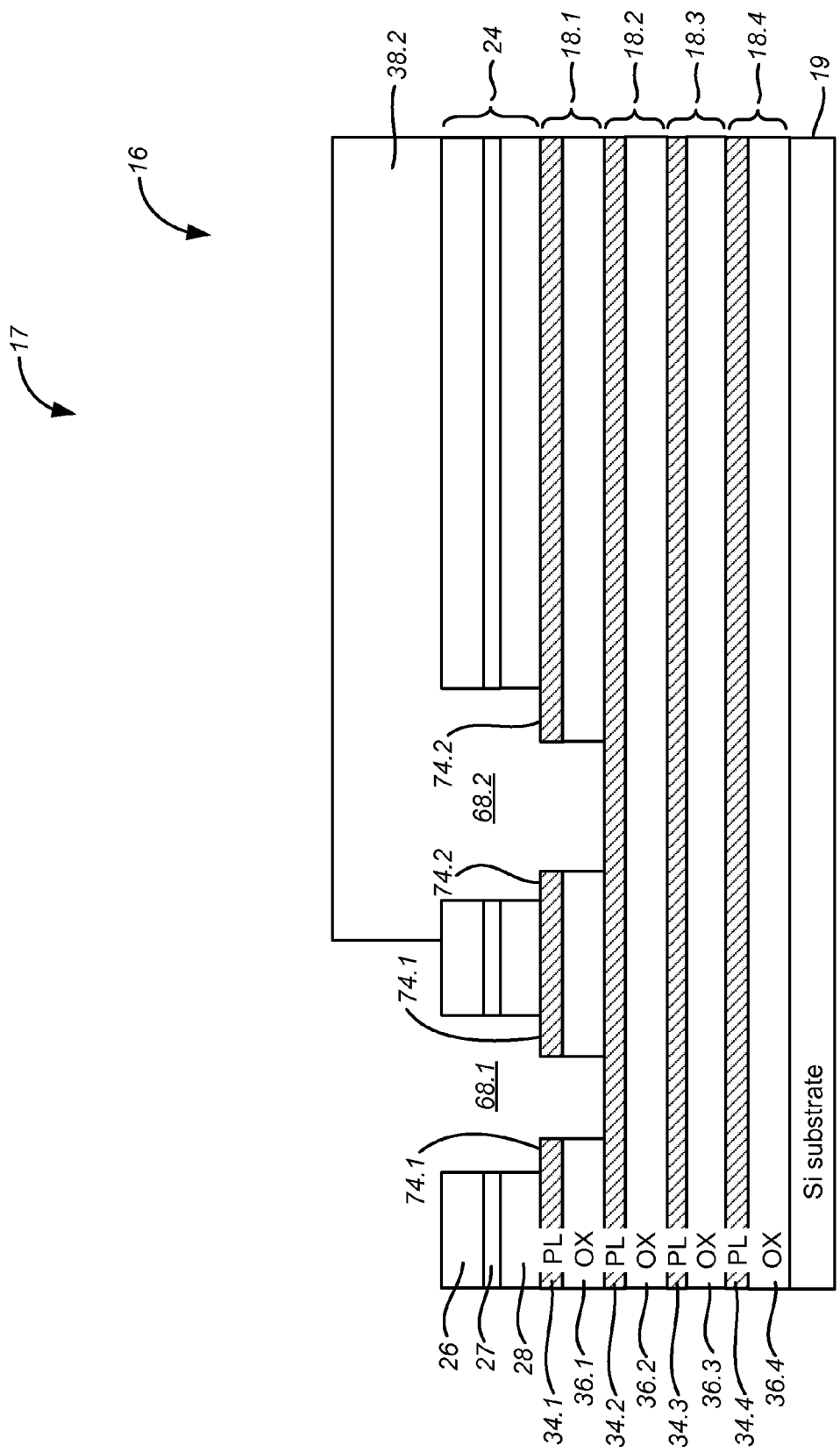

The structure of FIG. 38 is then etched, such as by an anisotropic reactive ion etch that does not attack the side wall material, but only reduces the size of sidewall material 72.1, 72.2 and extends the first and second openings 68.1, 68.2 through one contact level to expose polysilicon layer 34.2. See FIG. 39. Next, sidewall material 72.1, 72.2 is removed, see FIG. 40, to expose first parts 74.1, 74.2 of surface portions 70.1, 70.2. FIG. 41 shows second mask 38.2 on the structure of FIG. 40 filling second opening 68.2. First opening 68.1 is then etched through two contact levels 18 to expose portions 78 of third polysilicon layer 34.3 beneath first part 74.1 and portion 80 of forth polysilicon layer 34.4 beneath the second part 76.1.

Figure 42:
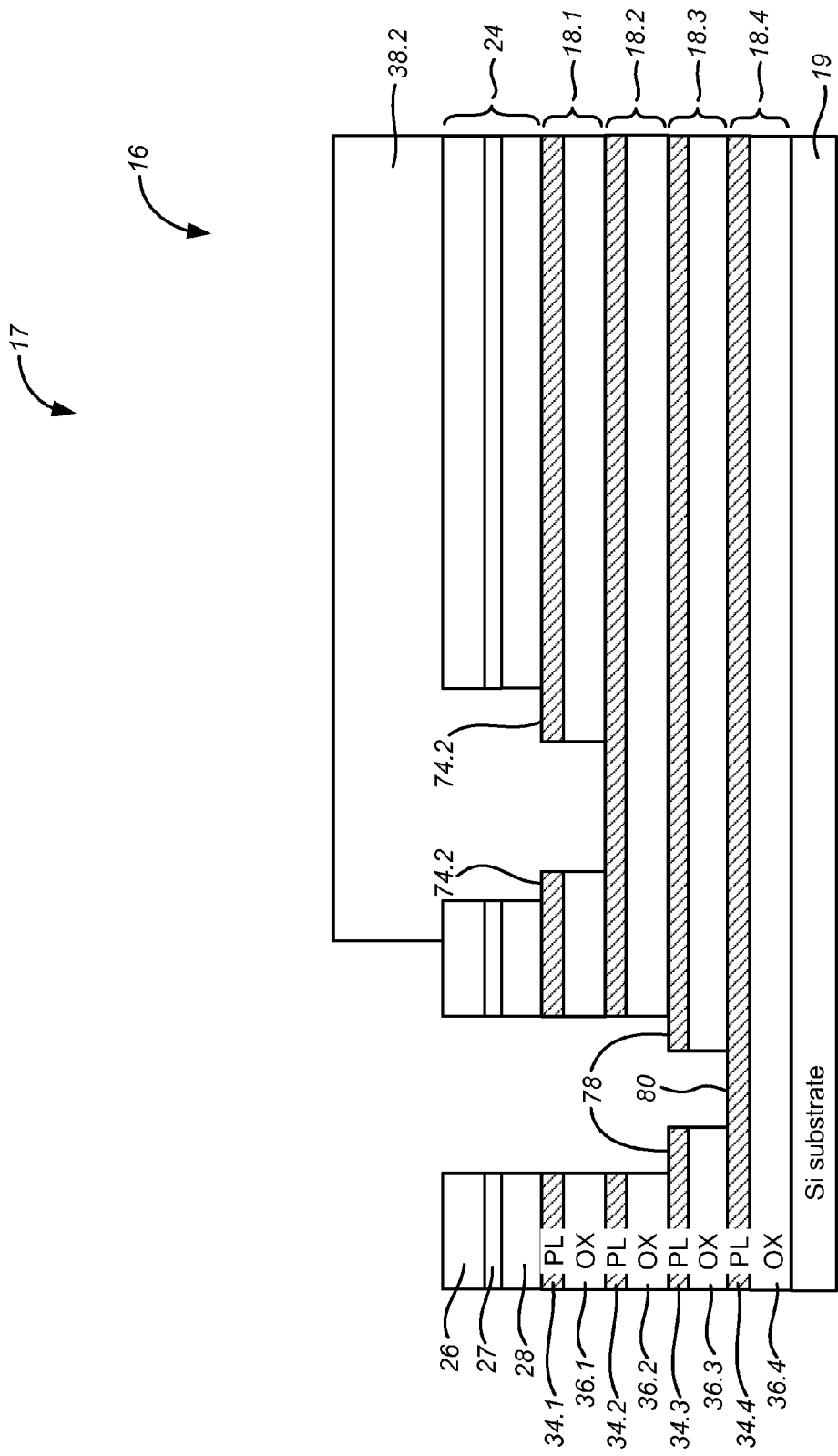
Figure 43:
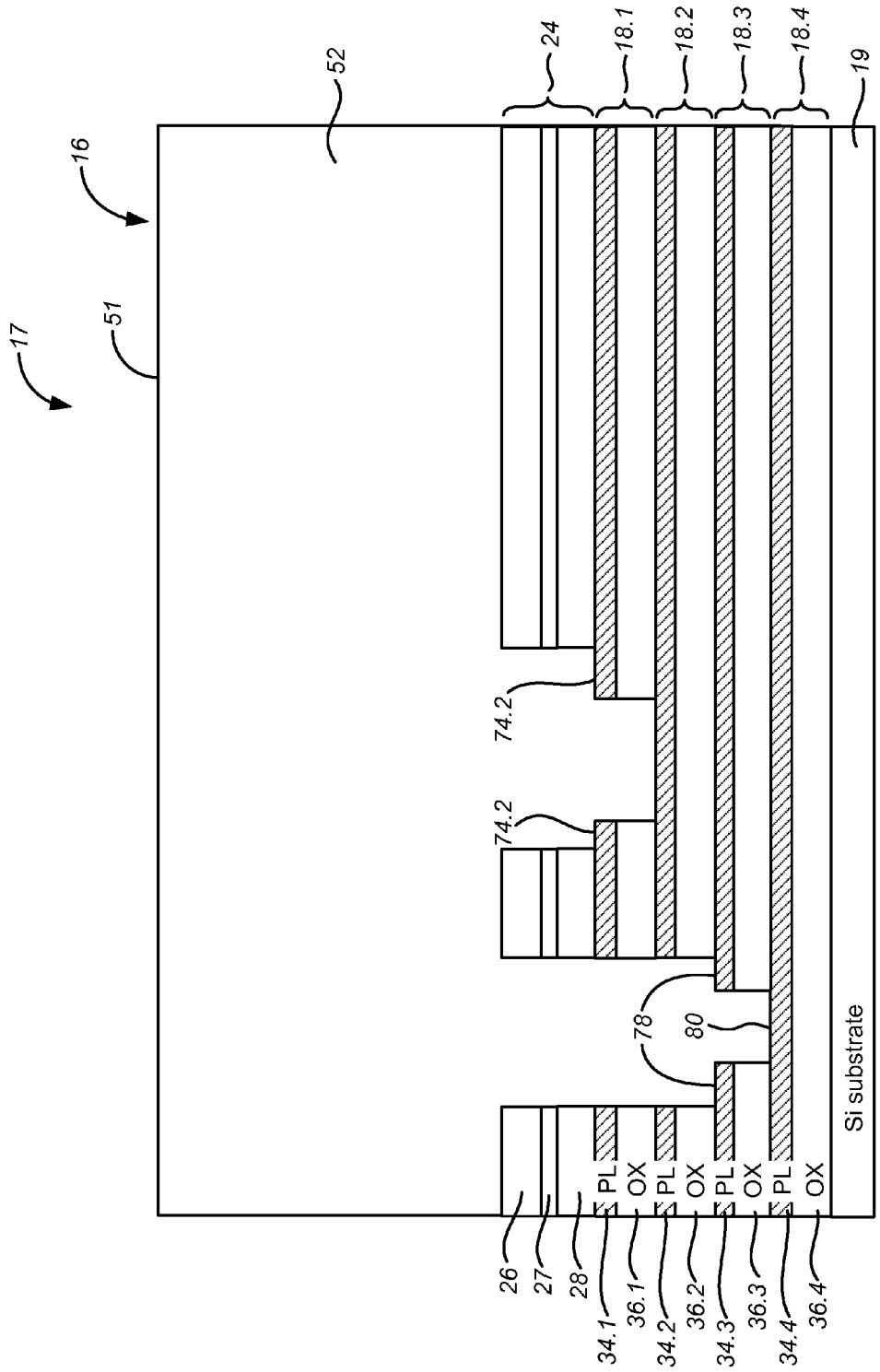
Figure 44:
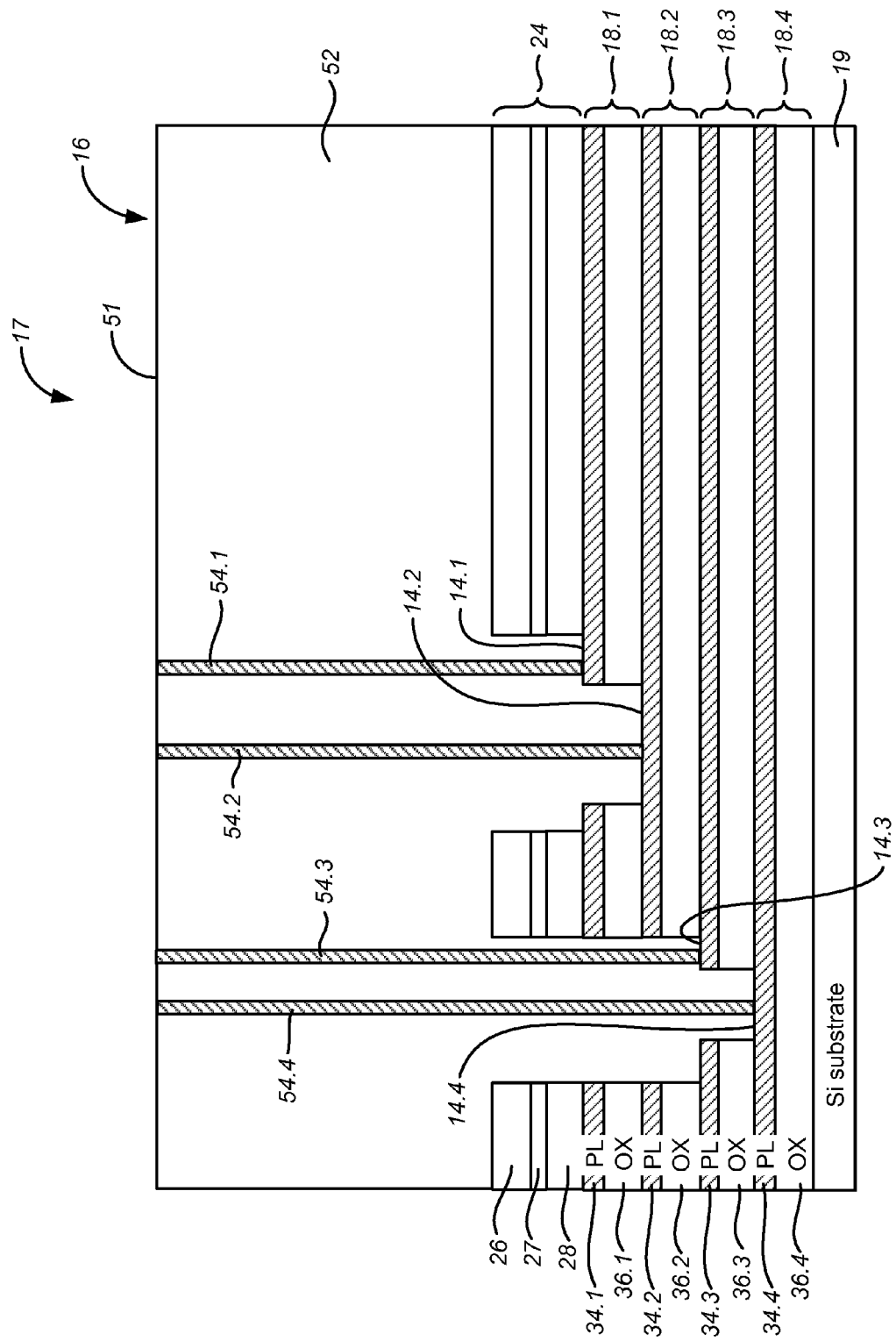

Second mask 38.2 is then removed and the structure of FIG. 42 is covered by interlayer dielectric 52 as shown in FIG. 43. FIG. 44 illustrates result of the formation of conductors 54.1-54.4 contacting the landing areas 56.1-56.4 at the interconnect contact regions 14.1-14.4.

The method illustrated in FIGS. 35-44 is especially suited when a relatively thick upper layer 24 is used above a stack 16 of contact levels 18. A SiN layer 50, used with the FIGS. 18-27 example, may be used with the second and third examples.

FIG. 45 illustrates a process example for a stack of 16 contact levels 18. According to the present invention, interconnect contact regions 14 for each of the 16 contact levels 18 can be accessed using only 4 masks 38. In this example, first mask 38.1 has 8 photoresist mask elements 40, labeled 1, 3, 5, etc., followed by open etch regions 41, labeled 2, 4, 6, etc. In this example, each mask element 40 and each edge of region 41 has a 1 unit longitudinal dimension. One layer is etched for the first mask 38.1. Second mask 38.2 has 4 photoresist mask elements, labeled 1/2, 5/6, etc., followed by open etch regions labeled 3/4, 7/8, etc., each having a 2 unit longitudinal dimension. Two layers are etched with second mask 38.2. Third mask 38.3 has 2 photoresist mask elements, labeled 1-4, 9-12, followed by open etch regions, labeled 5-8, 13, 16, each having a 4 unit longitudinal dimension. Four layers are etched with third mask 38.3. Fourth mask 38.4 has 1 photoresist mask element, labeled 1-8, followed by an open etch region, labeled 9-16, each having an 8 unit longitudinal dimension. Eight layers are etched with fourth mask 38.4.

As discussed above, when using first mask 38.1, with x=1, a single layer 18 is etched (2x−1=20=1); when using second mask 38.2, 2 layers 18 are etched (2x−1=21=2); when using third mask 38.3, 4 layers 18 are etched (2x−1=22=4); when using fourth mask 38.4, 8 layers 38 are etched (2x−1=23=8). In this way any contact level 18 between 1 and 16 can be accessed by using some combination of etching 1 level, etching 2 levels, etching 4 levels and etching 8 levels. Another way to think about this is that the 4 masks represent a four digit binary number, that is 0000, 0001, 0010, . . . 1111 corresponding to the decimal numbers 1-16. For example, to access the interconnect contact regions 14 at contact level 18 requires etching through 12 contact levels which can be accomplished using open regions 41 for third mask 38.3 (etching through 4 contact levels) and fourth mask 38.4 (etching through 8 contact levels). The result of use of masks 38.1-38.4 of FIG. 45 with stack 16 of contact levels 18 is shown in FIG. 46. Conventional methods would typically require 16 different masks resulting in a much higher processing expense and increased chance of failure due to tolerance buildup.

The example of FIGS. 45 and 46 results in a continuous, open step region for interconnect contact regions 14 aligned with landing areas 56. FIG. 47 shows an example in which 4 masks 38 are configured to create a stack 16 of 16 contact levels 18 having full height dummy stacks 82 between each interconnect contact region 14 and a full height boundary stack 84 adjacent to contact region 14.16. This is achieved by providing dummy mask regions 86 for each mask 38 wherever a dummy stack 82 is to be created. In this example, there is a dummy stack 82 between each interconnect contact region 14. However, in some examples, one or more of the dummy stacks 82 could be eliminated. Also, the longitudinal dimension of dummy stacks 82 need not be the same.

It is not necessary that the masks 38 be used in the order of the number of contact levels 18 etched with each mask. That is, mask 38.2 could be used before mask 38.1. However, it is preferred that the masks be used in a ascending order of the number of contact levels etched, that is with the mask used with etching of one contact level first, the mask used with etching of two contact levels second, etc. for larger process window.

In the example of FIG. 47, dummy mask regions 86 are provided at corresponding positions at each mask 38 so that the resulting dummy stack 82 is a full height dummy stack. Partial height dummy stacks, such as thin column portion 48 of FIG. 24, can be made by providing dummy mask regions 86 at corresponding positions for one or more but not all of masks 38.

While the invention has been discussed with reference to N=2 with regard to FIGS. 17-44 and with N=4 with regard to FIGS. 45-47, the number of masks could be other than 3 or N could be greater than 4. While a set of N masks can be used to create 2N levels of interconnect contact regions, it can also be used to create up to and including 2N levels of interconnect contact regions. For example, with N equal to 4, the 4 masks can be used to create fewer than 16 levels of interconnect contact regions, such as 13, 14 or 15 levels of interconnect contact regions.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

Disclosures of any and all patents, patent applications and printed publications referred to above are incorporated by reference.

What is claimed is:

1. A method, for use with a three-dimensional stacked IC device having a stack of contact levels at an interconnect region, for creating interconnect contact regions aligned with and exposing landing areas at the contact levels, the method comprising:
    using a set of N etch masks for creating up to and including $2^N$ levels of interconnect contact regions at the stack of the contact levels, each mask comprising mask and etch regions, N being an integer equal to at least 2, x being a sequence number for the masks so that for one mask x=1, for another mask x=2, and so forth through x=N;
    removing at least a portion of any upper layer overlying the stack of the contact levels at the interconnect region;
    etching the interconnect region N times using said masks in a chosen order to create contact openings extending from a surface layer to each contact level, the contact openings being aligned with and providing access to the landing areas at each of the $2^N$ contact levels; and
    the etching step comprising etching through $2^{x-1}$ contact levels for each mask of sequence number x;
    whereby electrical conductors can be formed through the contact openings to contact the landing areas at the contact levels.

2. The method according to claim 1, further comprising:
    applying a fill material over the openings to define a via pattern surface;
    opening vias through the fill material to expose the landing areas in each contact level; and
    depositing a conductive material within the vias.

3. The method according to claim 1, wherein the accessing step is carried out with the masks comprising a dummy mask region on at least one of said masks.

4. The method according to claim 1, wherein the accessing step is carried out with the masks comprising dummy mask regions at corresponding locations on at least some of said masks.

5. The method according to claim 1, wherein the accessing step is carried out with the masks comprising at least one dummy mask region at corresponding locations on each of said masks.

6. The method according to claim 1, wherein the accessing step is carried out with N equal to at least 4.

7. The method according to claim 1, wherein the performing step is carried out in the order of the sequence number x.

8. The method according to claim 1, wherein the removing step is carried out using an additional mask exposing the interconnect region.

9. The method according to claim 1, wherein the removing step is carried out using a blanket etching step at the interconnect region.

10. The method according to claim 1, wherein:
    the removing step comprises forming an opening in the upper layer exposing a top surface portion of a first contact level, the opening partially bounded by sidewalls; and
    the interconnect region etching step comprises:
        depositing a sidewall material on the sidewalls of the opening and on a first part of the top surface portion while leaving a second part of the top surface portion without sidewall material thereon;

extending the opening through the second part of the top surface portion to provide access to the top surface of an underlying contact level; and removing at least some of the sidewall material thereby exposing at least some of the first part of the top surface portion to form the interconnect contact regions aligned with and providing access to the landing areas at the first and the underlying contact levels;

whereby the sidewall material acts as one of the N etch masks.

11. The method according to claim 10, wherein the sidewall material removing step is carried out to expose the landing areas.

12. The method according to claim 10, wherein the sidewall material removing step is carried out by removing substantially all of the sidewall material.

13. The method according to claim 10, wherein the opening forming step is carried out with the layer being a top layer and the chosen contact level is the first contact level.

14. The method according to claim 1, wherein:

the removing step comprises forming first and second openings in an upper layer exposing a top surface portion of a first contact level at each opening, the openings partially bounded by sidewalls; and the interconnect region etching step comprises:

depositing a sidewall material on the sidewalls of each opening and on each top surface portion while leaving a second part of each top surface portion without sidewall material thereon;

extending each of the first and second openings through the second part of the top surface portion to expose the top surface of a second contact level at each opening;

removing at least some of the sidewall material at each opening thereby exposing at least some of the first part of the top surface portion at each opening, thereby forming the interconnect contact regions at the second openings, the interconnect contact regions at the second opening aligned with and providing access to the landing areas at the first and second contact levels; and further extending the first opening from (1) the exposed first part of the top surface portion, through the first and second contact levels to expose the top surface of a third contact level, and (2) the exposed top surface of the second contact level through the second and third contact levels to expose the top surface of a fourth contact level, thereby forming the interconnect contact regions at the first opening aligned with and providing access to the landing areas at the third and fourth contact levels;

whereby the sidewall material acts as one of the N etch masks.

15. A method for providing electrical connections to landing areas at a stack of contact levels of an interconnect region for a three-dimensional stacked IC device of a type comprising an interconnect region, the interconnect region including an upper layer with a stack of at least first, second, third and fourth contact levels beneath the upper layer, the method comprising:

forming at least first and second openings in the upper layer, each opening exposing a surface portion of a first contact level, the first and second openings partially bounded by upper layer sidewalls;

depositing a sidewall material on the sidewalls of each of the first and second openings and on a first part of each of the surface portions while leaving a second part of the surface portions without sidewall material thereon;

extending the first and second openings through the second parts of the surface portions to expose a surface of the second contact level for each of the first and second openings;

removing at least some of the sidewall material at each opening to expose at least some of the first part of the surface portion at each opening, thereby forming interconnect contact regions at the second openings, the interconnect contact regions at the second opening aligned with the landing areas at the first and second contact levels;

further extending the first opening from (1) the exposed first part of the surface portion, through the first and second contact levels to expose a surface of a third contact level, and (2) an exposed surface of the second contact level through the second and third contact levels to expose a surface of the fourth contact level, thereby forming the interconnect contact regions at the first opening aligned with the landing areas at the third and fourth contact levels; and forming electrical conductors to the landing areas at the first, second, third and fourth contact levels.

16. The method according to claim 15, wherein the electrical conductors forming step comprises:

applying a fill material over the openings to define a via pattern surface;

opening vias through the fill material to expose the landing areas in each contact level; and depositing a conductive material within the vias.

17. The method according to claim 15, wherein the first and second openings forming step is carried out to expose a top surface of the first contact level and the further extending step is carried out so to expose the landing areas at the third and fourth contact levels.

* * * * *